United States Patent [19]

Maeno

[11] Patent Number: 5,719,819
[45] Date of Patent: Feb. 17, 1998

[54] SEMICONDUCTOR STORAGE CIRCUIT DEVICE OPERATING IN A PLURALITY OF OPERATION MODES AND CORRESPONDING DEVICE FOR DESIGNING A SEMICONDUCTOR STORAGE CIRCUIT DEVICE

[75] Inventor: Hideshi Maeno, Tokyo, Japan

[73] Assignee: Mitsubishi Denki Kabushiki Kisha, Tokyo, Japan

[21] Appl. No.: 678,754

[22] Filed: Jul. 11, 1996

[30] Foreign Application Priority Data

Sep. 4, 1995 [JP] Japan .................. 7-226299
Mar. 7, 1996 [JP] Japan .................. 8-050271

[51] Int. Cl.$^6$ .................. G11C 8/00
[52] U.S. Cl. .................. 365/230.06; 365/230.05
[58] Field of Search .................. 365/230.06, 230.05

[56] References Cited

U.S. PATENT DOCUMENTS

| | | | |
|---|---|---|---|
| 5,235,552 | 8/1993 | Nakajima et al. | 365/230.05 |
| 5,293,347 | 3/1994 | Ogawa | 365/230.06 |
| 5,321,652 | 6/1994 | Ito | 365/230.05 |
| 5,434,818 | 7/1995 | Byers et al. | 365/230.06 |
| 5,490,112 | 2/1996 | Hush et al. | 365/230.05 |
| 5,566,371 | 10/1996 | Ogawa | 365/230.05 |
| 5,602,778 | 2/1997 | Futatsuya et al. | 365/200 |

*Primary Examiner*—David C. Nelms
*Assistant Examiner*—Michael T. Tran
*Attorney, Agent, or Firm*—Oblon, Spivak, McClelland, Maier & Neustadt, P.C.

[57] ABSTRACT

It is an object to enable access orders for a memory circuit used in the digital image compression technology only with counting-up operation by a counter circuit. The correspondence between outputs of first and second decoders (4, 5) forming a two-port RAM (3) is made different according to two operation modes. That is to say, while outputs 0, 1, 2, ..., 63 of the first decoder (4) are arranged corresponding to an access order of increment, outputs 0, 1, 2, ..., 63 of the second decoder (5) are arranged in correspondence with the outputs of the first decoder (4) on the basis of an access order in the zig-zag scan, here. An address generating circuit (7) as a counter circuit supplies common addresses to the two decoders (4, 5). Thus, while the two-port memory cells are respectively accessed in the increment order by outputs of the first decoder (4), they are also accessed in the operation mode for the zig-zag scan by outputs of the second decoder (5).

22 Claims, 63 Drawing Sheets

| 0 (0) | 1 (1) | 2 (5) | 3 (6) | 4 (14) | 5 (15) | 6 (27) | 7 (28) |
|---|---|---|---|---|---|---|---|
| 8 (2) | 9 (4) | 10 (7) | 11 (13) | 12 (16) | 13 (26) | 14 (29) | 15 (42) |
| 16 (3) | 17 (8) | 18 (12) | 19 (17) | 20 (25) | 21 (30) | 22 (41) | 23 (43) |
| 24 (9) | 25 (11) | 26 (18) | 27 (24) | 25 (31) | 29 (40) | 30 (44) | 31 (53) |
| 32 (10) | 33 (19) | 34 (23) | 35 (32) | 36 (39) | 37 (45) | 38 (52) | 39 (54) |
| 40 (20) | 41 (22) | 42 (33) | 43 (38) | 44 (46) | 45 (51) | 46 (55) | 47 (60) |
| 48 (21) | 49 (34) | 50 (37) | 51 (47) | 52 (50) | 53 (56) | 54 (59) | 55 (61) |
| 56 (35) | 57 (36) | 58 (48) | 59 (49) | 60 (57) | 61 (58) | 62 (62) | 63 (63) |

| 0 | 1 | 2 | 3 | 4 | 5 | 6 | 7 |
|---|---|---|---|---|---|---|---|
| (0) | (4) | (6) | (20) | (22) | (36) | (38) | (52) |
| 8 | 9 | 10 | 11 | 12 | 13 | 14 | 15 |
| (1) | (5) | (7) | (21) | (23) | (37) | (39) | (53) |
| 16 | 17 | 18 | 19 | 20 | 21 | 22 | 23 |
| (2) | (8) | (19) | (24) | (34) | (40) | (50) | (54) |
| 24 | 25 | 26 | 27 | 25 | 29 | 30 | 31 |
| (3) | (9) | (18) | (25) | (35) | (41) | (51) | (55) |
| 32 | 33 | 34 | 35 | 36 | 37 | 38 | 39 |
| (10) | (17) | (26) | (30) | (42) | (46) | (56) | (60) |
| 40 | 41 | 42 | 43 | 44 | 45 | 46 | 47 |
| (11) | (16) | (27) | (31) | (43) | (47) | (57) | (61) |
| 48 | 49 | 50 | 51 | 52 | 53 | 54 | 55 |
| (12) | (15) | (28) | (32) | (44) | (48) | (58) | (62) |
| 56 | 57 | 58 | 59 | 60 | 61 | 62 | 63 |
| (13) | (14) | (29) | (33) | (45) | (49) | (59) | (63) |

F I G. 4 7
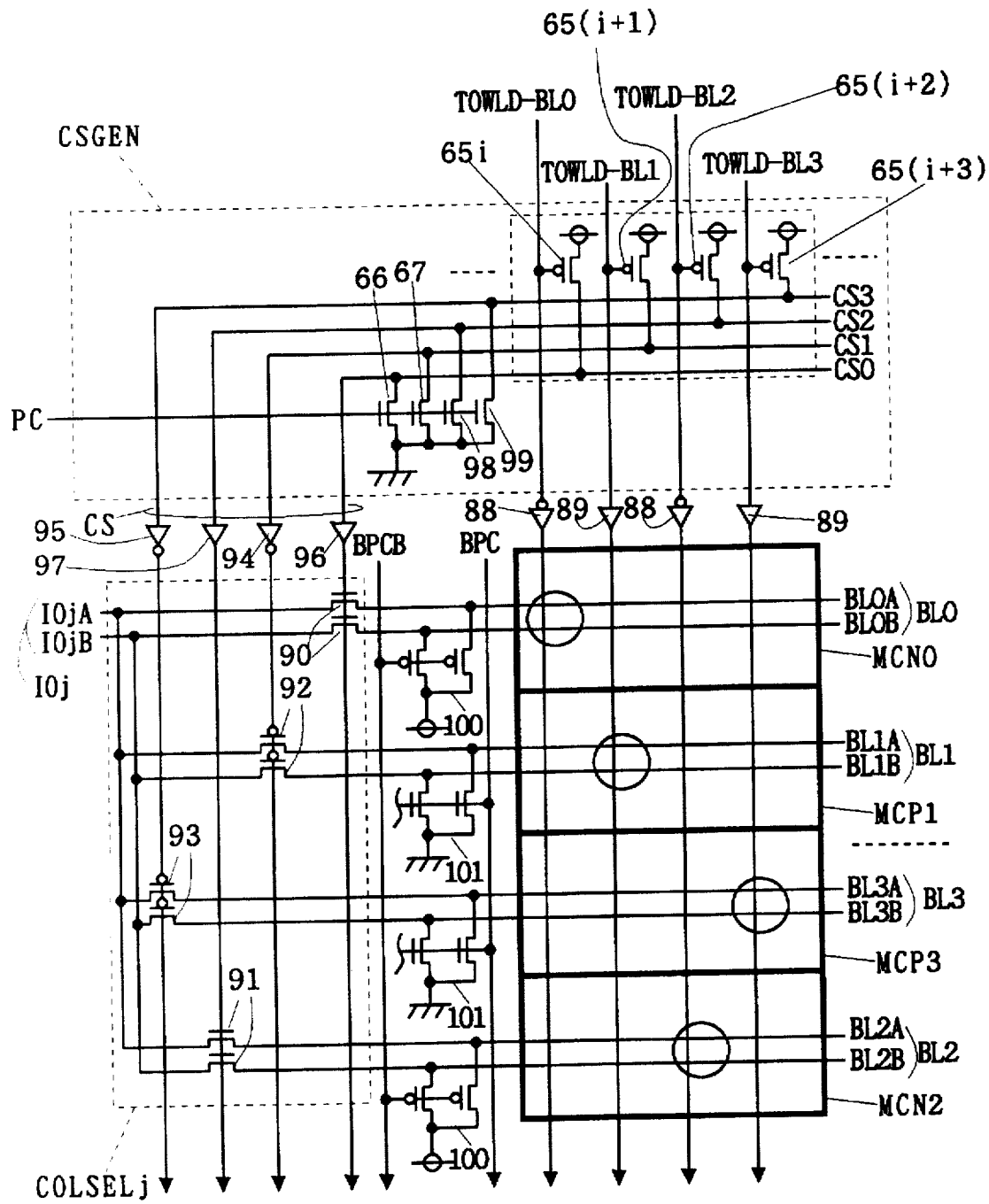

SEMICONDUCTOR STORAGE CIRCUIT DEVICE OPERATING IN A PLURALITY OF OPERATION MODES AND CORRESPONDING DEVICE FOR DESIGNING A SEMICONDUCTOR STORAGE CIRCUIT DEVICE

BACKGROUND OF THE INVENTION

1. Field of the Invention

The present invention relates to a semiconductor storage circuit device and a designing device thereof.

2. Description of the Background Art

In the digital image compression technique, and the like, two or more operation modes (orders of access) may be required for a RAM. Conventionally, in such a case, as shown in FIG. 91, operation modes are switched with a plurality of (two in FIG. 91) address generating circuits provided for the number of required operation modes. That it to say, referring to FIG. 91, the order of access for such a simple first operation mode as an increment mode can be realized by a common counter circuit (the address generating circuit 1). On the other hand, a second operation mode, such as the zig-zag scan or the alternate scan, having a complicated order of access, requires a special address generating circuit 2.

It is not necessarily easy in design to realize such a special address generating circuit 2, however, and it is not desirable to provide such a special address generating circuit.

SUMMARY OF THE INVENTION

According to a first aspect of the present invention, a semiconductor storage circuit device comprises; a plurality of decoders receiving externally supplied common addresses for a single operation mode to attain an active state, wherein respective outputs of the plurality of decoders are arranged to satisfy correspondence between access orders for a plurality of different operation modes of the number corresponding to the number of the plurality of decoders, on the basis of corresponding ones of the access orders.

Preferably, according to a second aspect of the present invention, the semiconductor storage circuit device further comprises; a multi-port memory cell array having at least two access ports which are independently addressable, wherein particular two access ports of each memory cell of the multi-port memory cell array are accessed on the basis of respective corresponding outputs of certain two decoders in the plurality of decoders.

Preferably, according to a third aspect of the present invention, the semiconductor storage circuit device further comprises; selector means for selectively outputting the respective outputs only of certain two decoders in the plurality of decoders, and a memory cell array having at least one access port which is independently addressable, wherein particular one access port of each memory cell of the memory cell array is accessed on the basis of a corresponding output of the selector means.

Preferably, according to a fourth aspect of the present invention, the plurality of decoders comprise; a first decoder having its outputs arranged on the basis of an access order in a first operation mode which corresponds to one of certain two operation modes in the plurality of operation modes, and a second decoder having its outputs arranged on the basis of an access order in a second operation mode which corresponds to the other of the two operation modes, and the selector means selectively outputs the respective outputs of the first and second decoders to the memory cell array.

Preferably, according to a fifth aspect of the present invention, the plurality of decoders comprise; a first decoder having its outputs arranged on the basis of an access order in a first operation mode which corresponds to one of certain three operation modes in the plurality of Operation modes, a second decoder having its outputs arranged on the basis of an access order in a second operation mode which corresponds to another one of the three operation modes, and a third decoder having its outputs arranged on the basis of an access order in another second operation mode which corresponds to still another one of the three operation modes, and the selector means further comprises; first selector means for selectively outputting the respective outputs of both of the first and second decoders, and second selector means for selectively outputting the respective outputs of both of the first selector means and the third decoder to the memory cell array, wherein the first and second selector means both select the outputs of the first decoder when access is made in the first operation mode, the first and second selector means both select the outputs of the second decoder when access is made in the second operation mode, and the second selector means selects the outputs of the third decoder when access is made in the another second operation mode.

Preferably, according to a sixth aspect of the present invention, the semiconductor storage circuit device further comprises; selector means, and a memory cell array having at least one access port which is independently addressable, wherein the plurality of decoders comprise; a first decoder having its outputs arranged on the basis of an access order in a first operation mode which corresponds to one of certain two operation modes in the plurality of operation modes, and a second decoder having its outputs arranged on the basis of an access order in a second operation mode which corresponds to the other of the certain two operation modes, wherein at least one of the outputs of the first decoder which provides the same address as a corresponding output of the second decoder is connected directly to particular one access port of a corresponding memory cell in the memory cell array, other outputs of the first decoder are connected to corresponding inputs of the selector means together with corresponding outputs of the second decoder, and the selector means selects the respective inputted outputs of the first and second decoders and outputs the outputs to corresponding memory cells other than the memory cell directly connected to the first decoder.

According to a seventh aspect of the present invention, a semiconductor storage circuit device comprises; a decoder having its outputs which sequentially attain an active state in respective access orders for a plurality of operation modes to be realized, on the basis of externally supplied addresses for a single operation mode, and a memory cell array in which a particular port of the each corresponding memory cell is accessed by each of the outputs of the decoder.

Preferably, according to an eighth aspect of the present invention, the decoder comprises; a plurality of predecoders each receiving the addresses for supplying addresses of certain bits which represent part of the addresses, and a plurality of final stages functioning as AND circuits, each of the plurality of final stages having its plurality of inputs connected to respective outputs of the plurality of predecoders and its output connected to a particular port of the memory cell array, wherein, for each of the plurality of final stages, the connection between the plurality of inputs and the respective outputs of the plurality of predecoders is changed in accordance with respective access orders in the plurality of operation modes to be realized.

Preferably, according to a ninth aspect of the present invention, the decoder further comprises; selector means provided between each of the plurality of inputs of each of the plurality of final stages and corresponding outputs of each of the plurality of predecoders, the selector means selecting and outputting outputs of corresponding ones of the plurality of predecoders according to each access order for the plurality of operation modes to be realized.

According to an tenth aspect of the present invention, a semiconductor storage circuit device comprises; first operation mode access means having its outputs sequentially attaining an active state with a shift operation function, and a decoder receiving externally supplied addresses for a single operation mode to place its outputs in an active state, wherein the outputs of the decoder are arranged to satisfy correspondence relative to an access order of a first operation mode realized by the first operation mode access means, on the basis of an access order for a second operation mode different from the first operation mode.

Preferably, according to a eleventh aspect of the present invention, the semiconductor storage circuit device further comprises; a memory cell array having its memory cells each having at least two particular access ports independently addressable, wherein the particular two access ports in each memory cell are respectively accessed by corresponding ones of the respective outputs of the first operation mode access means and the decoder.

Preferably, according to a twelfth aspect of the present invention, the semiconductor storage circuit device further comprises; selector means for selectively outputting the respective outputs of the first operation mode access means and the decoder, and a memory cell array having its memory cells each having at least one access port which is independently addressable, wherein the one access port of each memory cell is accessed by a corresponding output of the selector means.

Preferably, according to a thirteenth aspect of the present invention, one and the other of the particular two access ports of each of the memory cells are directly accessed by the corresponding outputs of one and the other of the certain two decoders, respectively.

Preferably, according to a fourteenth aspect of the resent invention, the semiconductor storage circuit device further comprises; selector means for selectively outputting corresponding ones of the respective outputs of one and the other of the certain two decoders, wherein one of the particular two access ports of each of the memory cells is accessed on the basis of a corresponding output of the one of the certain two decoders, and the other of the particular two access ports of each of the memory cells is accessed on the basis of a corresponding output of the selector means.

Preferably, according to a fifteenth aspect of the present invention, the semiconductor storage circuit device further comprises; first and second selector means both for selectively outputting corresponding ones of the respective outputs of one and the other of the certain two decoders, wherein one of the particular two access ports of each of the memory cells is accessed on the basis of a corresponding output of the first selector means, and the other of the particular two access ports of each of the memory cells is accessed on the basis of a corresponding output of the second selector means.

Preferably, according to a sixteenth aspect of the present invention, the decoder comprises; a plurality of predecoders receiving the addresses for supplying addresses of certain bits representing part of the addresses, respectively, and a plurality of final stages having a plurality of input signal lines connected to a plurality of corresponding outputs of each of the plurality of predecoders, and functioning as a NAND circuit for the plurality of input signal lines to transmit its NAND output to the corresponding particular port of the memory cell array, wherein for each of the plurality of final stages, connection between the plurality of input signal lines and the plurality of outputs of each of the plurality of predecoders is set according to respective access orders for the plurality of operation modes to be realized.

According to a seventeenth aspect of the present invention, a semiconductor storage circuit device comprises; word line selecting means having its outputs sequentially attaining an active state in respective access orders for a plurality of operation modes to be realized on the basis of externally supplied addresses for a single operation mode, a column select signal generating circuit generating a column select signal on the basis of the outputs of the word line selecting means, a memory cell array in which, by each output of the word line selecting means, a particular port of each memory cell belonging to a row corresponding to that output is accessed, and a column selector provided for a plurality of sequential columns in the memory cell array and responsive to the column select signal inputted from the column select signal generating circuit for selecting corresponding one of the plurality of columns.

According to a eighteenth aspect of the present invention, a semiconductor storage circuit device comprises; a decoder which places its outputs in an active state in an access order for a first operation mode with a shift operation, and when making access in a second operation mode different from the first operation mode, sequentially places the outputs into an active state in an access order of the second operation mode on the basis of externally supplied addresses for a single operation mode, and a memory cell array in which a particular port of the each corresponding memory cell is accessed by each output of the decoder.

Preferably, according to a nineteenth aspect of the present invention, the decoder comprises; a plurality of predecoders receiving the addresses for supplying addresses of certain bits representing part of the addresses, respectively, and a plurality of final stages having a plurality of input signal lines connected to corresponding ones of a plurality of outputs of each of the plurality of predecoders and a signal line receiving a serial data on a next preceding stage side as input, for capturing the serial data from the preceding stage side in the first operation mode and then outputting that captured serial data to a next following stage side and to the corresponding particular port of the memory cell array, and in the second operation mode, for functioning as an AND circuit to the plurality of input signal lines to output its AND output to the corresponding particular port of the memory cell array, wherein for each of the plurality of final stages, the relation in connection between the plurality of input signal lines and the plurality of outputs of each of the plurality of predecoders is set in accordance with the access order of the second operation mode.

Preferably, according to a twentieth aspect of the present invention, the plurality of operation modes to be realized include first and second operation modes, each of the plurality of final stages comprises; a first NAND circuit portion receiving ones of the plurality of input signal lines as its input signal lines, which are connected to corresponding ones of the outputs of each of the plurality of predecoders to provide the address order for the first operation mode, and performing NAND processing to those input signal lines, and a second NAND circuit portion receiving ones of the plurality of input signal lines as its input signal lines, which are connected to corresponding ones of the outputs of each of the plurality of predecoders to provide the address order of the second operation mode, and performing NAND processing to those input signal lines, wherein outputs of the first and second NAND circuit portions are switched according to levels of an externally supplied enable signal and its inversion signal and provided to a corresponding one of the memory cells as the NAND output.

According to a twenty-first aspect of the present invention, a semiconductor storage circuit device comprises; a multi-port RAM having two or more access ports which are independently addressable, wherein at least one memory cell in the multi-port RAM has different addresses with respect to two of the access ports.

According to a twenty-second aspect of the present invention, a semiconductor storage circuit designing device for performing circuit design for a semiconductor storage circuit device, the semiconductor storage circuit device comprising at least one decoder and a memory cell array accessed by the decoder comprises; means for inputting an information signal relating to an output order of the decoder which provides each address order for each of a plurality of operation modes to be realized, and means for generating on the basis of said information signal an information data signal relating to circuit configuration of the decoder for making access in the address order for each of the plurality of operation modes with externally supplied addresses for a single operation mode.

According to the first through sixth and thirteenth through fifteenth aspects of the present invention, only by supplying addresses for a single operation mode from the outside, a plurality of different, complicated access orders can be easily realized on the basis of such addresses. Accordingly, means for supplying the addresses for a single operation mode can be configured simply by using a counter circuit, for example.

Particularly, according to the second aspect of the present invention, access can be realized easily to particular two access ports of each memory cell in a multi-port memory cell array utilizing two different, complicated access orders for multi-purposes.

Particularly, according to the third and fourth aspects of the present invention, a particular one access port in each memory cell in a memory cell array can be easily accessed in two different, and complicated, access orders.

Particularly, according to the fifth aspect of the present invention, a particular one access port in each memory cell in a memory cell array can easily be accessed in two different, complicated access orders in certain three operation modes.

Particularly, according to the sixth aspect of the present invention, circuit scale can be reduced, and layout area and power consumption can be reduced and operation speed can be increased.

According to the seventh through ninth and sixteenth aspects of the present invention, a plurality of different, complicated access orders can be generated in one decoder only by supplying addresses for a single operation mode from the outside and access corresponding to the number of applications can be easily made to a particular one access port in each memory cell in a memory cell array by each of these access orders. In addition, it is more advantageous in layout than a configuration using a plurality of decoders because it requires only one decoder.

According to the tenth through twelfth aspects of the present invention, two different, complicated access orders can be easily implemented by utilizing shift operation.

Particularly, according to the eleventh aspect of the present invention, particular two access ports in each memory cell in a memory cell array can be accessed easily in two different, complicated access orders.

Particularly, according to the twelfth aspect of the present invention, a particular one access port in each memory cell in a memory cell array can be accessed easily in two different, complicated access orders.

According to the thirteenth aspect of the present invention, particular two access ports in each memory cell in a multi-port memory cell array can be easily accessed in two different, complicated access orders.

Particularly, according to the fourteenth and fifteenth aspects of the present invention, regular test algorithm can be applied to the semiconductor storage circuit device.

Particularly, according to the fifteenth aspect of the present invention, with a semiconductor storage circuit device, a so-called address order conversion mode and an address order reverse conversion mode in reverse relation therewith can be easily realized in the semiconductor storage circuit device.

According to the sixteenth aspect of the present invention, the number of transistors forming the decoder and the number of interconnections in the decoder can be reduced.

According to each of the seventeenth and twentieth aspects of the present invention, a plurality of different, complicated access orders can be generated only by supplying addresses for a single operation mode from the outside and particular one access port in each memory cell in a memory cell array can be accessed in each of these access orders, and the column select function can also be realized. This achieves improvements in configuration of the memory cell array and improvements in access time, etc.

According to the eighteenth and nineteenth aspects of the present invention, a particular port of each memory cell can be easily accessed in each access order of first and second operation modes by using a decoder having a shift register function.

Particularly, according to the twentieth aspect of the present invention, a particular port of each memory cell can be easily accessed in each access order of first and second operation modes generated in the decoder without using precharge signal.

According to the twenty-first aspect of the present invention, circuit configuration of a semiconductor storage circuit device enabling access in address orders for a plurality of operation modes can be designed automatically.

According to the twenty-second aspect of the present invention, a memory cell can be accessed by different addresses.

It is an object of the present invention to provide a semiconductor storage circuit device which eliminates the need of the above-described special address generating circuit and enables access to memory cells in access orders in a plurality of operation modes by itself.

Furthermore, the present invention is intended to realize the semiconductor storage circuit device with simpler circuit structure so that the device can be adapted to the trends to the lower power consumption type and higher speed operation type.

Furthermore, it is another object of the present invention to improve the semiconductor storage circuit device to provide a function of testing the memory cell array in addition to the functions above.

Moreover, the present invention is also intended to enable memory cell access in a reverse mode operation during normal system operation.

Furthermore, it is also an object of the present invention to enable these functions by using CMOS gate array technique.

Moreover, it is also an object of the present invention to realize a semiconductor storage circuit device further having a function of internally enabling column select control by itself.

Furthermore, it is also an object of the present invention to realize the above column select function with simpler circuit structure so that it is adaptable to the tendency toward lower power consumption and higher speed operation and also to provide circuit technique, and placement and routing or layout technique which implement those functions all with a CMOS gate array to enable higher density packaging.

Furthermore, the present invention is also intended to provide technique for actually enabling circuit design of a semiconductor storage circuit device having the above-described various functions.

These and other objects, features, aspects and advantages of the present invention will become more apparent from the following detailed description of the present invention when taken in conjunction with the accompanying drawings.

BRIEF DESCRIPTION OF THE DRAWINGS

FIG. 47 is a block diagram showing a structural example of a characteristic portion in a semiconductor storage circuit device according to a twenty-third preferred embodiment of the present invention.

DESCRIPTION OF THE PREFERRED EMBODIMENTS

Figure 1:
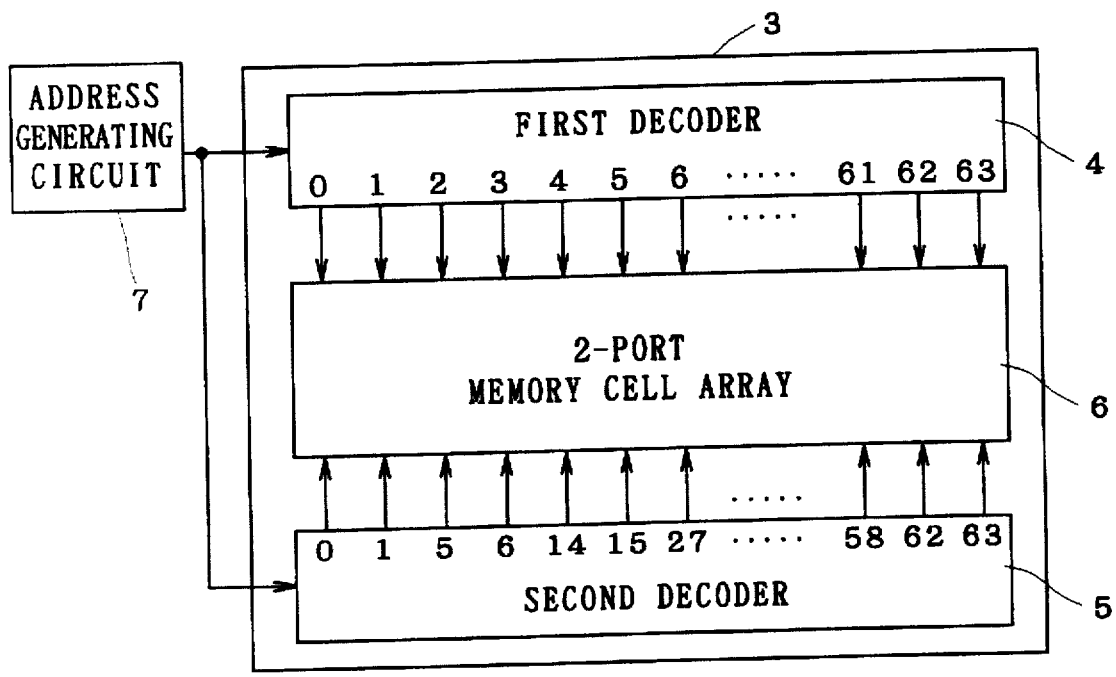
FIGS. 1(a) and 1(b) are diagrams showing the structure of semiconductor storage circuit devices according to a first preferred embodiment of the present invention.
Figure 1:
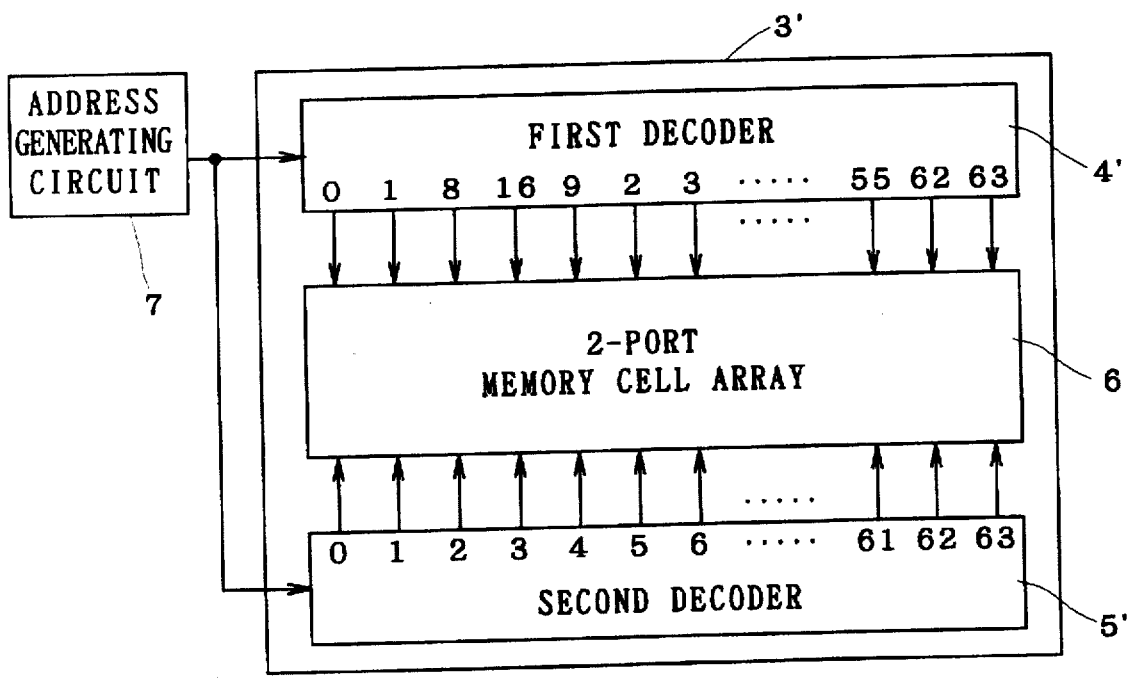

FIGS. 9(a) and 9(b) are diagrams showing an access order for a memory circuit used in the digital image compression technique (MPEG, ISO/IEC11172, etc.) In these figures, numbers not put in parentheses show memory cells.

In the first operation mode, the memory cells are sequentially accessed in the order of memory cells 0, 1, 2, 3, . . . 61, 62, 63.

In contrast, in the second operation mode, as shown in FIG. 9(a), the memory cells are accessed in the order of memory cells 0, 1, 8, 16, 9, 2, 3, 10, 17, 24, 32, 25, 18, 11, 4, 5, 12, 19, 26, 33, 40, 48, 41, 34, 27, 20, 13, 6, 7, 14, 21, 28, 35, 42, 49, 56, 57, 50, 43, 36, 29, 22, 15, 23, 30, 37, 44, 51, 58, 59, 52, 45, 38, 31, 39, 46, 53, 60, 61, 54, 47, 55, 62, 63. The second operation mode is particularly called zig-zag scan.

FIG. 9(b) shows the access order in the zig-zag scan of FIG. 9(a) with the numbers enclosed in the parentheses. For example, it shows that the memory cells 0, 1, 2, 3, 4, 5, 6, 7 are accessed in the 0th, 1st, 5th, 6th, 14th, 15th, 27th, 28th places, respectively.

FIGS. 10(a) and 10(b) are diagrams showing the access order for a memory circuit used in the digital image compression technique (MPEG 2, etc.) Here, the numbers not enclosed in the parentheses also denote memory cells, respectively.

In the first operation mode, the memory cells are sequentially accessed in the order of memory cells 0, 1, 2, 3, . . . 61, 62, 63.

On the other hand, in the second operation mode, as shown by the arrows in FIG. 10(a), the memory cells are respectively accessed in the order of memory cells 0, 8, 16, 24, 1, 9, 2, 10, 17, 25, 32, 40, 48, 56, 57, 49, 41, 33, 26, 18, 3, 11, 4, 12, 19, 27, 34, 42, 50, 58, 35, 43, 51, 59, 20, 28, 5, 13, 6, 14, 21, 29, 36, 44, 52, 60, 37, 45, 53, 61, 22, 30, 7, 15, 23, 31, 38, 46, 54, 62, 39, 47, 55, and 63. The second operation mode is called alternate scan.

FIG. 10(b) shows the access order in the alternate scan of FIG. 10(a) with the numbers in the parentheses. For example, it shows that the memory cells 0, 1, 2, 3, 4, 5, 6, 7 are accessed in the 0th, 4th, 6th, 20th, 22nd, 36th, 38th, 52nd places, respectively.

Now, structures and operations of the preferred embodiments will be described in detail.

Here, the description will be made with numbers assigned to respective memory cells in the memory cell array 6 in the above-stated order. Accordingly, the memory cells are numbered as 0, 1, 2, 3, 4, 5, 6, . . . 61, 62, 63 sequentially from the left in the figure.

Now, if access is made in the increment order by the counter circuit 7, the outputs 0, 1, 2, 3, 4, 5, 6, . . . , 61, 62, 63 of the second decoder 5 sequentially attain an active state in that order (0, 1, 2, 3, 4, . . . , 61, 62, 63). As a result, the memory cells 0, 1, 2, 3, 4, 5, 6, . . . , 61, 61, 63, respectively receiving the outputs 0, 1, 5, 6, 14, 15, 27, . . . , 58, 62, 63 from the second decoder 5 are accessed in the 0th, 1st, 5th, 6th, 14th 15th, 27th, . . . , 58th, 62nd, 63rd places, respectively. That is to say, while the memory cells 0, 1, 2, . . . , 61, 62, 63 are accessed in the access order in the first operation mode respectively by tILe outputs of the first decoder 4, they are also sequentially accessed in the access order in tILe second operation mode (zig-zag scan) by the respective outputs of the second decoder 5.

In this way, according to tILe first preferred embodiment, two access orders can be realized only with counting-up operation of the counter circuit 7.

Physical arrangement of decoder outputs is arbitrary as long as tILe correspondence relation between the first and second decoders is unchanged. For example, in FIG. 1(b), arrangement of the decoder outputs in FIG. 1(a) is changed, which is configured so that the outputs 0, 1, 2, 3, 4, 5, 6, . . . , 61, 62, 63 of the second decoder 5' are sequentially arranged from left to right in the figure.

The two devices of FIG. 1(a) and FIG. 1(b) are logically the same. For example, the output 2 of the first decoder 4' corresponds to the output 5 of the second decoder 5', and such a relation corresponding to the zig-zag scan is the same both in FIG. 1(a) and FIG. 1(b).

As stated above, according to this first preferred embodiment, in a two-port RAM, a complicated access order can be realized with a simple address generating circuit (e.g., a counter circuit) by making arrangements of outputs of two decoders differ between ports according to access orders of the first and second operation modes.

Although the above description has been made on a two-port RAM, it is also applicable to a multi-port RAM having two or more access ports which are independently addressable.

(Second Preferred Embodiment)

Figure 2:
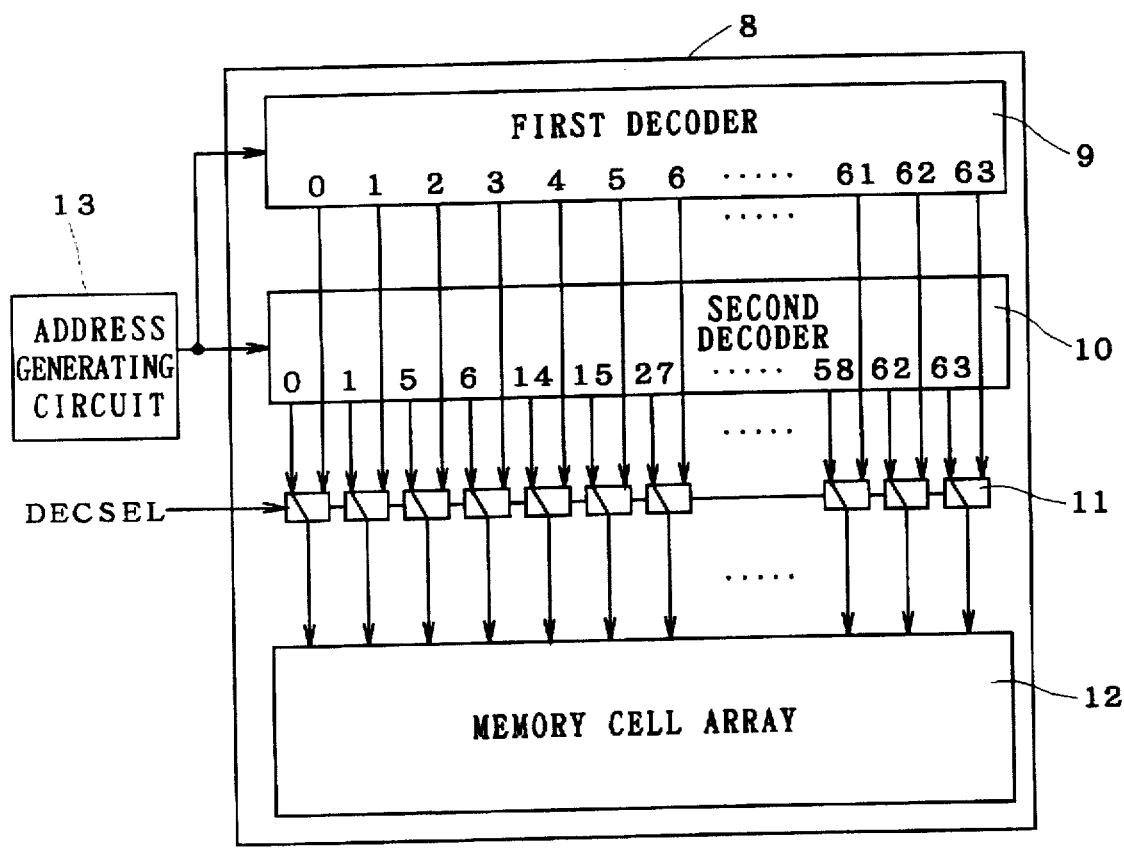
FIG. 2 is a diagram showing the structure of a semiconductor storage circuit device according to a second preferred embodiment of the present invention.

FIG. 2 is a structural diagram of a semiconductor storage circuit device in a second preferred embodiment of the present invention, where a single-port RAM has the same function as that of the first preferred embodiment. FIG. 2 shows a circuit which is adapted to the zig-zag scan described in FIG. 9.

Here, in this preferred embodiment, the above two operation modes are implemented by increasing the number of decoders forming the single-port RAM 8 to two (a first decoder 9 and a second decoder 10), with outputs of the two decoders 9 and 10 being in correspondence changed according to the access orders of the first and second operation modes described in FIGS. 9(a) and 9(b).

The first and second decoders 9 and 10 are switched by selectors 11 controlled by a decoder select signal DECSEL in operation.

The address generating circuit 13 is a counter circuit, for example, which supplies common addresses to the two decoders 9 and 10. It will be referred to as counter circuit 13.

Now, FIG. 2 will be described.

If counting-up operation is made by the counter circuit 13 with the outputs of the first decoder 9 being selected by the selectors 11, outputs 0, 1, 2, 3, 4, 5, 6, . . . , 61, 62, 63 of the first decoder 9 sequentially attain an active state in the above-described order corresponding to the access order for the first operation mode, which results in the respective memory cells (not shown) accessed in order from the leftmost memory cell to right in the figure. Now, memory cells in the one-port memory cell array 12 are numbered in the above access order. Accordingly, the memory cells are numbered as 0, 1, 2, 3, 4, 5, 6, . . . , 61, 62, 63 in order from the leftmost memory cell.

Next, it is assumed that the counting-up operation is made by the counter circuit 13 with the second decoder 10 selected by the selectors 11. At this time, the outputs 0, 1, 2, 3, 4, 5, 6, . . . , 61, 62, 63 of the second decoder 10 being in correspondence with the outputs 0, 1, 8, 16, 9, 2, 3, . . . , 55, 62, 63 of the first decoder 9 on the basis of the access order of the zig-zag scan attain an active state in order. As a result, memory cells 0, 1, 2, 3, 4, 5, 6, . . . , 61, 62, 63 are accessed in the 0th, 1st, 5th, 6th, 14th, 15th, 27th, . . . , 58th, 62nd, 63rd places, respectively. This realizes the zig-zag scan shown in FIGS. 9(a) and 9(b).

In this way, in the second preferred embodiment, two access orders can be realized only with counting-up operation of the counter circuit 13 even in a single-port RAM 8 with the two decoders, the decoders having their respective outputs differently arranged on the basis of access orders of operation modes, and the selectors selecting a decoder to be used.

If the correspondence relation between outputs of the first and second decoders 9 and 12 are unchanged, physical arrangement of the decoder outputs is arbitrary.

(Third Preferred Embodiment)

Figure 3:
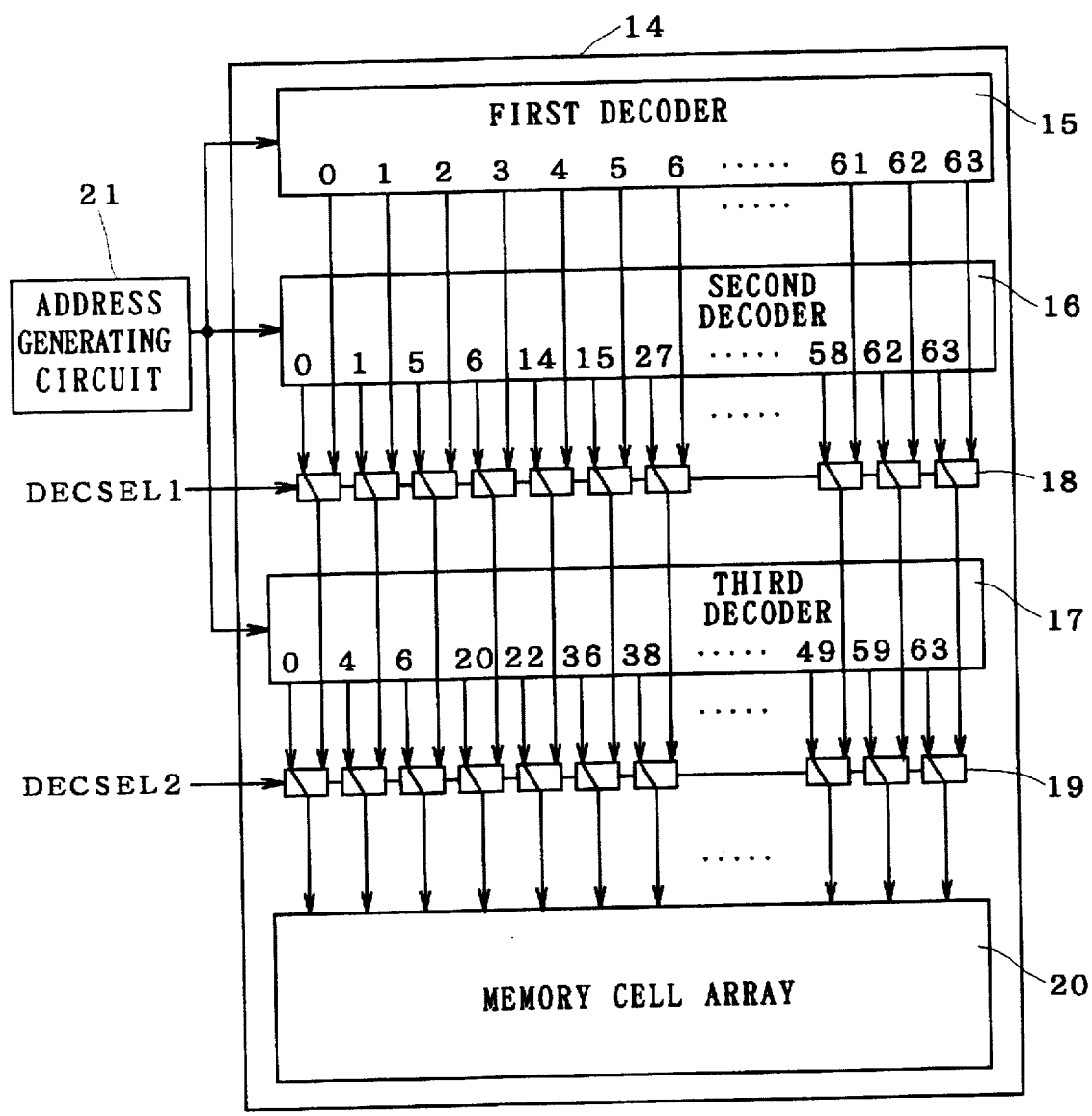
FIG. 3 is a diagram showing the structure of a semiconductor storage circuit device according to a third preferred embodiment of the present invention.

FIG. 3 is a structural diagram of a semiconductor storage circuit device in a third preferred embodiment of the present invention. The device in this figure is a circuit which is applicable to both the zig-zag scan of FIGS. 9(a) and 9(b) and the alternate scan of FIGS. 10(a) and 10(b).

Here, decoders forming a single-port RAM 14 are increased in number to three (a first decoder 15, a second decoder 16, a third decoder 17) and three operation modes (the increment as the first operation mode, the zig-zag scan and the alternate scan) are realized by changing the correspondence relations among the three decoders 15 to 17 on the basis of the correspondence relations among access orders of the three operation modes.

The three decoders 15 to 17 are switched by first and second selectors 18 and 19 respectively controlled by a first decoder select signal DECSEL1 and a second decoder select signal DECSEL2.

The address generating circuit 21 is a counter circuit, for example, which supplies common addresses to the three decoders 15 to 17. It is referred to as counter circuit 21 below.

Now, if counting-up operation is made by the counter circuit 21 with the first decoder 15 selected by the first and second selectors 18 and 19, outputs 0, 1, 2, 3, 4, 5, 6, ..., 61, 62, 63 of the first decoder 15 sequentially attain an active state in this order, and memory cells (not shown) are sequentially accessed from the leftmost memory cell to the right in FIG. 3.

Here, the description will be made with the memory cells numbered in this order. Accordingly, the memory cells are numbered as 0, 1, 2, 3, 4, 5, 6, ..., 61, 62, 63 in order from the leftmost memory cell.

Next, if counting-up operation is made by the counter circuit 21 with the second decoder 16 selected by the first and second selectors 18 and 19, then outputs 0, 1, 2, 3, 4, 5, 6, ..., 61, 62, 63 of the second decoder 16, which are rearranged to satisfy the correspondence relation between the access order for the increment and the access order for the zig-zag scan, sequentially attain an active state in this order. As a result, the memory cells 0, 1, 2, 3, 4, 5, 6, ..., 61, 62, 63 are respectively accessed in the 0th, 1st, 5th, 6th, 14th, 15th, 27th, ..., 58th, 62nd, 63rd places. This corresponds to the zig-zag scan of FIGS. 9(a) and 9(b).

Figure 10:
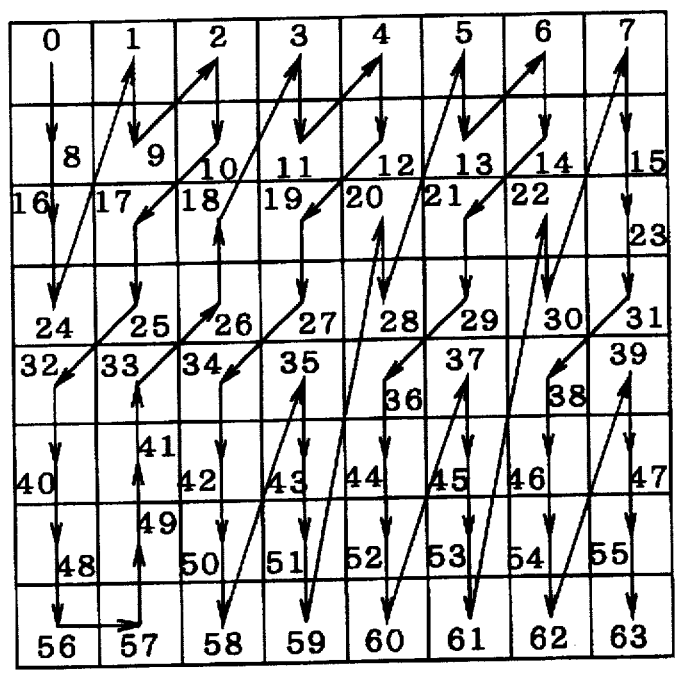
FIGS. 10(a) and 10(b) are diagrams showing the access order in the alternate scan.

On the other hand, if counting-up operation is made by the counter circuit 21 with the third decoder 17 selected by the first and second selectors 18 and 19, outputs 0, 1, 2, 3, 4, 5, 6, ..., 61, 62, 63 of the third decoder 17, which are rearranged to satisfy the correspondence relation (FIG. 10(b)) between the access order of the first operation mode and the access order of the alternate scan, sequentially attain an active state in this order. As a result, the memory cells 0, 1, 2, 3, 4, 5, 6, ..., 61, 62, 63 are accessed in the 0th, 4th, 6th, 20th, 22nd, 36th, 38th, ..., 49th, 59th, 63rd places, respectively. This corresponds to the alternate scan in FIG. 10.

In this way, three access orders (increment, zig-zag scan and alternate scan) can be realized only with counting-up operation of the counter circuit 21, with three decoders 15 to 17, each having its outputs rearranged on the basis of the access order of a corresponding operation mode, and by selecting a decoder to be used with the first and second selectors 18 and 19.

(Fourth Preferred Embodiment)

Figure 4:
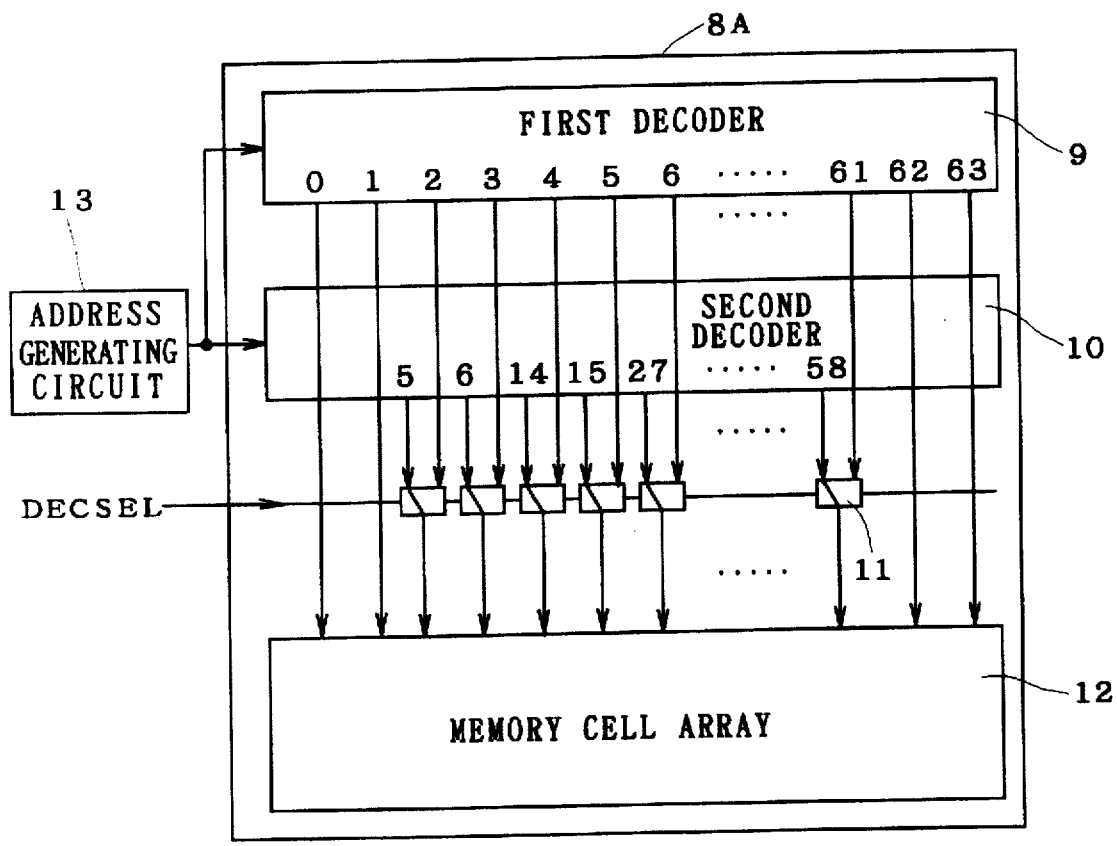
FIG. 4 is a diagram showing the structure of a semiconductor storage circuit device according to a fourth preferred embodiment of the present invention.

FIG. 4 shows an improvement applied to the semiconductor storage circuit device of FIG. 2, where unnecessary circuits are removed. That is to say, for example in FIG. 2, outputs 0, 1, 62, 63 of the first decoder 9 and outputs 0, 1, 62, 63 of the second decoder 10 access the same memory cells 0, 1, 62, 63, respectively, so that corresponding circuits of the selectors 11 and decoder outputs on one side are not necessary.

Accordingly, a circuit with these parts removed corresponds to that in FIG. 3. It is the same as the circuit of FIG. 2 in other respects.

This enables reduction in circuit scale, which results in the effects of reducing the layout area and power consumption.

(Fifth Preferred Embodiment)

Figure 5:
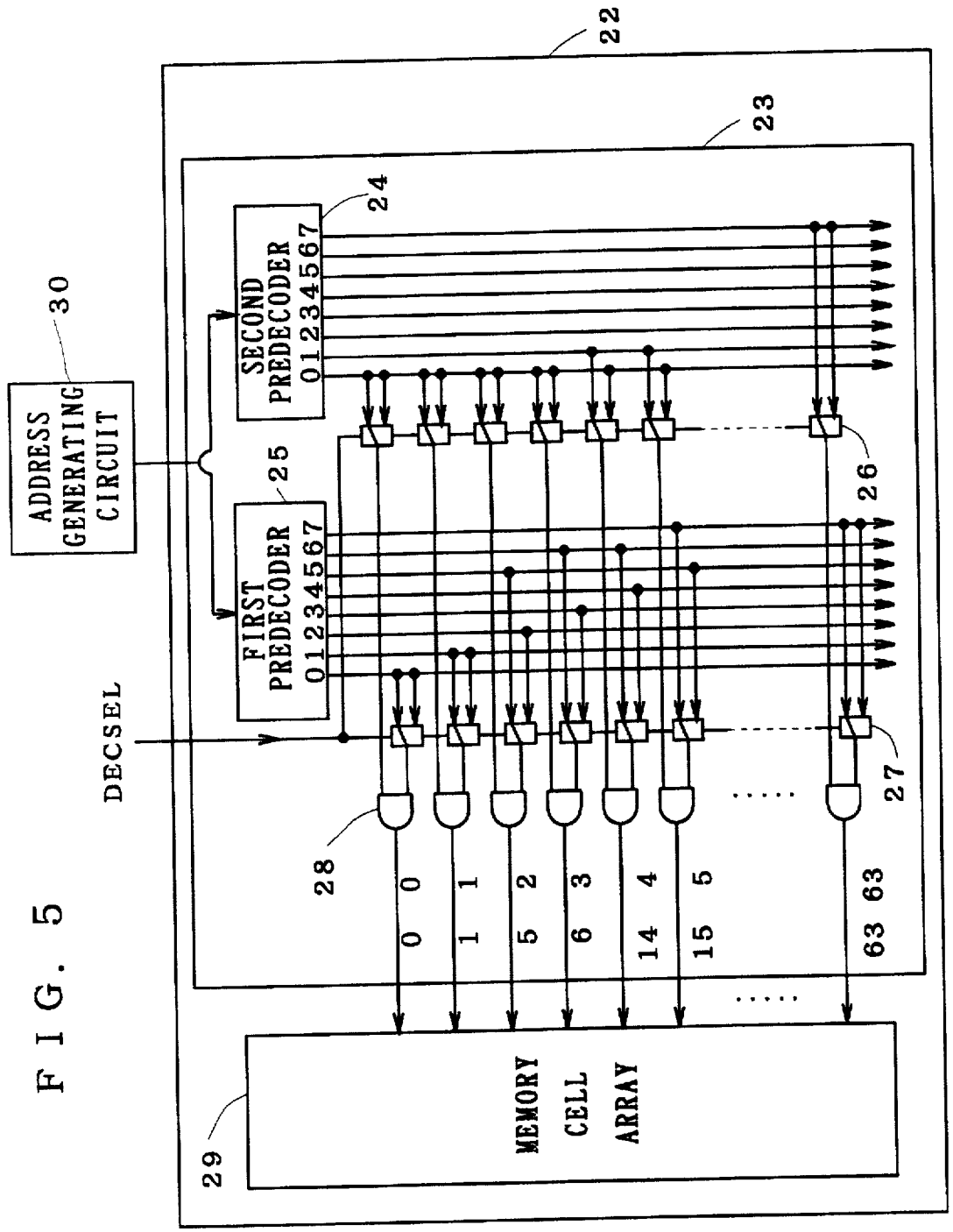
FIG. 5 is a diagram showing the structure of a semiconductor storage circuit device according to a fifth preferred embodiment of the present invention.

FIG. 5 is a structural diagram of a semiconductor storage circuit device in a fifth preferred embodiment of the present invention, which device is a circuit adapted to the zig-zag scan of FIGS. 9(a) and 9(b) as an example of the second operation mode.

It realizes two operation modes (increment, zig-zag scan) by making differ connections between inputs of final stages of the decoder 23 (the AND circuits 28 in FIG. 5) forming the single-port RAM 22 and first and second predecoders 25 and 24 on the basis of access orders of operation modes to be realized.

The above operation modes are switched by first and second selectors 26 and 27 controlled by a decoder select signal DECSEL.

The address generating circuit 30 is a counter circuit (a 6-bit counter in FIG. 5), for example, which supplies high-order address (three bits) and low-order address (three bits) to the two predecoders, i.e., the second predecoder 24 and the first predecoder 25, respectively. Now, it is simply referred to as counter circuit 30 below.

The first predecoder 25 and the second predecoder 24 are both 3-input, 8-output decoders.

First, when respective inputs located on the right side in the figure of the respective selectors 26 and 27 are selected, outputs of the decoder 23 are 0, 1, 2, 3, 4, 5, 6, ..., 61, 62, 63 in order from the left. Here, the description will be made with the memory cells in the memory cell array 29 numbered in this order. Hence, the memory cells are 0, 1, 2, 3, 4, 5, 6, ..., 61, 62, 63 in order from the leftmost memory cell in the figure.

On the other hand, if the other respective inputs located on the left side in the figure of the respective selectors 26 and 27 are selected by the decoder selector signal DECSEL, outputs of the decoder 23 are 0, 1, 5, 6, 14, 15, ..., 63 in order from the one located in the leftmost position in the figure.

Now, suppose that counting-up operation be thus made by the counter circuit 30. Then, access orders are as follows in the cases of (1) and (2) shown below.

(1) When the inputs on the right side of the respective selectors 26 and 27 are selected, memory cells 0, 1, 2, 3, 4, 5, ..., 63 are accessed in the 0th, 1st, 2nd, 3rd, 4th, 5th, ..., 63rd places, respectively, realizing the operation mode for increment.

(2) When the inputs on the left side of the respective selectors 26 and 27 are selected, memory cells 0, 1, 2, 3, 4, 5, ..., 63 are accessed in the 0th, 1st, 5th, 6th, 14th, 15th, ..., 63rd places, respectively. This corresponds to the zig-zag scan of FIGS. 9(a) and 9(b).

In this way, it is possible to realize two access orders only with counting-up operation of the counter circuit 30 by switching the connections between the two predecoders 24 and 25 and the final stages of the decoder 23 with the selectors 26 and 27 on the basis of the correspondence between access orders for two operation modes.

Physical arrangement of the decoder final stages (the AND circuits 28 in FIG. 5) is arbitrary.

Although FIG. 5 shows the case of two predecoders, the same method can be applied also to cases of three or more. For example, when using three 2-input, 4-output predecoders, three type of selectors will be correspondingly provided with respective 3-input AND circuits as decoder final stages and three type of selector circuits will be connected to each 3-input AND circuit.

(Sixth Preferred Embodiment)

Figure 6:
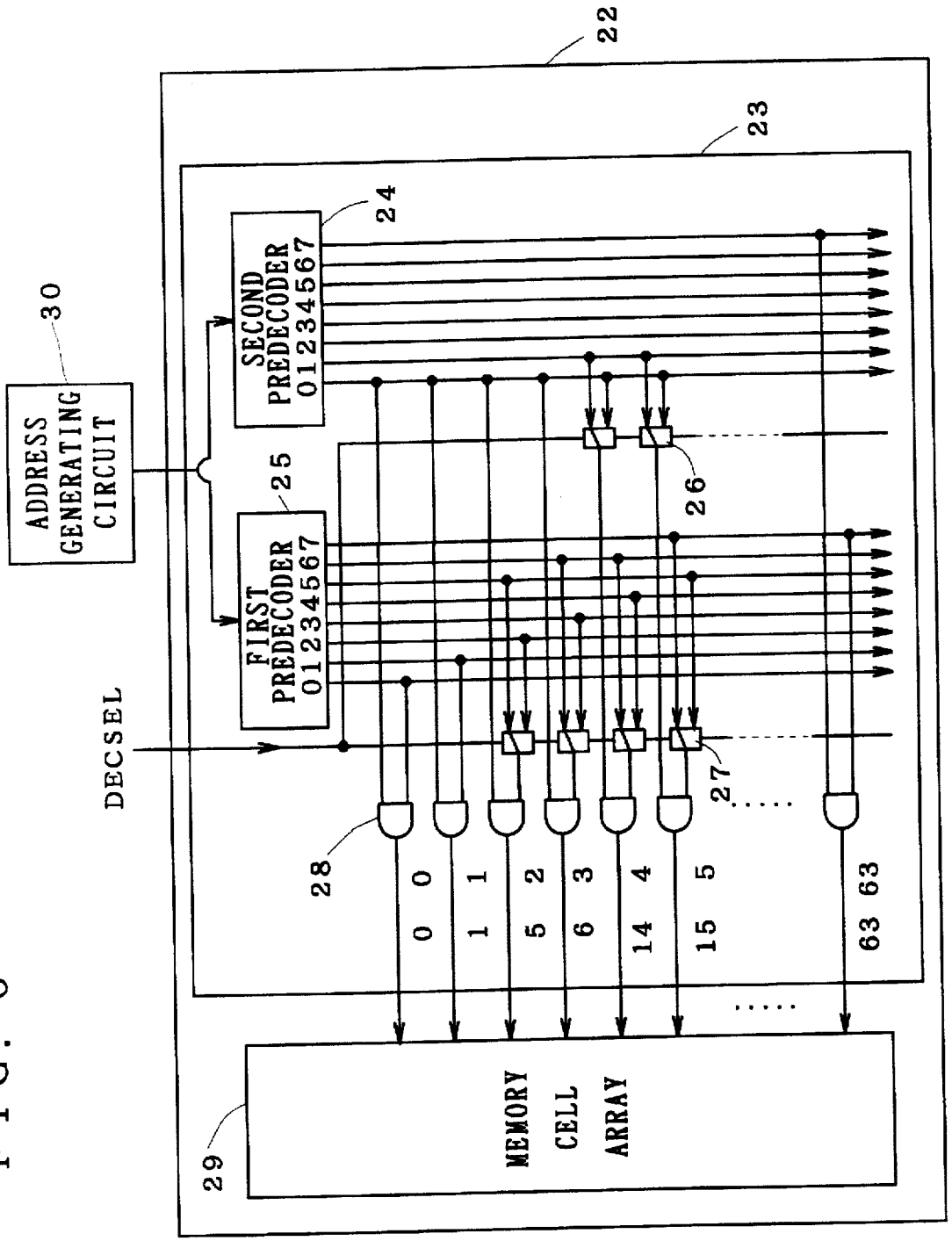
FIG. 6 is a diagram showing the structure of a semiconductor storage circuit device according to a sixth preferred embodiment of the present invention.

FIG. 6 shows an improvement on the semiconductor storage circuit device of FIG. 5, where unnecessary circuit portions are removed. That is to say, in FIG. 5, there are selectors which are supplied with the same signals at their right inputs and left inputs. Hence, these selectors are removed to obtain the circuit of FIG. 6.

This reduces circuit scale, providing the effects of reducing layout area and power consumption.

(Seventh Preferred Embodiment)

FIGS. 7(a) and 7(b) are structural diagrams of a semiconductor storage circuit device in a seventh preferred embodiment of the present invention, which is a circuit adapted to the zig-zag scan of FIGS. 9(a) and 9(b). The circuit of FIG. 7(a) shows a circuit in which the first decoder 4 in the circuit of FIG. 1(a) is replaced by a shift register 32. In the circuit of FIG. 7(b), the second decoder 5' of the circuit of FIG. 1(b) is replaced by a shift register 33.

The shift registers 32 and 33 shown in FIG. 7(a) and (b) have a function of initialization, which can initialize its leading stage to 1 and all other stages to 0s under control by an initialization signal INIT. Zeros are set at the serial inputs of the shift registers 32, 33.

After initialization, with shift operation, respective outputs 0, 1, 2, 3, 4, 5, 6, . . . , 61, 62, 63 of the shift registers 32, 33 sequentially attain an active state (1). These operations are the same as the operations realized by the address generating circuit (counter circuit)7 and the first decoder 4 in FIG. 1(a) and the operations realized by the address generating circuit (counter circuit) 7 and the second decoder 5' in FIG. 1(b), respectively. Accordingly, the circuit of FIG. 7(a) has the same function as that of the circuit of FIG. 1(a) and the circuit of FIG. 7(b) has the same function as that of the circuit of FIG. 1(b). Hence, the same effects as those of the first preferred embodiment are also obtained in the seventh preferred embodiment.

The address generating circuit 7 only requires a counter circuit, which does not require a special, complicated address generating circuit.

(Eighth Preferred Embodiment)

Figure 8:
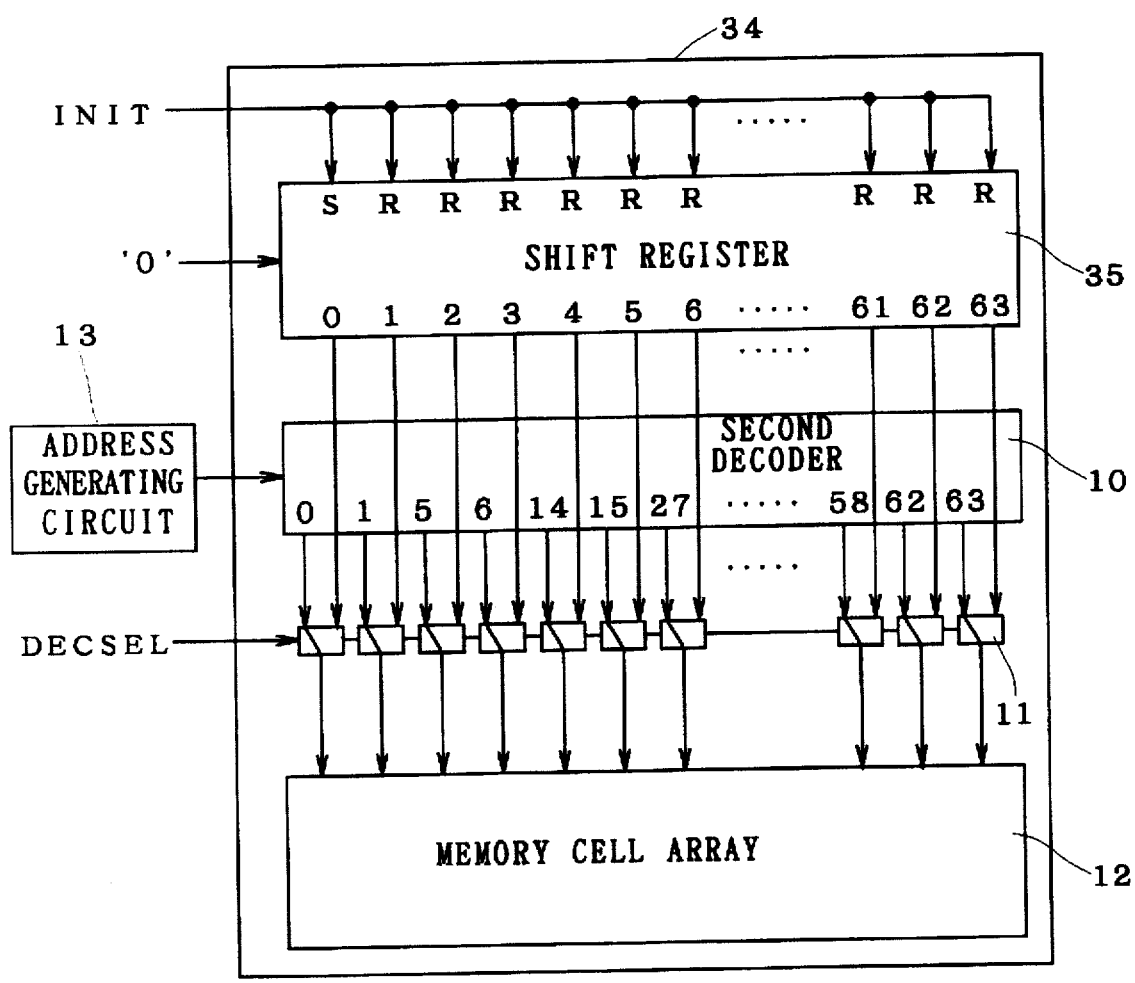
FIG. 8 is a diagram showing the structure of a semiconductor storage circuit device according to an eighth preferred embodiment of/he present invention.

FIG. 8 is a structural diagram of a semiconductor storage circuit device in an eighth preferred embodiment of the present invention, which is a circuit adapted to the zig-zag scan of FIGS. 9(a) and 9(b). In the circuit of FIG. 8, the first decoder 9 of the circuit of FIG. 2 is replaced by a shift register 35.

The shift register 35 shown in FIG. 8 has a function of initialization, which can initialize its leading stage to 1 and all other stages to 0s with control of the initialization signal INIT. Zeros are set at the serial inputs of the shift register 35.

After initialization, with shift operation, outputs 0, 1, 2, 3, 4, 5, 6, . . . , 61, 62, 63 of the shift register 35 sequentially attain an active state (1). This operation is the same as the operation realized by the address generating circuit (counter circuit)7 and the first decoder 9 in FIG. 2. Accordingly, the circuit of FIG. 8 has the same functions and effects as those of the circuit of FIG. 2.

As the address generating circuit 7, only a counter circuit is required, and no special, complicated address generating circuit is not required.

(Modified Examples)

(1) In FIG. 2, FIG. 3, FIG. 4, FIG. 5, FIG. 6 and FIG. 8, the memory cells constituting the memory cell arrays are those for single-port RAMs, but they are not limited to the same. That is to say, memory cells for a multi-port RAM may be used. In this case the technical ideas shown in the above-described FIGS. 2 to 6 and FIG. 8 can be understood as showing a method of selecting memory cells with respect to a particular access port.

Figure 7:
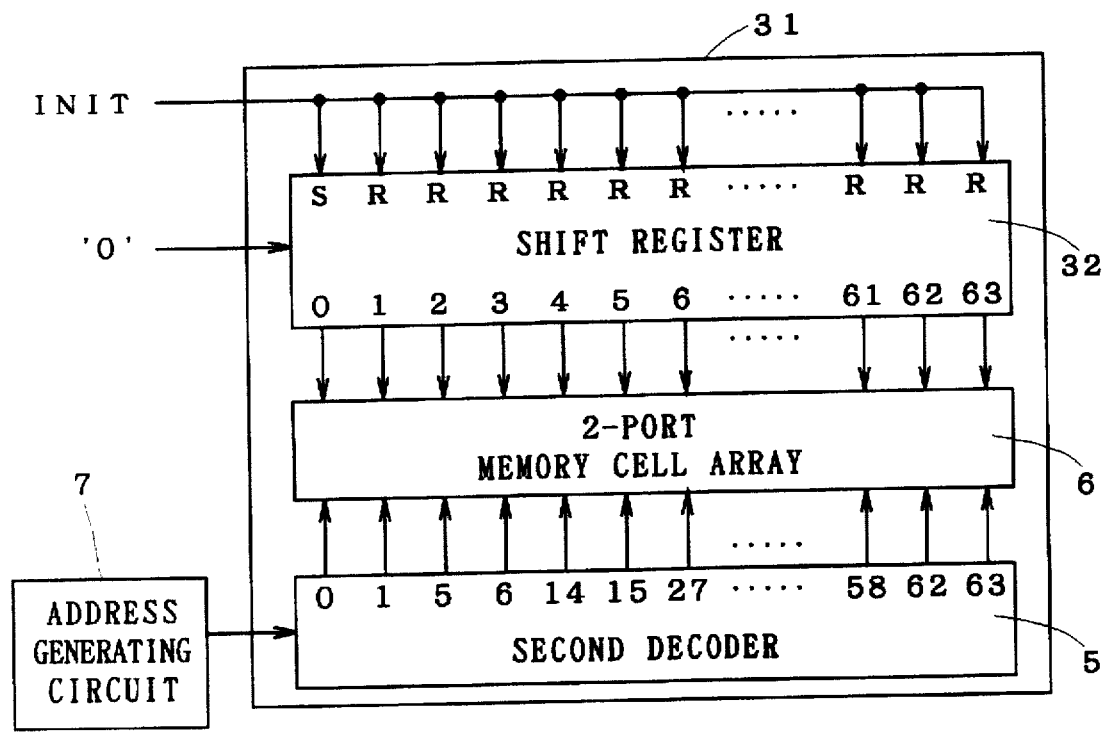
FIGS. 7(a) and 7(b) are diagrams showing the structure of semiconductor storage circuit devices according to a seventh preferred embodiment of the present invention.
Figure 7:
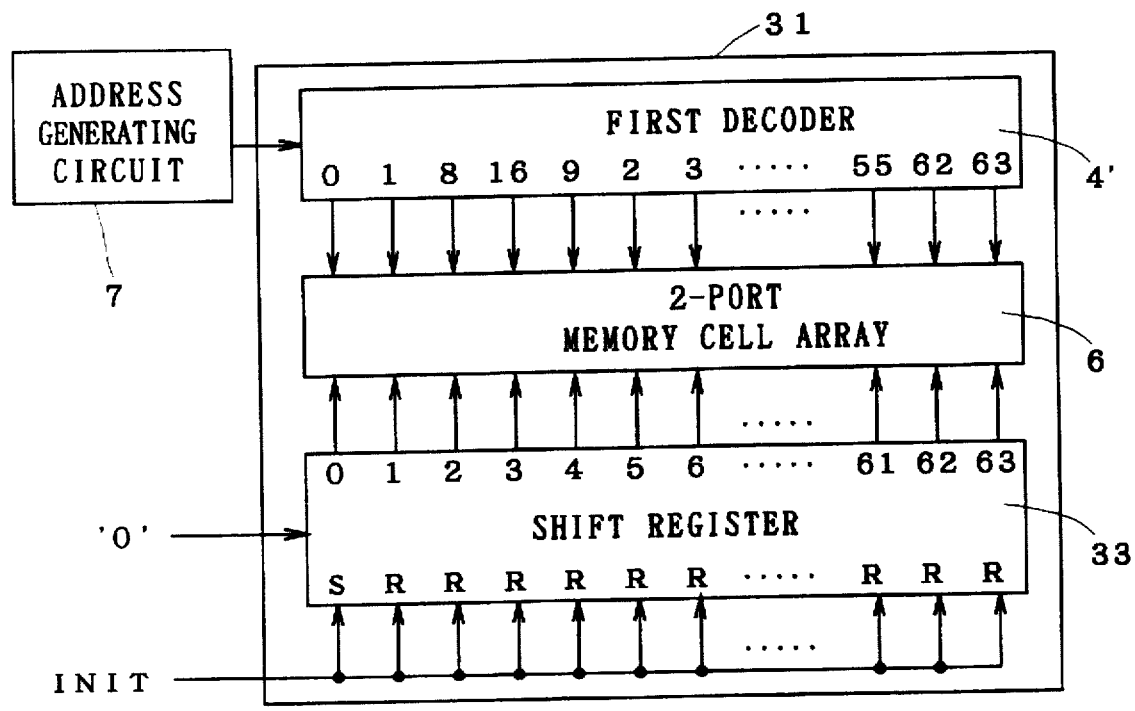

(2) FIG. 1 and FIG. 7 show two-port memories as examples, but the range of application of this invention is not limited to two-port memories. It is possible to apply the ideas of FIG. 1 and FIG. 7 to RAMs with three or more ports. In such multi-port RAMs, the present invention can be applied considering particular two ports.

(3) The respective ideas of FIGS. 1(a) and (b), FIG. 2, FIG. 3, FIG. 4, FIG. 5, FIG. 6, FIG. 7 and FIG. 8 are capable of arbitrary combinations and it is possible to configure a multi-port memory having a plurality of operation modes (access orders).

Figure 9:
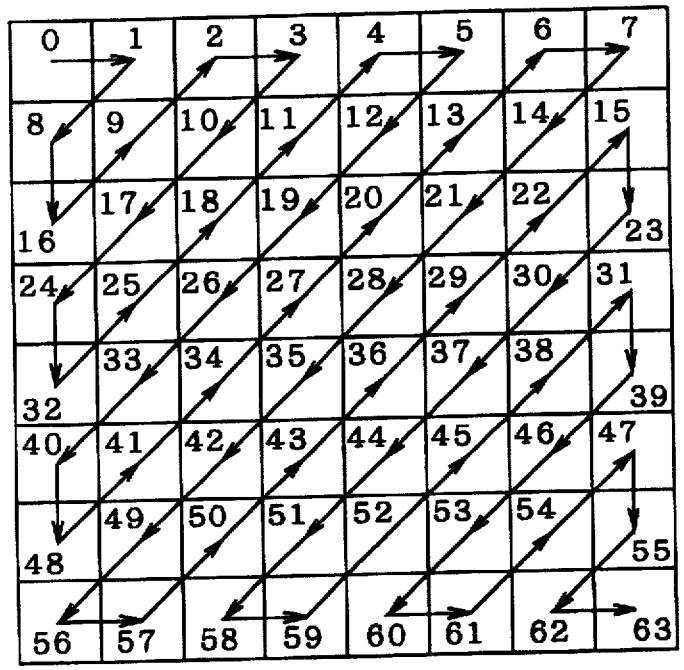
FIG. 9(a) and FIG. 9(b) are diagrams showing the access order in the zig-zag scan.

(4) The address generating circuit connected to the memory device of this invention may be a binary counter, or it may be a counter circuit using such a linear feedback shift register (LFSR) as shown in FIG. 9 of Japanese Patent Publication No. 63-204325.

(5) The two decoders shown in FIGS. 1(a) and 1(b), FIG. 2, FIG. 3 and FIG. 4 may share predecoders. This reduces circuit scale.

(6) The counting-up operation by the counter circuit may be replaced by counting-down operation, in which case the first operation mode is the decrement mode.

The shift registers 32, 33, 35 shown in the seventh and eighth preferred embodiments are generically called "first operation mode access portion".

(Ninth Preferred Embodiment)

A semiconductor storage circuit device according to a ninth preferred embodiment relates to an improvement of the semiconductor storage circuit device according to the first preferred embodiment, which allows the realization of a test function for the memory cell array as well as the functions obtained in the first preferred embodiment.

Now, for convenience, the case will be described where the RAM 3 having the structure of FIG. 1(a) is improved and the first and second operation modes correspond respectively to the increment and the zig-zag scan. It is a matter of course that the technical idea of the ninth preferred embodiment is also applicable to the RAM 3' of FIG. 1(b), and also applicable to the cases where the first operation mode is the decrement, the first operation mode is the alternate scan, and so on.

Figure 11:
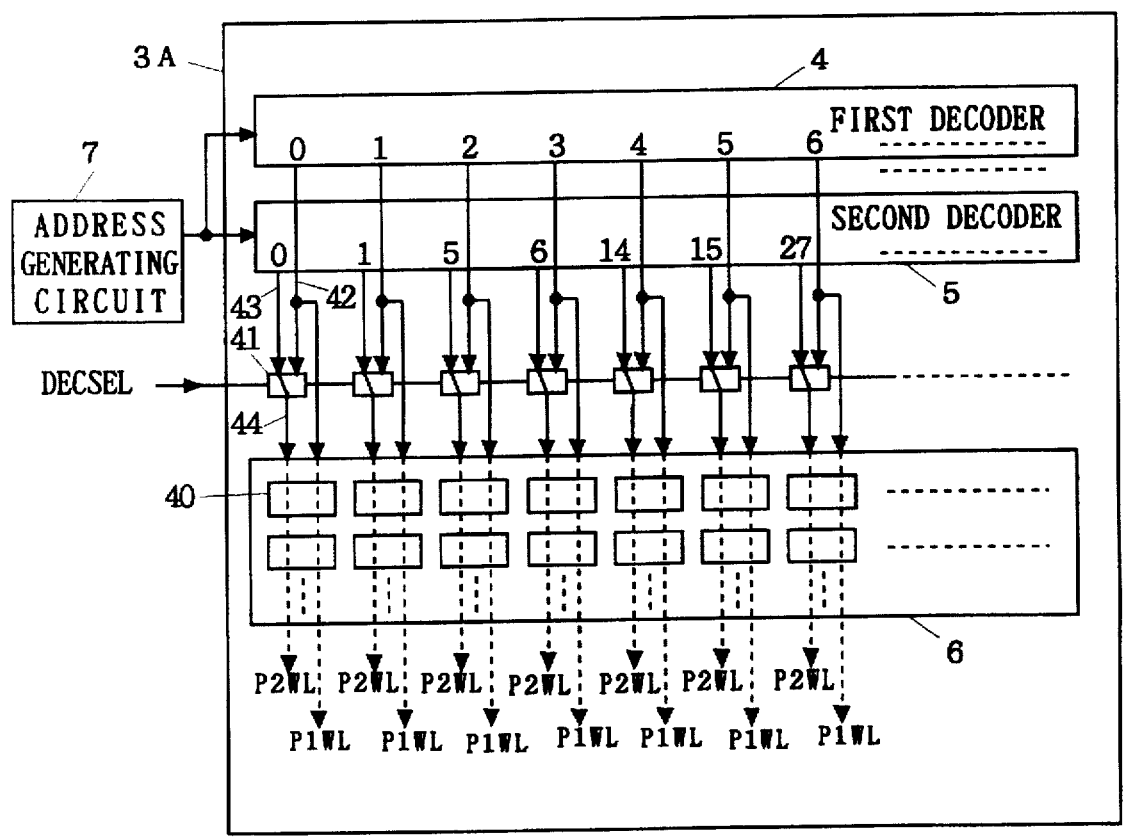
FIG. 11 is a block diagram showing an example of a semiconductor storage circuit device according to a ninth preferred embodiment of the present invention.

FIG. 11 is a diagram showing the circuit configuration of the address generating circuit 7 and the two-port RAM 3A. In this figure, the same reference characters as those in FIG. 1(a) indicate the same parts.

The address generating circuit 7 supplies addresses for a single operation mode (here, increment) to the RAM 3A. (It is the same in other preferred embodiments.) Most simply, the circuit 7 can be configured using one counter circuit, but outputs of a plurality of counter circuits having different operation modes (decrement and increment, for example) may be selected by a switch circuit and supplied to the RAM 3A.

Figure 12:
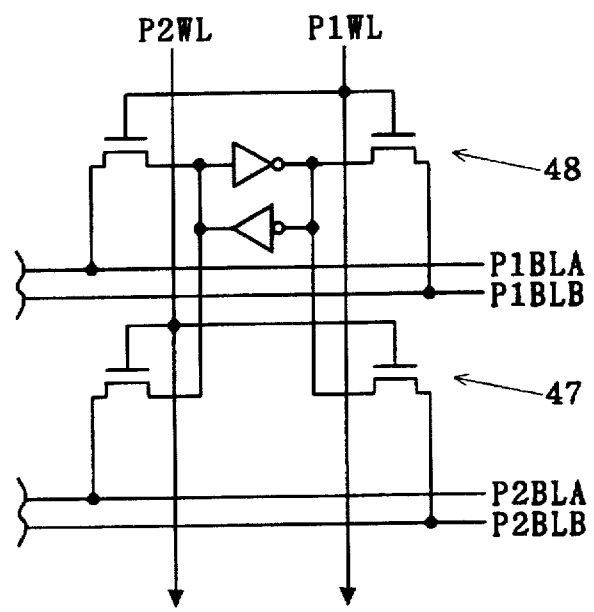
FIG. 12 is a diagram showing an example of the circuit structure of the memory cell in the semiconductor storage circuit device according to the ninth preferred embodiment of the present invention.
Figure 13:
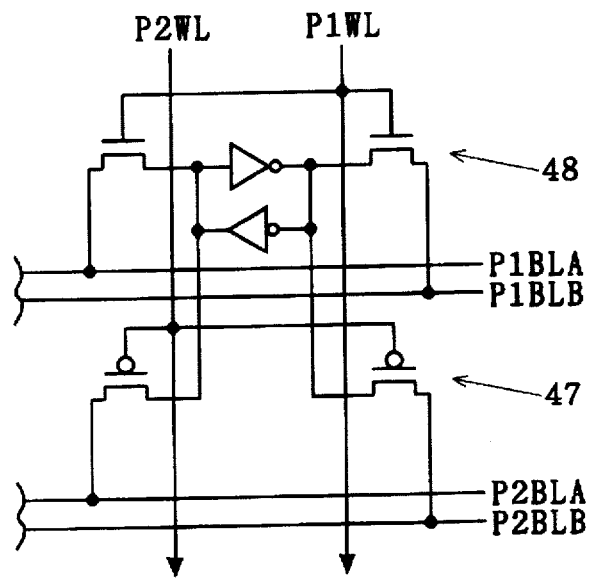
FIG. 13 is a diagram showing an example of the circuit structure of the memory cell in the semiconductor storage circuit device according to the ninth preferred embodiment of the present invention.

The reference character 40 denotes a two-port memory cell. An example of specific circuit structure of each memory cell 40 is shown in FIG. 12 or FIG. 13.

Improvements or features in this ninth preferred embodiment lie in addition of selector circuits 41 controlled by a decoder select signal DECSEL. It is the same in structure as that of the first preferred embodiment in other respects. Each selector circuit 41 receives corresponding first decoder output line 42 and second decoder output line 43 as inputs. The output line 44 of each selector circuit 41 becomes the second port word line P2WL of each memory cell 40 in a corresponding column and the first decoder output line 42 becomes the first port word line P1WL of that memory cell 40.

(1) When the second decoder output lines 43 are selected under control by the decoder select signal DECSEL, the RAM 3A performs the same operation as the RAM 3 of FIG. 1(a). Now, this state is called "address order conversion mode".

(2) On the other hand, when each selector 41 is controlled so that the first decoder output lines 42 are selected by the decoder select signal DECSEL, address signals on the first decoder output lines 42 are transmitted onto the word lines P1WL and P2WL of the two ports and the respective first and second ports of memory cells 40 are accessed from corresponding outputs of the first decoder 4. In this state, the two-port RAM 3A operates like a single-port RAM. Hereinafter, this state is referred to as "single-port RAM mode".

The fact that this RAM 3A can also realize the single-port RAM mode in this way is especially effective to a RAM test in the case where one port of a two-port memory cell array is set as a write-only port and the other port is set as a read-only port. (Needless to say, this RAM 3A is effective in other cases, too.)

That is to say, a write address and a read address differ with respect to each memory cell 40 in the address order conversion mode. Accordingly, the RAM test algorithm of regularly testing memory cells while incrementing or decrementing (the march test, for example), which is used in usual production test, can not be applied to the two-port RAMs 3 of FIG. 1(a) and FIG. 1(b), which can implement only the address order conversion mode. On the other hand, in the single-port RAM mode in this RAM 3A, the write address and the read address are the same with respect to each memory cell. Accordingly, the regular RAM test algorithm can easily be applied to this RAM 3A.

Since a P channel transistor is used for the transfer gate 47 of the second port of FIG. 13, the second port word line P2WL has Low enable logic. On the other hand, an N channel transistor is used for the transfer gate 48 of the first port, so that the first port word line P1WL has High enable logic. Hence, when using the memory cell of FIG. 13, peripheral circuits must be designed considering these respects.

(Tenth Preferred Embodiment)

A tenth preferred embodiment relates to an improvement on the ninth preferred embodiment, which enables reverse mode operation in the ordinary system operation in addition to the realization of the above-described regular RAM test function. That is to say, in addition to the function of accessing the first and second ports of each two-port memory cell in the first and second operation modes, it enables access in the above-described second and first operation modes reversely.

Figure 14:
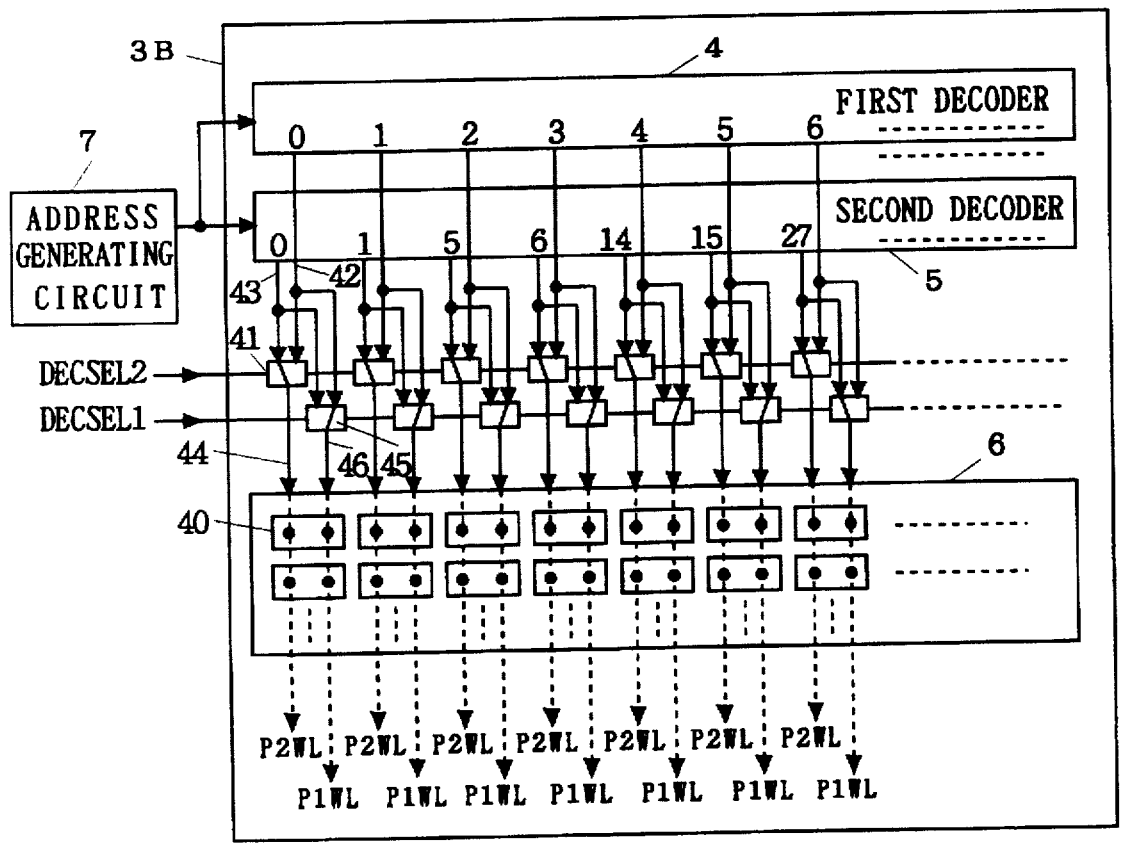
FIG. 14 is a block diagram showing an example of a semiconductor storage circuit device according to a tenth preferred embodiment of the present invention.

FIG. 14 shows the structure of a two-port RAM 3B as an example of a semiconductor storage circuit device according to the tenth preferred embodiment, which shows an example in which the increment is used as the first operation mode and the zig-zag scan as the second operation mode.

Figure 15:
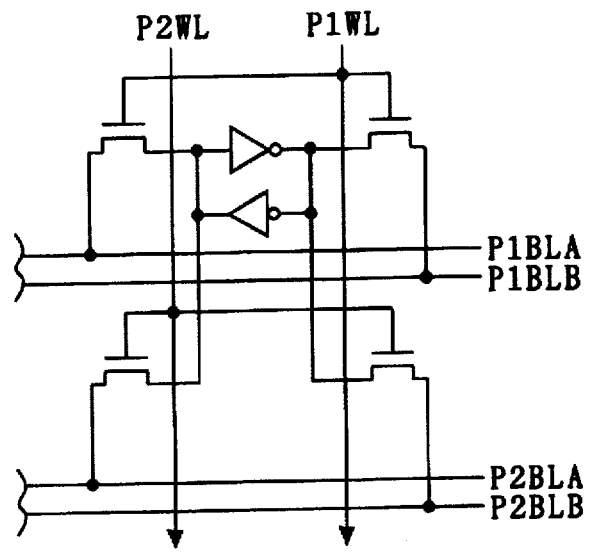
FIG. 15 is a diagram showing an example of the circuit structure of the memory cell in the semiconductor storage circuit device according to the tenth preferred embodiment of the present invention.
Figure 16:
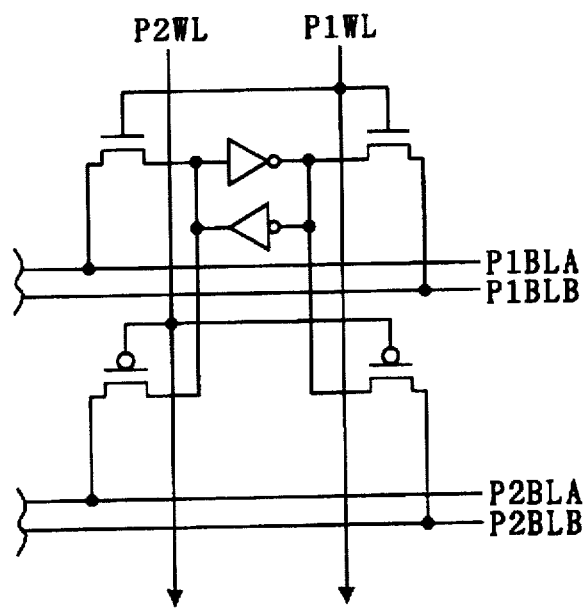
FIG. 16 is a diagram showing an example of the circuit structure of the memory cell in the semiconductor storage circuit device according to the tenth preferred embodiment of the present invention.

FIG. 15 and FIG. 16 are diagrams showing an example of circuit configuration of each two-port memory cell 40 used in FIG. 14.

The two-port RAM 3B of FIG. 14 is different from the two-port RAM 3A of FIG. 11 in that a selector circuit 45 is provided for each first port of each two-port memory cell 40. Each selector circuit 45 receives corresponding output lines 42 and 43 of the first and second decoders 4 and 5 as input signal lines and its output signal line 46 becomes the first port word line P1WL of the corresponding two-port memory cell 40. Each selector circuit 45 (first selector circuit) is controlled by the first decoder select signal DECSEL1. Each selector circuit 41 corresponding to the second selector circuit is controlled by the second decoder select signal DECSEL2. The first decoder select signal DECSEL1 selects a decoder (the first decoder 4 or the second decoder 5) corresponding to the first port word line P1WL of each two-port memory cell 40 and the second decoder select signal DECSEL2 selects a decoder (the first decoder 4 or the second decoder 5) corresponding to the second port word line P2WL of each two-port memory cell 40.

It is the same in structure as that of FIG. 11 in other respects.

(1) First, each output line 42 of the first decoder 4 is selected under control by the first decoder select signal DECSEL1 and each output line 43 of the second decoder 5 is selected under control by the second decoder select signal DECSEL2 as first and second port word lines P1WL and P2WL, respectively. Thus, the same operation as that of the two-port RAM 3 of FIG. 1(a) is performed like in the ninth preferred embodiment. Hereinafter, this state is also referred to as "address order conversion mode".

(2) Next, each output line 42 of the first decoder 4 is selected under control by the first decoder select signal DECSEL1 and each output line 42 of the first decoder is selected under control by the second decoder select signal DECSEL2 as first and second two-port word lines, respectively. Thus, the two ports (P1WL, P2WL) of each two-port memory cell 40 are both accessed by the address signal on a corresponding output line 42 of the first decoder 4. In this state, this two-port RAM 3B also operates like a single-port RAM, similarly to the two-port RAM 3A. Accordingly, here, this state is also called "first single-port RAM mode."

(3) If each output line 43 of the second decoder 5 is selected under control by the first decoder select signal DECSEL1 and each output line 43 of the second decoder 5 is selected under control by the second decoder select signal DECSEL2 as the output lines 46 and 44, respectively, then the two ports of each memory cell 40 (P1WL, P2WL) are both accessed by the second decoder 5, accordingly, in the second operation mode. In this state, the two-port RAM 3B also operates like a single-port RAM. Hence, this state is referred to as "second single-port RAM mode".

As described above, the RAM 3B realizes the first and second single-port RAM modes according to the above control of (2) and (3). Such operation is especially effective in the regular RAM test as in the case where one port of each memory cell of a two-port RAM is set as a write-only port and the other port is set as a read-only port.

That is to say, in the address order conversion mode, the write address and the read address differ with respect to each memory cell. Accordingly, it is not possible to apply the regular RAM test algorithm (march test, etc) used in ordinary production test. In both the first and second single-port RAM modes, however, the write address and the read address are the same with respect to each two-port memory cell. They differ only in that the two addresses are determined in the first operation mode or in the second operation mode. Therefore, the regular RAM test algorithm (march test, etc) is also applicable to this RAM 3B.

(4) Next, each output line 43 of the second decoder 5 is selected under control by the first decoder select signal DECSEL1 and each output line 42 of the first decoder 4 is selected under control by the second decoder select signal DECSEL2 as the output lines 46 and 44, respectively. Then the first and second ports (P1WL, P2WL) of each memory cell 40 are accessed by corresponding outputs of the second and first decoders 5 and 4, which realizes a state in reverse relation to the address order conversion mode. Here, this state is called "address order reverse conversion mode".

This address order reverse conversion mode is especially effective in the RAM test where one port of the two-port RAM 3B is a write-only port and the other port is a read-only port. This is because both of the functions, [1] the function of writing data in the order of the increment mode and reading data in the order of the zig-zag scan and [2] the function of writing data in the order of the zig-zag scan and reading the data in the order of the increment mode, can be realized with a single RAM 3B. For example, when the first and second port word lines P1WL and P2WL are write-only and read-only, respectively, the function [1] can be realized with the control (1) and the function [2] can be realized with the control (4). Conversely, if the first and second port word lines P1WL and P2WL are read-only and write-only, respectively, the functions [1] and [2] can be realized with the control (4) and (1), respectively.

(Eleventh Preferred Embodiment)

An eleventh preferred embodiment relates to an improvement of the ninth preferred embodiment, which specifically proposes structure where two ports of each memory cell are dedicated ports.

Figure 17:
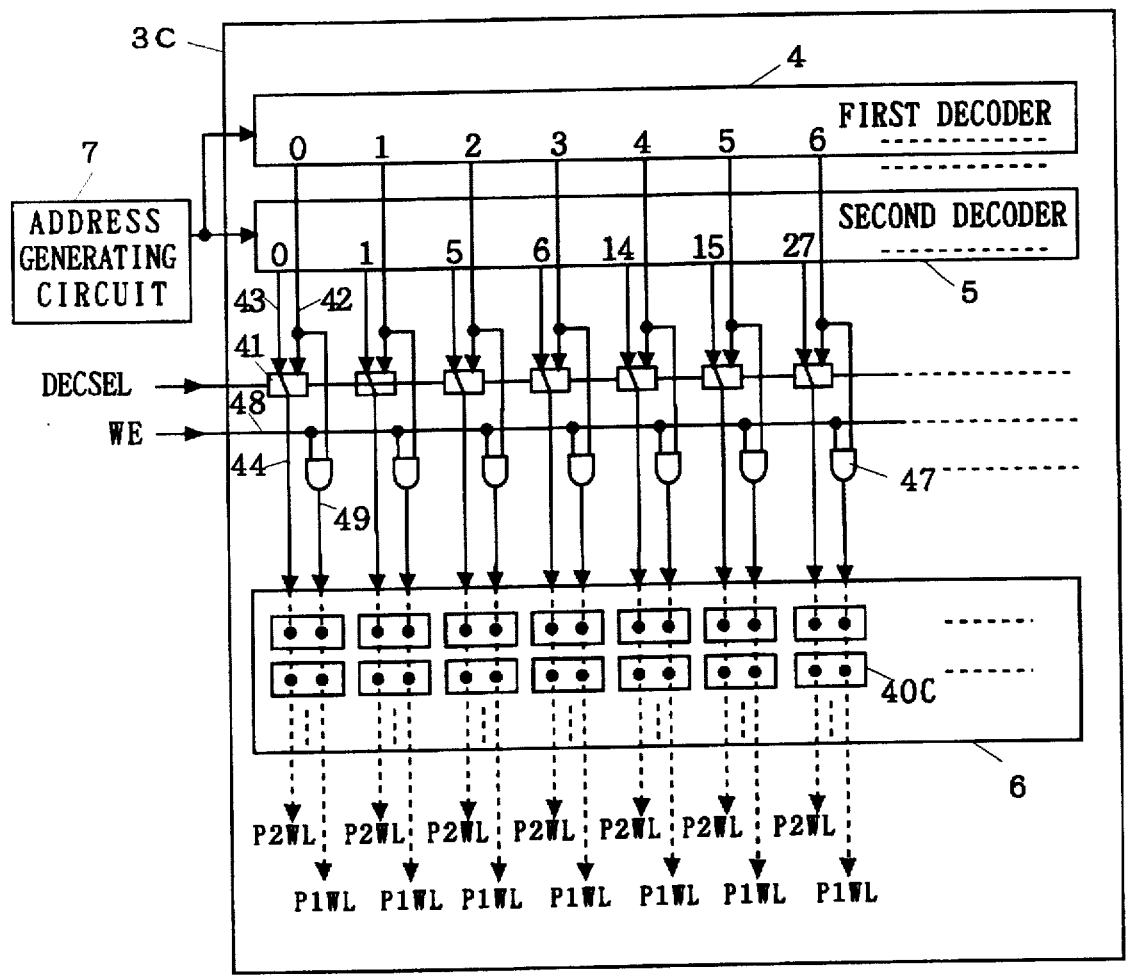
FIG. 17 is a block diagram showing an example of a semiconductor storage circuit device according to an eleventh preferred embodiment of the present invention.

FIG. 17 is a diagram showing the circuit configuration of a two-port RAM 3C which is an example of the semiconductor storage circuit device of the eleventh preferred embodiment, which relates to an improvement on the two-port RAM 3 of FIG. 11. Therefore, the increment and the zig-zag scan also correspond to the first and second operation modes here.

Figure 18:
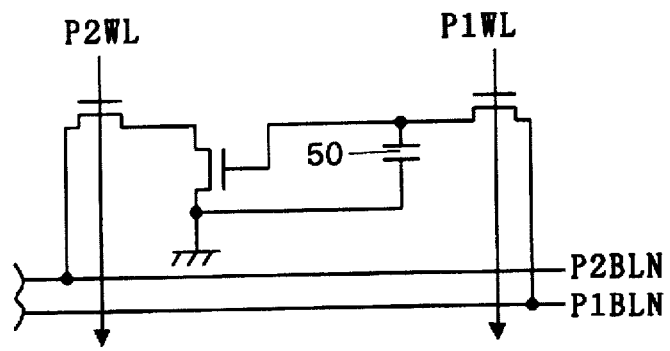
FIG. 18 is a diagram showing an example of the circuit structure of the memory cell in the semiconductor storage circuit device according to the eleventh preferred embodiment of the present invention.
Figure 19:
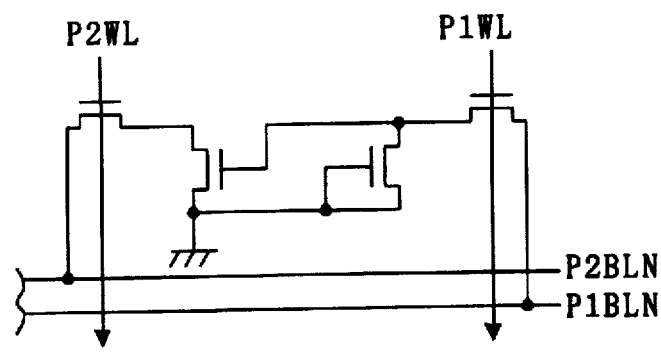
FIG. 19 is a diagram showing an example of the circuit structure of the memory cell in the semiconductor storage circuit device according to the eleventh preferred embodiment of the present invention.

FIG. 18 and FIG. 19 are diagrams showing an example of specific circuit configuration of each two-port memory cell 40C used in FIG. 17. As shown in the two figures, since a dynamic memory is used for configuration of each memory cell 40, the first port word line P1WL and the first port bit line P1BLN are write-only and the second port word line P2WL and the second port bit line P2BLN are read-only. Hereinafter, the first and second port word lines P1WL, P2WL are respectively referred to as a write word line and a read word line and the first and second port bit lines P1BLN and P2BLN are referred to as a write-only bit line and a read-only bit line, respectively. The circuit of FIG. 19 uses an OFF-state transistor instead of the capacitance 50 of FIG. 18, which are functionally the same. It is a matter of course that it is also possible to apply other memory cells, e.g., the circuit shown in FIG. 12 or FIG. 13 to the memory cell 40C of FIG. 17.

As described above, since the first and second ports of each memory cell 40C are write-only and mad-only, respectively, a write enable signal line 48 and AND circuits 47 receiving that the signal line 48 and corresponding output lines 42 of the first decoder 4 as input lines are added to the RAM 3A of FIG. 11. In other respects, it is the same as the RAM 3A.

Each AND circuit 47 is supplied with a write enable signal WE. When this write enable signal WE is applied, the corresponding output line 42 of the first decoder 4 puts the write word line P1WL of each memory cell 40C in an active state. Thus, data is written into the storage node or capacitance 50 of each memory cell 40C from the write-only bit line P1BLN.

Operations other than the above writing operation are the same as the operations of the RAM 3A of FIG. 11, therefore description thereof is not repeated.

As described above, the RAM 3C provides the effect of realizing the same functions as those of the RAM 3A of the ninth preferred embodiment when both ports of each memory cell are set as dedicated ports. Particularly, the structure of this RAM 3C is advantageous in that it is suitable for configuration on a gate array because one of dynamic type as shown in FIG. 18 and FIG. 19 can be utilized for each memory cell.

(Twelfth Preferred Embodiment)

A twelfth preferred embodiment relates to an improvement of the tenth preferred embodiment, and specifically, which is applicable to the case where two ports of each memory cell 40 of FIG. 14 are dedicated.

Figure 20:
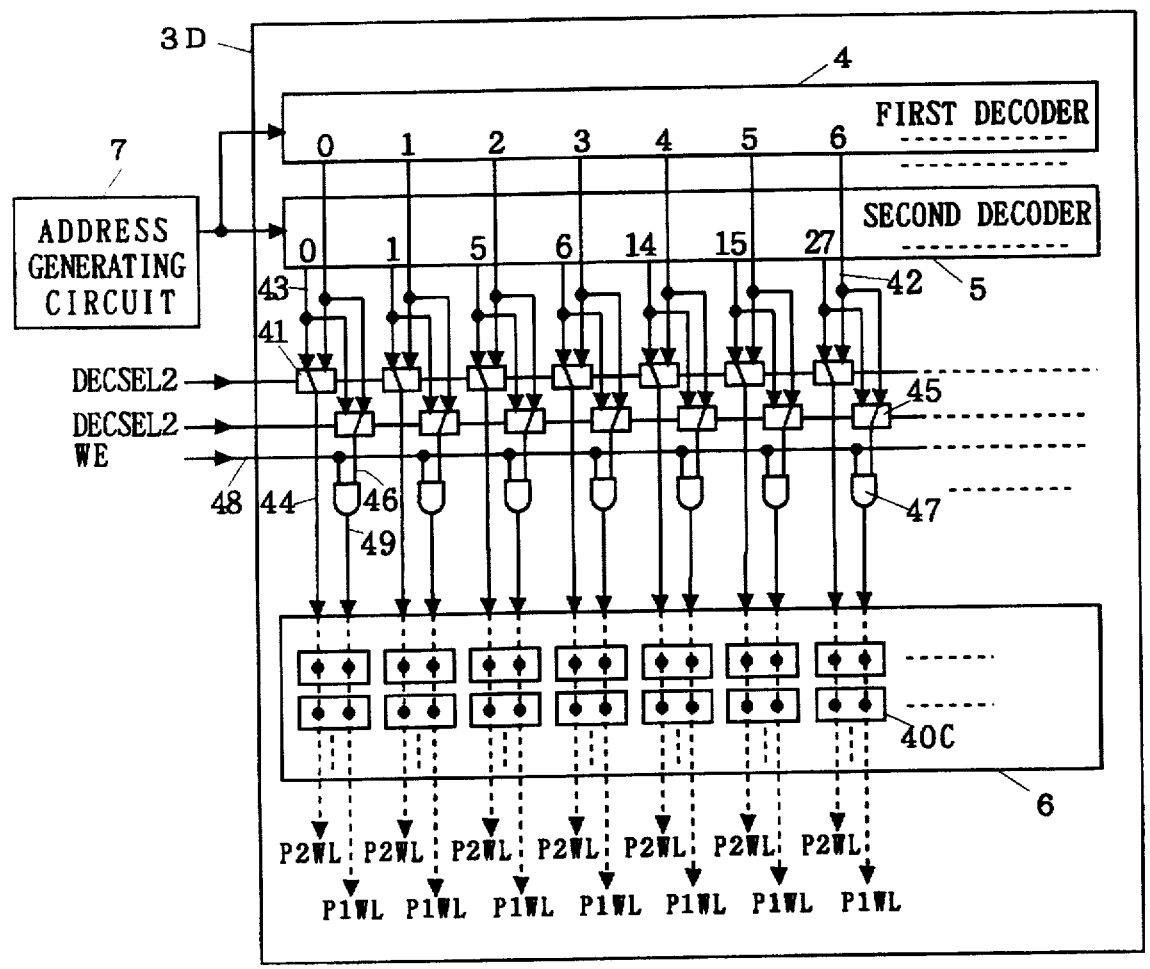
FIG. 20 is a block diagram showing an example of a semiconductor storage circuit device according to a twelfth preferred embodiment of the present invention.

FIG. 20 shows the structure of a two-port RAM 3D which is an example of a semiconductor storage circuit device of the twelfth preferred embodiment, in which each AND circuit 47 of FIG. 17 is provided on the first port side of each memory cell 40 in the circuit of FIG. 14.

Figure 21:
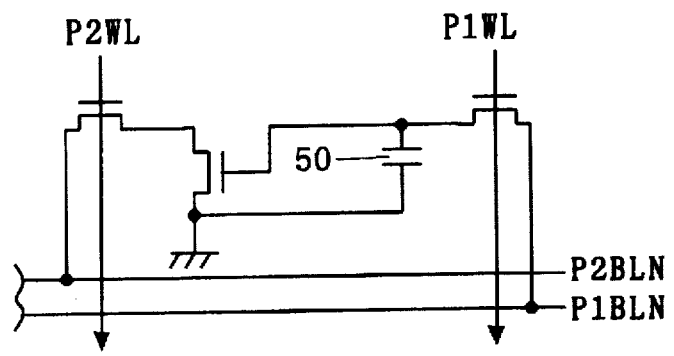
FIG. 21 is a diagram showing an example of the circuit structure of the memory cell in the semiconductor storage circuit device of the twelfth preferred embodiment of the present invention.
Figure 22:
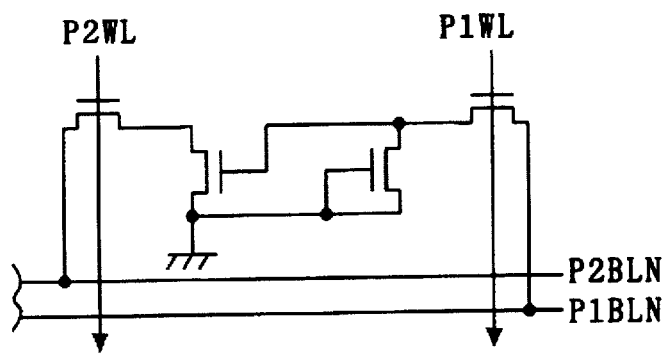
FIG. 22 is a diagram showing an example of the circuit structure of the memory cell in the semiconductor storage circuit device according to the twelfth preferred embodiment of the present invention.

FIG. 21 and FIG. 22 are diagrams showing an example of the circuit structure of each memory cell 40C used in FIG. 20, which are the same structures as those shown in FIG. 18 and FIG. 19, respectively. Accordingly, each memory cell 40C is a memory cell of the dynamic type, whose first and second ports are set as write-only and read-only, respectively. It is also possible to apply other memory cells, e.g., those shown in FIG. 15 and FIG. 16, as each memory cell 40C.

Here, each AND circuit 47 receives as inputs the write enable signal line 48 and the output line of the corresponding first selector circuit 45, and its output line 49 forms the first port word line (write word line) P1WL. Other structure portions are the same as those in FIG. 14.

Now, the RAM 3D of FIG. 20 will be described.

Each AND circuit 47 is supplied with the write enable signal WE. When the write enable signal WE is applied, the write word line P1WL of each corresponding memory cell 40C is placed in the active state by a corresponding output 42 of the first decoder 4 selected by the first selector circuit 45 in the address order conversion mode, and by the corresponding output 43 of the second decoder 5 selected by this circuit 45 in the address order reverse conversion mode. Then data is written into the storage node or the capacitance 50 of each memory cell 40C from the write-only bit line P1BLN. Operations of this RAM 3D other than writing operation are the same as those of the RAM 3B of FIG. 14, so that description thereof is not repeated here.

Thus, according to the twelfth preferred embodiment, the same effects as the tenth preferred embodiment can be provided when two ports of each memory cell are dedicated, and it also provides the effect of realizing circuit structure suitable for configuration on a gate array, similarly to the eleventh preferred embodiment.

(Thirteenth Preferred Embodiment)

A thirteenth preferred embodiment relates to an improvement of the above-described eleventh or twelfth preferred embodiment, which proposes circuit configuration for realizing them on a CMOS gate array. Herein, for convenience, an improvement on the twelfth preferred embodiment will be described. Needless to say, the same technical idea is also applicable to an improvement on the eleventh preferred embodiment.

Figure 23:
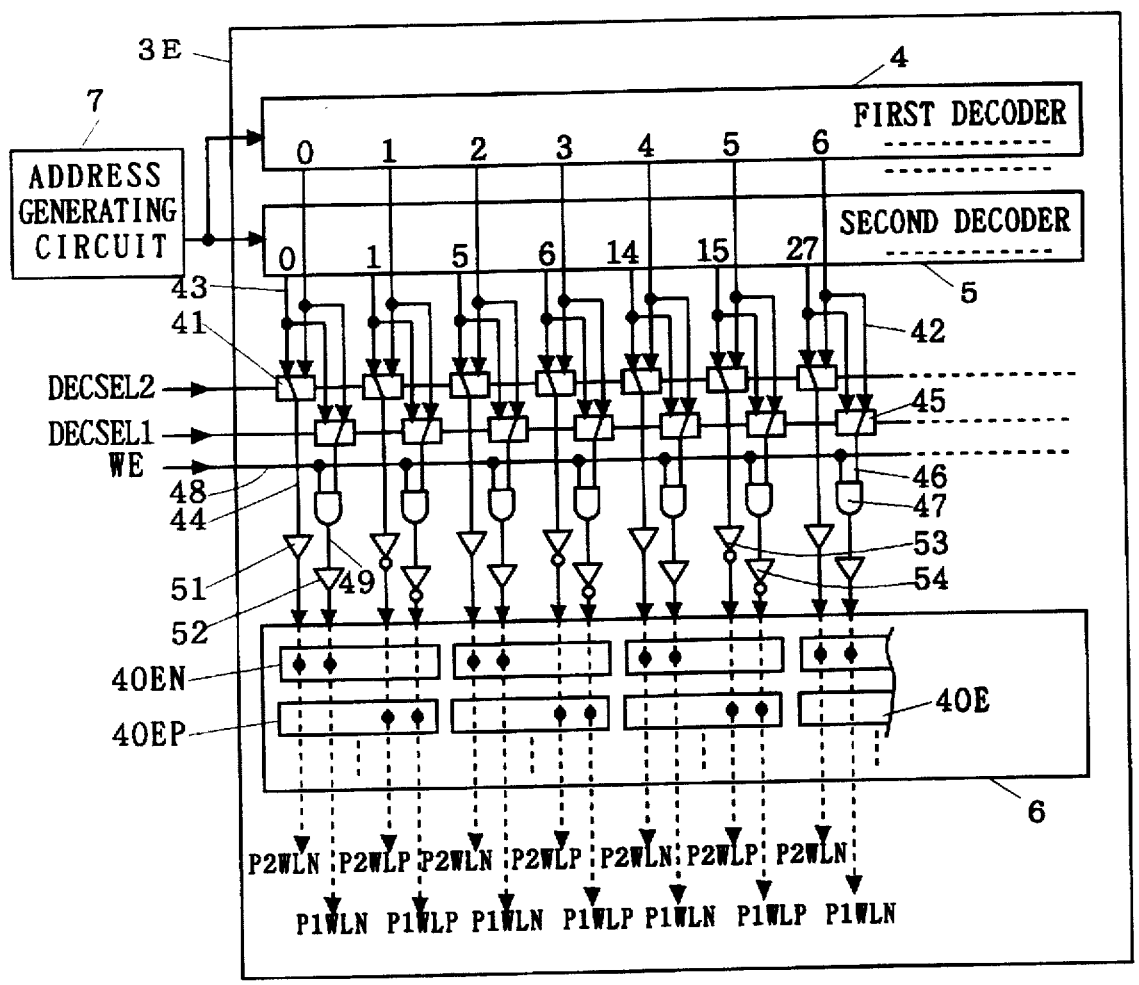
FIG. 23 is a block diagram showing an example of a semiconductor storage circuit device according to a thirteenth preferred embodiment of the present invention.

FIG. 23 is a diagram showing circuit structure of a two-port RAM 3E as an example of a semiconductor storage circuit device of the thirteenth preferred embodiment, where the RAM 3E corresponds to a further improvement of the circuit of the above RAM 3D. The two-port memory cells 40EN and 40EP oppositely provided sequentially in the column direction (the vertical direction in FIG. 23) are formed of N-channel and P-channel MOS transistors in two CMOS gate formation regions.

Figure 24:
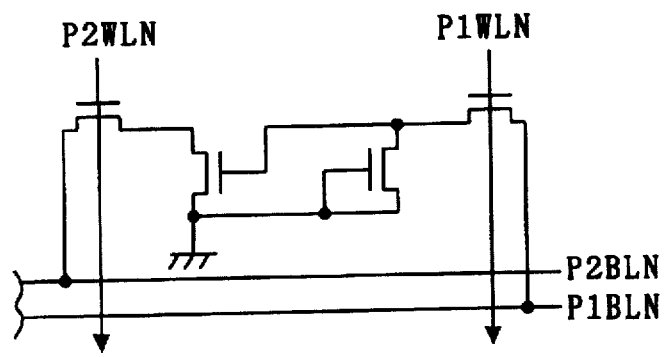
FIG. 24 is a diagram showing an example of the circuit structure of the memory cell formed of N-type transistors in the semiconductor storage circuit device according to the thirteenth preferred embodiment of the present invention.
Figure 25:
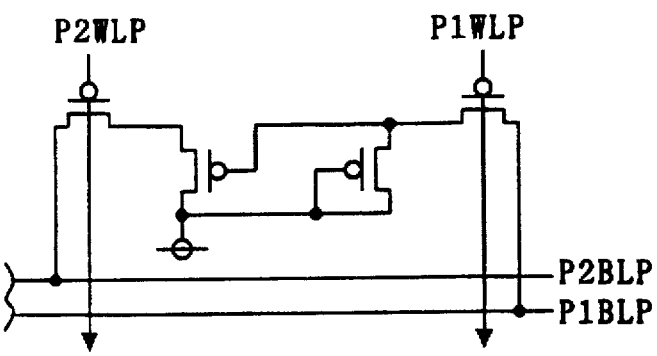
FIG. 25 is a diagram showing an example of the circuit structure of the memory cell formed of P-type transistors in the semiconductor storage circuit device according to the thirteenth preferred embodiment of the present invention.

FIG. 24 and FIG. 25 show examples of the circuits of the two-port memory cells 40EN (the first conductivity type memory cell) and 40EP (the second conductivity type memory cell) of FIG. 23, respectively. That is to say, FIG. 24 shows a dynamic type memory cell having a write-only port (the first port word line P1WLN, the first port bit line P1BLN) and a read-only port (the second port word line P2WLN, the second port bit line P2BLN) and formed of N-channel transistors. FIG. 25 shows a dynamic type memory cell having a write-only port (the first port word line P1WLP, the first port bit line P1BLP) and a read-only port (the second port word line P2WLP, the second port bit line P2BLP) and formed of P-channel transistors.

Now, the RAM 3E of FIG. 23 will be described.

As described above, the circuit of FIG. 23 shows simultaneous application of the two kinds of memory cell circuits shown in FIG. 24 and FIG. 25, for example, to the two-port memory cell array 6 of FIG. 20. Corresponding to the structure of such a memory cell array 6, the write-only port P1WLP and the read-only port P2WLP of each memory cell 40EP are set to the output line of an inversion type word line driver circuit 54 (WLDN) receiving the output line 49 of a corresponding AND circuit 47 as input and to the output line of an inversion type word line driver circuit 53 receiving the output line 44 of a corresponding second selector circuit 41 as input, respectively. The write-only port P1WLN and the read-only port P2WLN of each memory cell 40EN are set to the output line of a non-inversion type word line driver circuit 52 receiving the output line 49 of a corresponding AND circuit 47 as input and the output line of a non-inversion type word line driver circuit 51 receiving the output line 44 of a corresponding second selector circuit 41 as input, respectively. That is to say, the inversion type word line driver circuits WLDP (53, 54) are assigned to the dynamic type memory cells 40EP formed of P-channel transistors and the non-inversion type word line driver circuits WLDN (51, 52) are assigned to the dynamic type memory cells 40EN formed of N-channel transistors.

Such structure realizes with high density a semiconductor storage circuit device having the same function as that of the RAM 3D of FIG. 20 on a CMOS gate array.

Operations of the RAM 3E are the same as those of the RAM 3D of FIG. 20, so that description thereof is not repeated.

Arrangement of the P- and N-channel transistors forming each memory cell of the two-port memory cell array 6 is not limited to that shown in FIG. 23, and it is possible to first arrange P-channel structure memory cells (40EP) (first conductivity type memory cells) in the column direction and next arrange N-channel structure memory cells (40EN) (second conductivity type memory cells).

(Fourteenth Preferred Embodiment)

A fourteenth preferred embodiment relates to an improvement on the second preferred embodiment, which realizes the same functions as those of the fifth preferred embodiment with another structure. Here again, for convenience, a description will be made on a 1-port RAM in which the increment and the zig-zag scan are used as the first and second operation modes, respectively. The technical idea of the fourteenth preferred embodiment holds also about a particular one port in a multi-port RAM, similarly to those of the fifteenth to seventeenth preferred embodiments described later.

Figure 26:
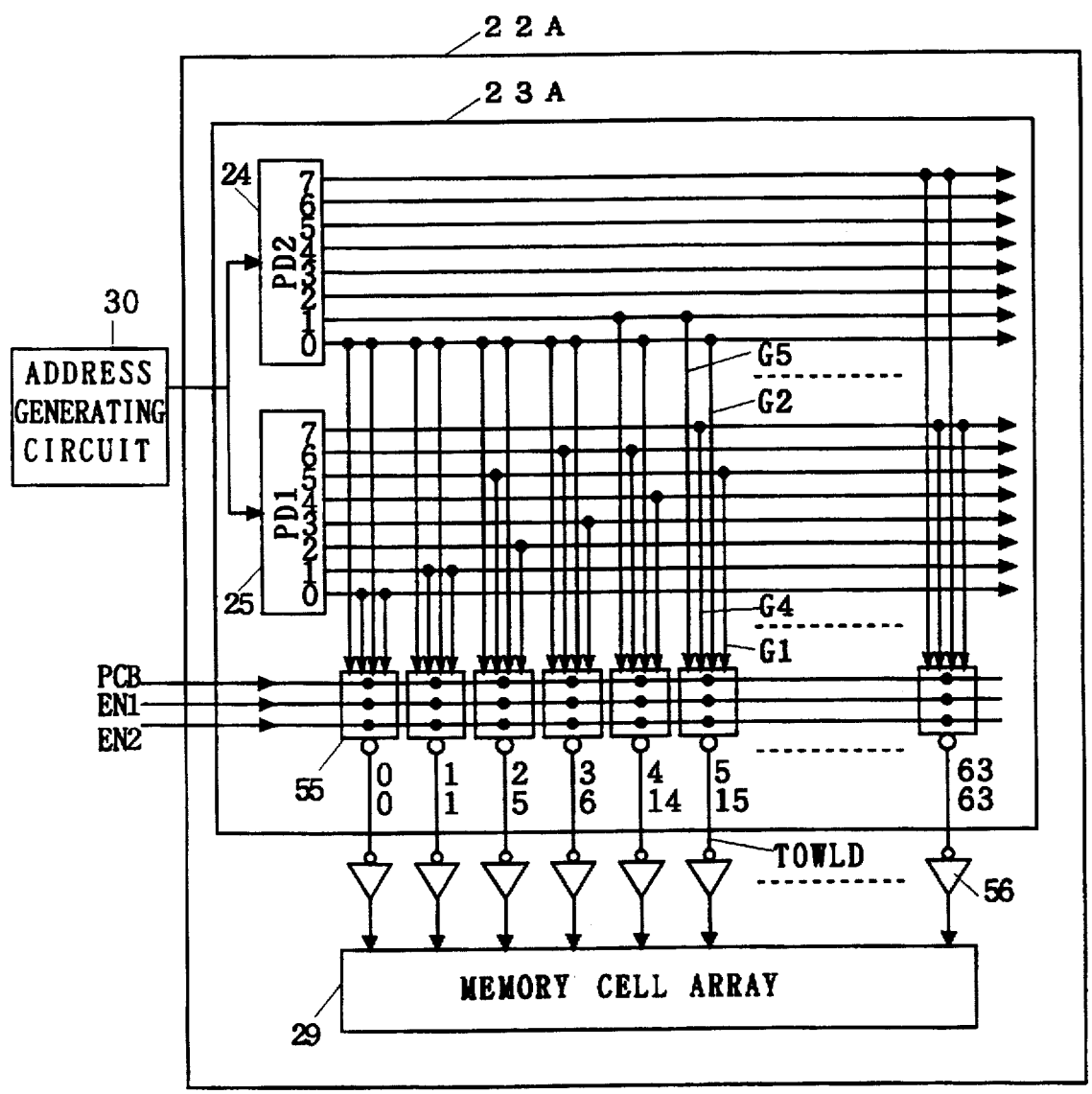
FIG. 26 is a block diagram showing an example of a semiconductor storage circuit device according to a fourteenth preferred embodiment of the present invention.

FIG. 26 shows the structure of a 1-port RAM 22A as an example of a semiconductor storage circuit device of the fourteenth preferred embodiment, where the RAM 22A is a circuit which realizes with one decoder 23A the functions equivalent to the functions realized by the first decoder 9, the second decoder 10 and the selectors 11 in the circuit of FIG. 2. In this respect, the RAM 22A corresponds to a circuit example with structure different from that of the RAM 22 of FIG. 5.

In FIG. 26, like reference characters in FIG. 5 denote like parts. In the RAM 22A, the first and second decoders 9 and 10 of FIG. 2 are implemented as one which shares the first and second predecoders 25 and 24.

Figure 27:
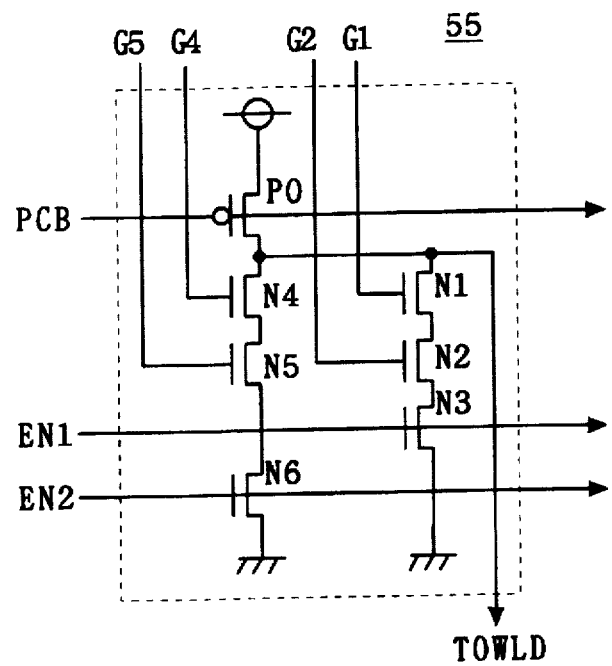
FIG. 27 is a diagram showing an example of the circuit structure of the decoder final stage in the semiconductor storage circuit device according to the fourteenth preferred embodiment of the present invention.

Each decoder final stage 55 receiving as inputs corresponding output lines of the first and second predecoders 25 and 24 is based on a dynamic CMOS type NAND circuit. FIG. 27 shows an example of the circuit configuration of each decoder final stage 55.

In FIG. 27, input lines or gate signal lines G1 and G2 of the N-type transistors N1 and N2 of the decoder final stage 55 are connected to corresponding output lines of the first and second predecoders 25 and 24 to realize the address order of the first decoder 9 of FIG. 2 (here, the increment mode) and input lines or gate signal lines G4 and G5 of the N-type transistors N4 and N5 of the decoder final stage 55 are connected to corresponding output lines of the first and second predecoders 25 and 24 to realize the address order of the second decoder 10 of FIG. 2 (the zig-zag scan, here). Gates of the transistors N3 and N6 are respectively connected to the first and second enable signal lines EN1, EN2 and the gate of the P-type transistor P0 is connected to the precharge signal line PCB.

First, operation of the RAM 22A when realizing the address order of the first decoder 9 of FIG. 2 will be described about an arbitrary one decoder final stage 55 of FIG. 26.

(1) In a state where the first enable signal EN1 and the second enable signal EN2 are both at a Low level, the precharge signal PCB is set to a Low level to place the transistor P0 in an ON state. This precharges the node TOWLD, which is an output line of the decoder final stage 55 connected to a corresponding word line driver circuit 56.

(2) Subsequently, the precharge signal PCB is set to a High level to place the transistor P0 into an OFF state.

(3) Next, only the first enable signal EN1 is set to a High level. This brings the transistor N3 into an ON state, and when corresponding gate lines G1 and G2 are accessed by the signals of corresponding output lines of the first and second predecoders 25 and 24, respectively, the node TOWLD of the corresponding particular decoder final state 55 is discharged to go to a Low level. That is to say, while the signal corresponding to the output value 0 of the second predecoder 24 is outputted for each counter value of the address generating circuit, the output value of the first predecoder 25 sequentially changes from one corresponding to 0 to one corresponding to 7, and next, the output of the second predecoder 24 changes to one corresponding to the output value 1, and while this output signal is outputted, the output signal of the first predecoder 25 sequentially changes from one corresponding to 0 to one corresponding to 7. By repeating such operation, respective input lines G1 and G2 to decoder final stages 55 are accessed sequentially in the rightward direction from the decoder final stage 55 located leftmost in FIG. 26, so that the access order of respective nodes TOWLD are 0, 1, 2, 3, 4, 5, . . . , 63 sequentially from the one on the leftmost position.

Next, operation of the RAM 22A to realize the address order of the second decoder 10 of FIG. 2 will be described.

(1) First, with the first and second enable signals EN1 and EN2 both being on the Low level, the precharge signal PCB is set to the Low level to place the transistor P0 of FIG. 27 into an ON state and the node TOWLD is precharged to the High level.

(2) Next, the precharge signal PCB is brought to the High level to turn the transistor P0 to an OFF state.

(3) Furthermore, only the second enable EN2 signal is set to the High level. Thus the transistor N6 turns on, and then, when the input lines G4 and G5 are accessed, the transistors N4 and N5 turn on and then the node TOWLD of the corresponding particular decoder final stage 55 is discharged. Thus, at respective input lines (G4, G5) of decoder final stages 55, output line signals corresponding to (0, 0), (1, 0), (5, 0), (6, 0), (6, 1(8)), (7, 1(8)), . . . , (7, 7(56)) are generated sequentially from the decoder final stage 55 on the leftmost position, and the respective nodes TOWLD of the decoder final stages are accessed in the order of 0, 1, 5, 6, 14, 15, . . . , 63.

In this way, two address orders can be implemented with a simple circuit configuration. Furthermore, as compared with the structure of the RAM 22 of FIG. 5, this RAM 22A has the advantage that the number of used transistors is reduced because it does not use the selectors 26 and 27. Also according to the fourteenth preferred embodiment, as compared with the second preferred embodiment, it achieves the functions the same as those of each decoder of the second preferred embodiment by sharing output interconnections of predecoders in one decoder, providing the effects of contributing to reduction of circuit scale or layout area of the RAM, leading to reduction of interconnection capacitance, reduction of power consumption and increase of operation speed.

(First Modified Example of the Fourteenth Preferred Embodiment)

When using the circuit shown in FIG. 27 for the decoder final stage 55 of FIG. 26, there is a problem that timing design is not easy. That is to say, if the Low level period of the precharge signal PCB and the High level period of the first or second enable signal EN1, EN2 overlap each other, a current flows in the path formed of the transistors P0, N1 to N3 or in the path formed of the transistors P0, N4 to N6, causing a problem that precharge is not made. It is necessary in order to avoid such a problem to provide a delay circuit, or the like, for timing adjustment so that such overlap may not occur.

However, if the circuit of the decoder final stage 55 is configured so that such overlap never take place, it eliminates the need for such timing design for adjustment stated above, which is advantageous.

Figure 28:
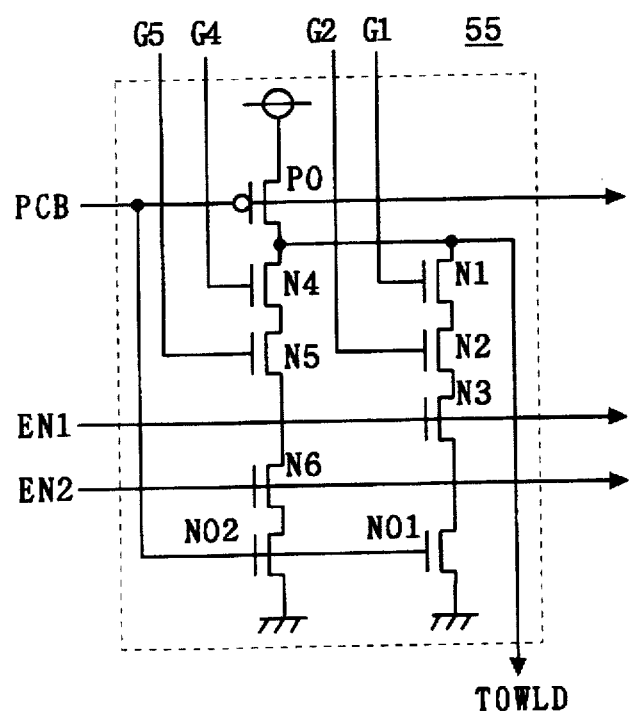
FIG. 28 is a diagram showing an example of the circuit structure of the decoder final stage in the semiconductor storage circuit device according to the fourteenth preferred embodiment of the present invention.

To satisfy such a demand, the circuit shown in FIG. 28 can be used as the decoder final stage 55 in place of the circuit of FIG. 27. That is to say, transistors NO1 and NO2 turned on by the precharge signal PCB at a High level are interposed between the transistor N3 and ground and between the transistor N6 and ground, respectively.

This produces the effect of easy timing design.

The circuit of FIG. 27 is more advantageous than the circuit of FIG. 28 in the number of transistors.

(Second Modified example of the Fourteenth Preferred Embodiment)

Figure 29:
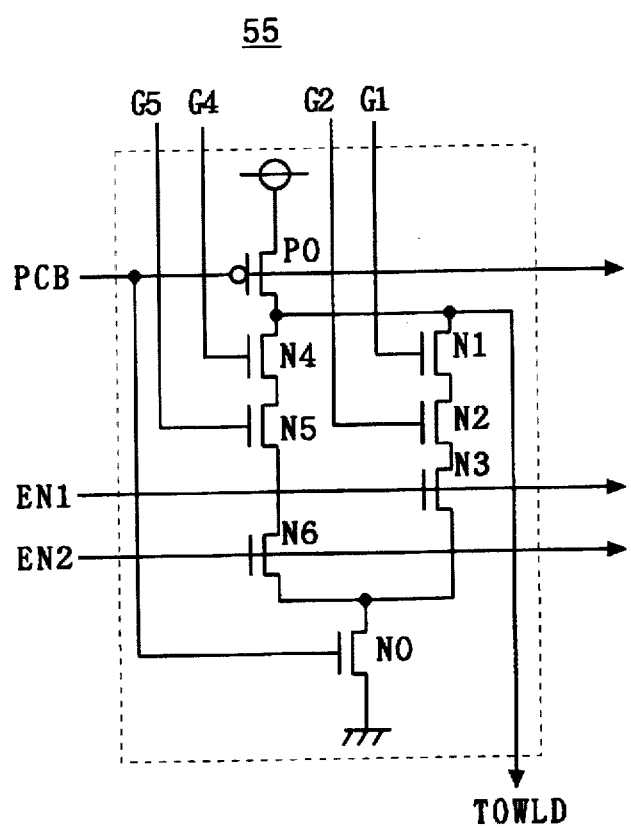
FIG. 29 is a diagram showing an example of the circuit structure of the decoder final stage in the semiconductor storage circuit device according to the fourteenth preferred embodiment of the present invention.

It is also possible to use the circuit shown in FIG. 29 for the decoder final stage 55 as a NAND circuit in place of the circuit of FIG. 28 to satisfy the demand for facilitating timing design and the demand for reducing the number of transistors. In this case, the transistor N0 having the same function as the transistors NO1, NO2 is shared, which can reduce the number of transistors by one as compared with FIG. 28.

As described above, the number of transistors can be reduced as compared with the circuit of FIG. 28 while satisfying facilitation of the timing design.

(Fifteenth Preferred Embodiment)

A fifteenth preferred embodiment shows an improvement of the fourteenth preferred embodiment in view of implementing the same effects as those of the third preferred embodiment, i.e., easily enabling access according to a plurality of different operation modes in correspondence with the number of applications.

Figure 30:
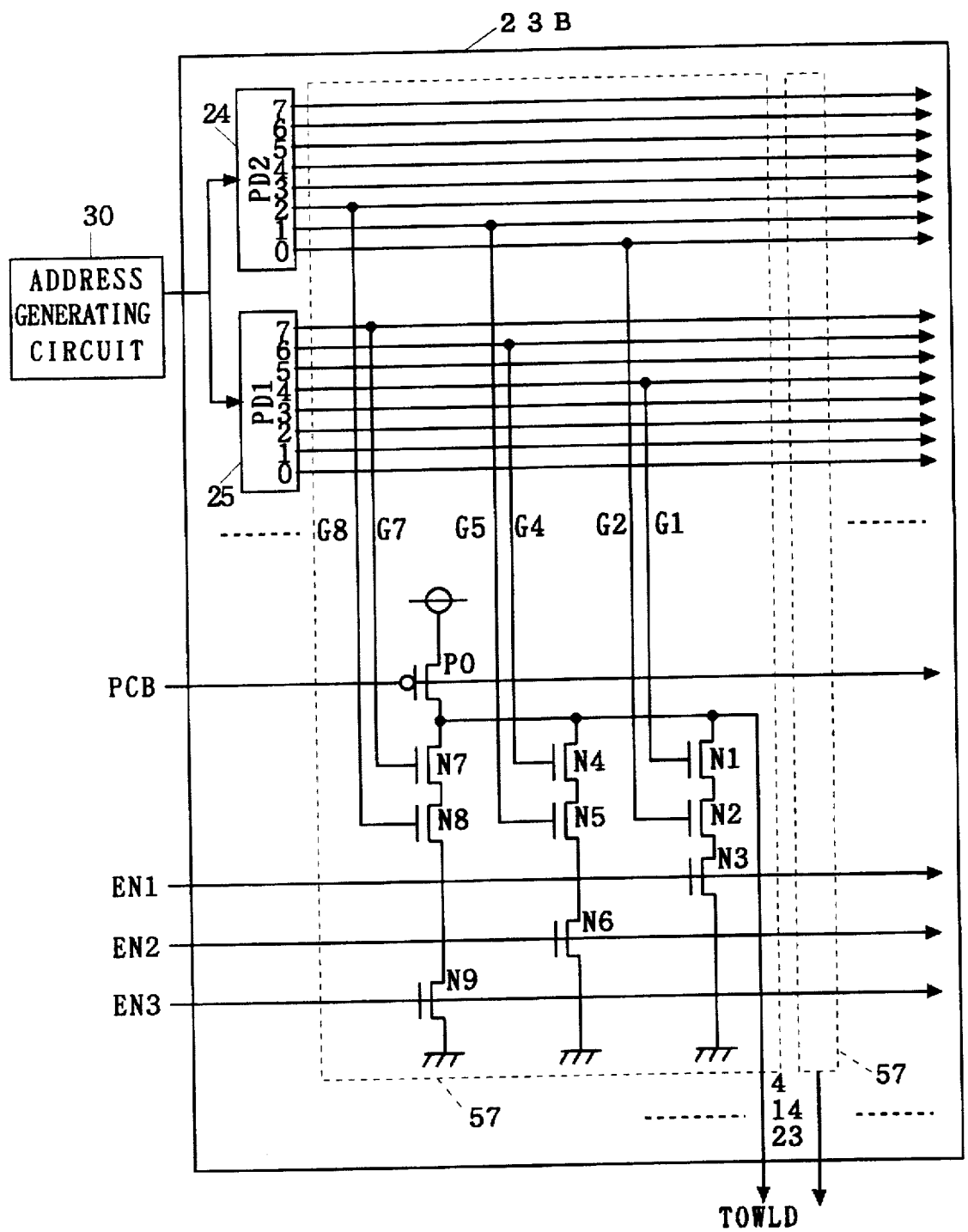
FIG. 30 is a block diagram showing an example of a decoder in a semiconductor storage circuit device according to a fifteenth preferred embodiment of the present invention.

FIG. 30 shows a single-port RAM 22B as an example of a semiconductor storage circuit device of the fifteenth preferred embodiment, centering on the structure of a decoder 23B. Here, for convenience, the RAM 22B has a structure for enabling access by three modes of address orders, e.g., the increment (first operation mode), the zig-zag scan (second operation mode) and the alternate scan (third operation mode), in which the circuit configuration of the RAM 22A of FIG. 26 is made extensible to realize the three operation modes. Hence, except the decoder 23B of FIG. 30, other configuration parts of this RAM 22B are the same as the corresponding parts in the RAM 22A of FIG. 26. The same reference characters in the decoder 23B as those in the decoder 23A also indicate the same parts.

For convenience, FIG. 30 shows as a decoder final stage 57 the structure of an improvement of the fifth one from the leftmost position in the decoder final stages 55 having the circuit structure of FIG. 27, and other decoder final stages 57 are the same.

Each decoder final stage 57 is additionally provided with transistors N7, N8 and N9. The input lines to the transistors N7 and N8 of each decoder final stage 57 are connected to corresponding output lines of the first and second predecoders 25 and 24 to realize the address order (here, the alternate scan) in the third decoder 17 of FIG. 3. The gate of the transistor N9 is connected to the third enable signal line receiving the third enable signal EN3 as input.

Operations of the RAM 22B for realizing respective address orders of the first and second decoders 15 and 16 of FIG. 3 are the same as those of the RAM 22A, so that description thereof is not repeated here. Operation of the RAM 22B for realizing the address order of the third decoder 17 of FIG. 3 will now be described.

(1) With the first enable signal EN1, the second enable signal EN2 and the third enable signal EN3 being all at a Low level, the precharge signal PCB is set to a Low level to bring the transistor P0 into an ON state. The output node TOWLD is thus precharged.

(2) The precharge signal PCB is raised to a High level.

(3) Only the third enable signal EN3 is raised to a High level. This causes the transistor N9 to turn on, and when the corresponding input lines G7 and G8 attain a High level with outputs on the corresponding output lines of the first and second predecoders 25 and 24, a current path formed of the transistors N7, N8 and N9 takes place, and the output node TOWLD of that particular decoder final stage 57 is discharged, to go to a Low level. In the case of the decoder final stage 57 shown in the figure, its output node TOWLD accesses a corresponding memory cell in the fourth place.

Thus, the RAM 22B can easily realize different, complicated three address orders, such as the increment, zig-zag scan, alternate scan, with one RAM, accordingly, with one decoder, while achieving reduction of circuit scale, reduction of interconnection capacitance, high speed operation and low power consumption as compared with the RAM 14 of the third preferred embodiment and while significantly reducing the number of transistors as compared with the RAM 22 of the fifth preferred embodiment.

It goes without saying that the RAM 22A can be extended so that it can similarly deal with four or more address orders.

Furthermore, the circuit structure shown in FIG. 28 or FIG. 29 may be used for the decoder final stage 57. This provides the effect of facilitation of timing design.

(Sixteenth Preferred Embodiment)

A sixteenth preferred embodiment relates to an improvement of the fourteenth preferred embodiment, which is intended to realize a semiconductor storage circuit device having the same functions with one decoder having at least three predecoders.

Figure 31:
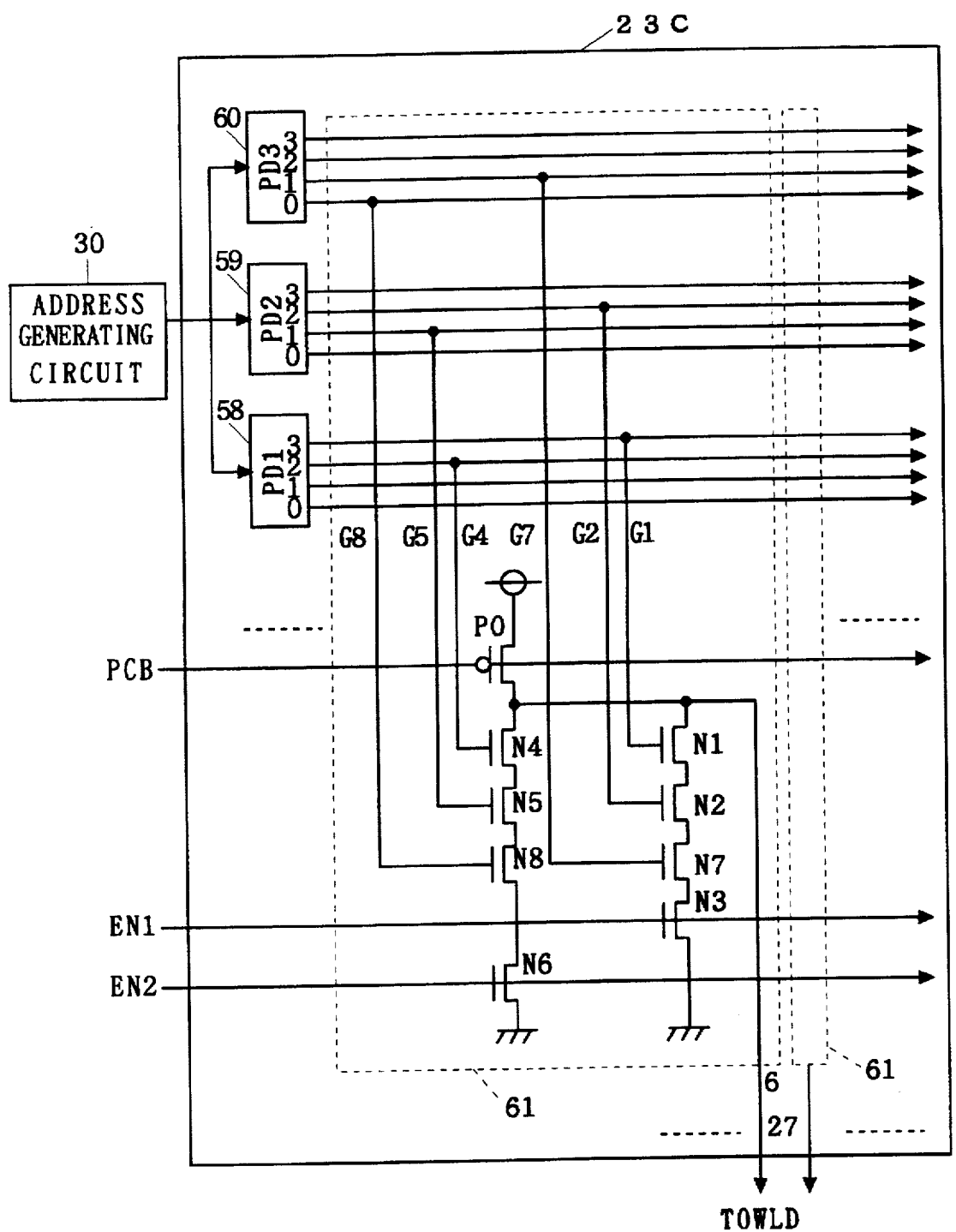
FIG. 31 is a block diagram showing an example of a decoder in a semiconductor storage circuit device according to a sixteenth preferred embodiment of the present invention.

FIG. 31 shows, as its example, a RAM 22C having its structure in which the idea of FIG. 26 is expanded to the case of three predecoders with 64 words. FIG. 31 is centered on the structure of the decoder 23C and other structures are the same as those of FIG. 26. One of the decoder final stages 61 in FIG. 31 corresponds to an improvement of the seventh one from the leftmost position in the decoder final stages 55 in FIG. 26. Here, the decoder final stage 61 utilizes the circuit shown in FIG. 27, but it is a matter of course that one shown in FIG. 28 or FIG. 29 can be applied to the decoder final stage 61 to facilitate timing design.

In the RAM 22C of FIG. 31, decoder final stages 61 share the first, second and third predecoders 58, 59 and 60 to realize the functions of the first and second decoders 9, 10 of FIG. 2.

As stated above, each decoder final stage 61 receiving corresponding output lines of the first to third predecoders 58, 59 and 60 as input lines is based on the CMOS type NAND circuit. That is to say, gates of the transistors N1, N2 and N7 of the decoder final stage 61 are connected to corresponding output lines of the first to third predecoders 58, 59 and 60 to realize the address order of the first decoder 9 of FIG. 2 (here, it is the increment) and gates of the transistors N4, N5 and N8 are connected to corresponding output lines of the first to third predecoders 58, 59 and 60 to realize the address order of the second decoder 10 of FIG. 2 (here, the zig-zag scan).

Functions and operations of the RAM 22C are the same as those of the RAM 22A of FIG. 25, so that description thereof is not repeated.

Similarly, it is of course possible to extend the structure of the RAM 22A to be applicable to four or more predecoders.

As described above, according to the sixteenth preferred embodiment, the same effects as those of the fourteenth preferred embodiment can be produced with the structure of one decoder having a plurality of (three or more) predecoders. The sixteenth preferred embodiment also has the advantage of reducing the total number of output lines of the predecoders as compared with the fourteenth preferred embodiment, as shown in FIG. 31. However, it additionally requires the transistors N7 and N8.

(Seventeenth Preferred Embodiment)

Figure 32:
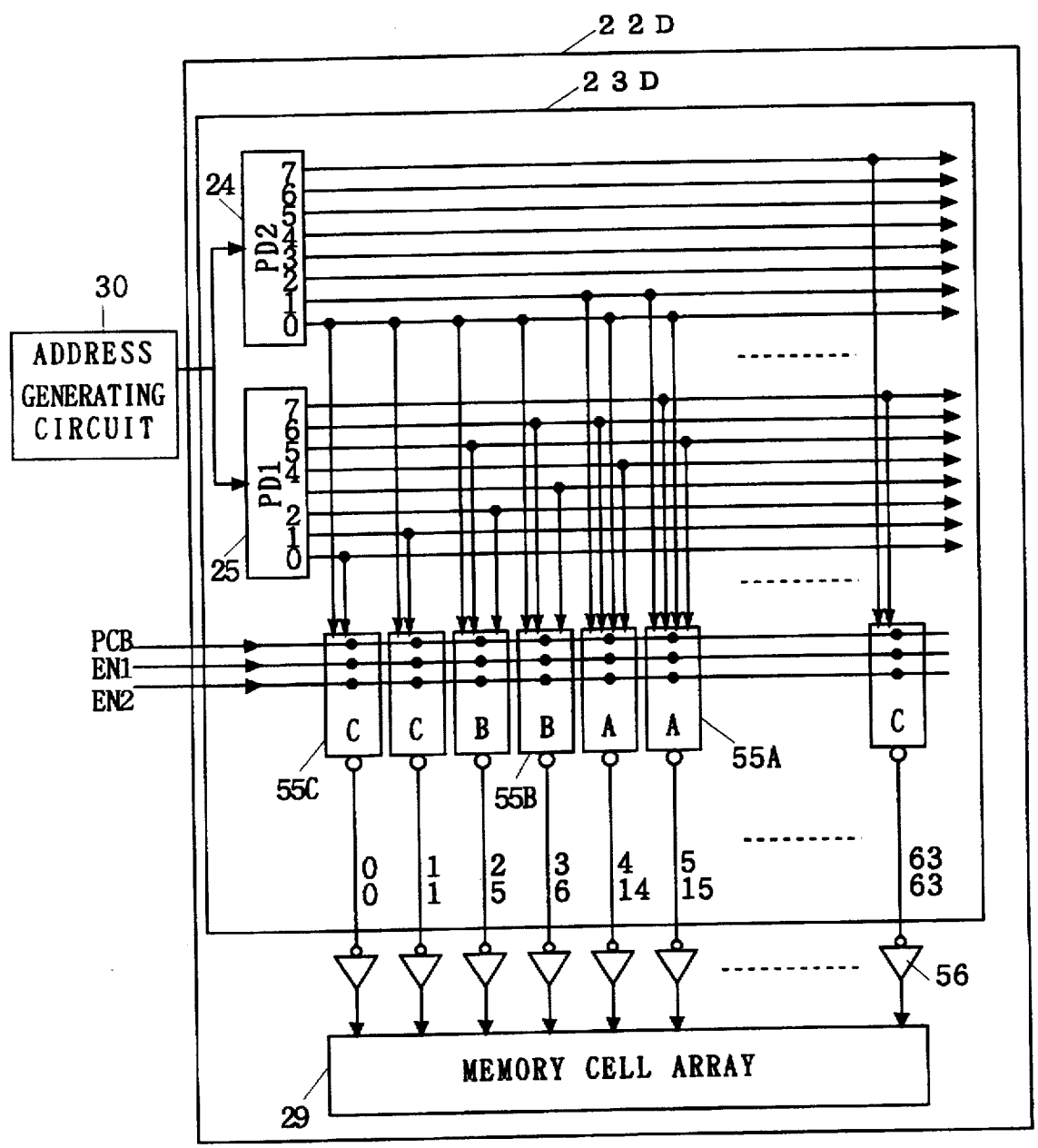
FIG. 32 is a block diagram showing an example of a semiconductor storage circuit device according to a seventeenth preferred embodiment of the present invention.

A seventeenth preferred embodiment mainly improves the fourteenth preferred embodiment in view of reduction of circuit scale. Here, FIG. 32 shows a RAM 22D having its structure corresponding to an improvement on the RAM 22A of FIG. 26 from that point of view. In the figure, the same reference characters as those in FIG. 26 denote the same parts.

Figure 33:
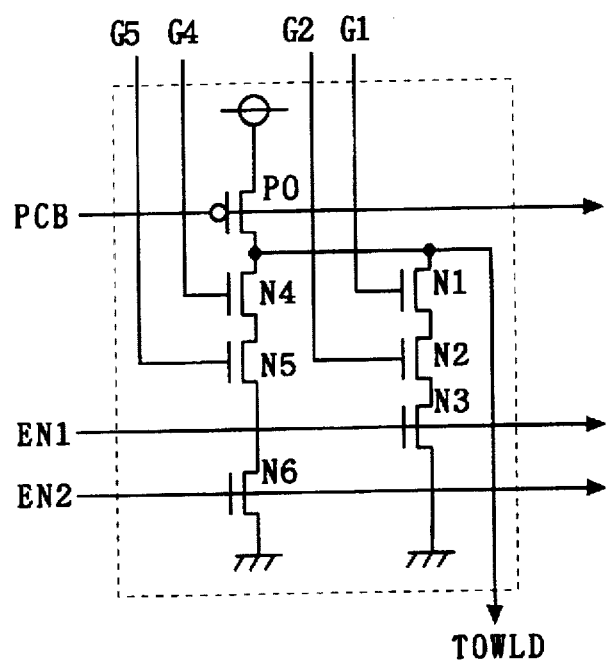
FIG. 33 is a diagram showing an example of the structure of a circuit applicable to the decoder final stage in the semiconductor storage circuit device according to the seventeenth preferred embodiment of the present invention.
Figure 34:
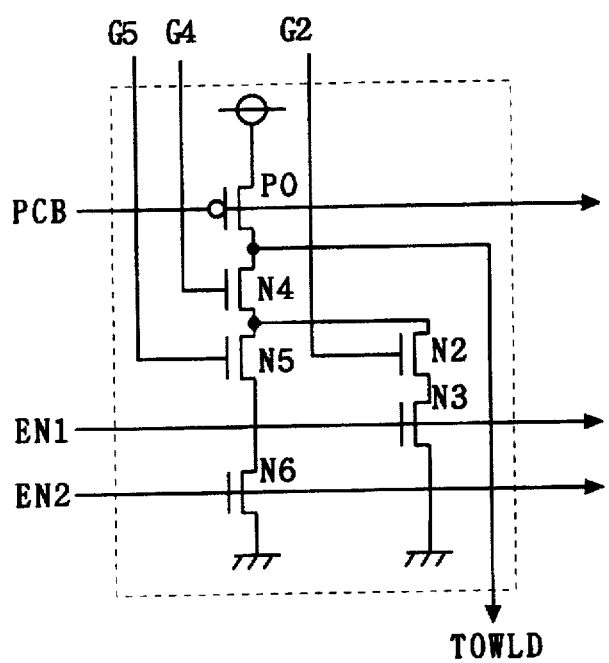
FIG. 34 is a diagram showing an example of the structure of a circuit applicable to the decoder final stage in the semiconductor storage circuit device according to the seventeenth preferred embodiment of the present invention.
Figure 35:
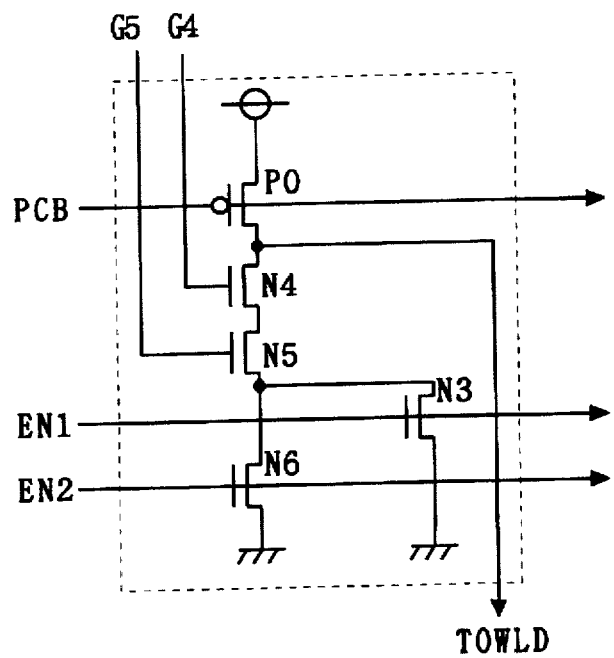
FIG. 35 is a diagram showing an example of the structure of a circuit applicable to the decoder final stage in the semiconductor storage circuit device according to the seventeenth preferred embodiment of the present invention.

The feature of this RAM 22D lies in the structure of the decoder final stages 55A, 55B and 55C, which uses the circuits shown in FIG. 33, FIG. 34, FIG. 35 as the decoder final stages 55A, 55B and 55C. That is to say, the circuit of FIG. 33 is the same as the decoder final stage circuit shown in FIG. 27. Accordingly, this circuit is used only for decoder final stages for when the input lines G1 and G4 transmit signals with different output values and when the input lines G2 and G5 transmit signals with different output values in FIG. 26. As a result, the decoder final stages 55A of FIG. 32 are realized.

On the other hand, the circuit of FIG. 34 can be used for decoder final stages for when the input lines G1 and G4 carry signals with the same output value and the input lines G2 and G5 carry signals with different output values in FIG. 26. Thus the decoder final stages 55B of FIG. 32 are obtained. By using this circuit, concerning the decoder final stage 55B, both the number of input lines and the number of transistors can be reduced by one as compared with FIG. 26.

The circuit of FIG. 35 can be used for one in which a signal on the input line G1 and a signal on the input line G4 have the same output value and a signal on the input line G2 and a signal on the input line G5 have the same output value in the decoder final stages shown in FIG. 26. Thus the decoder final stages 55C of FIG. 32, as compared with corresponding ones of FIG. 26, can reduce both the number of input lines and the number of transistors by two.

The idea of the seventeenth preferred embodiment described above is also applicable to the fifteenth and sixteenth preferred embodiments. Therefore, as an application example for the sixteenth preferred embodiment, the decoder 23C using three predecoders as shown in FIG. 31 will now be described.

In this case, as the decoder final stages 61 of FIG. 31 the four kinds of circuits shown in FIG. 36 to FIG. 39 are used.

Figure 36:
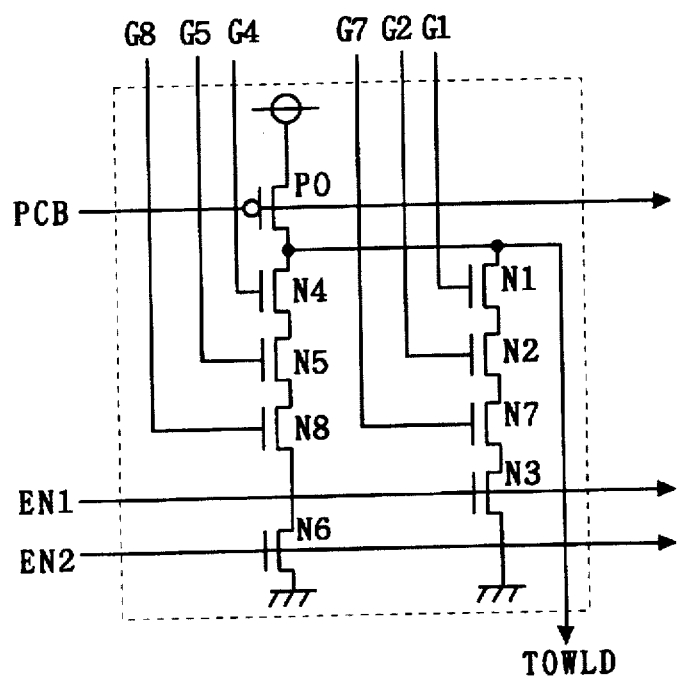
FIG. 36 is a diagram showing an example of the structure of a circuit applicable to the decoder final stage in the semiconductor storage circuit device according to the seventeenth preferred embodiment of the present invention.

That is to say, the circuit of FIG. 36, which is the same as the decoder final stage circuit shown in FIG. 31, is used as the decoder final stage 61 in which signals on the input lines G1 and G4 are respectively outputted from different output terminals of the corresponding predecoder, signals on the input lines G2 and G5 are also respectively outputted from different output terminals of the corresponding predecoder, and the input lines G7 and G8 are also respectively outputted from different output terminals of the corresponding predecoder.

Figure 37:
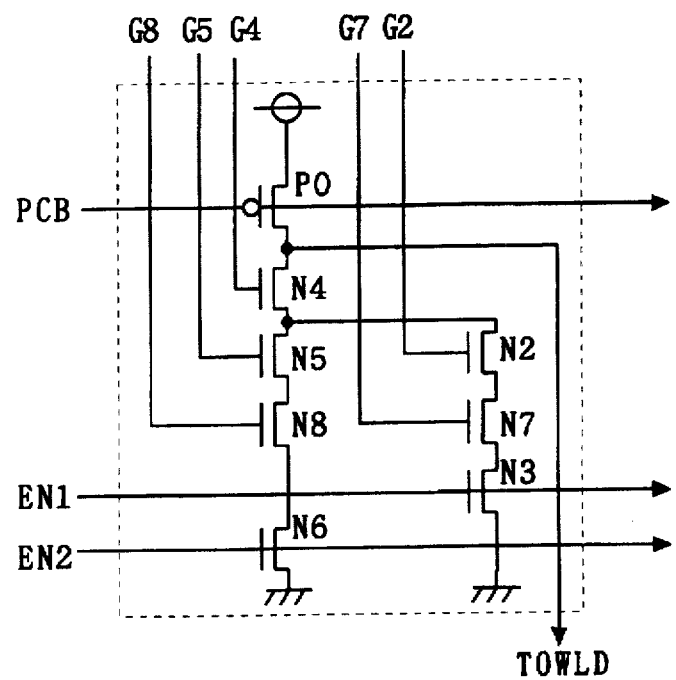
FIG. 37 is a diagram showing an example of the structure of a circuit applicable to the decoder final stage in the semiconductor storage circuit device according to the seventeenth preferred embodiment of the present invention.

In the decoder final stage circuits 61 shown in FIG. 31, the circuit of FIG. 37 can be used for those in which both a signal on the input line G1 and a signal on the input line G4 only are outputted from the same output terminal of the corresponding predecoder, which removes interconnection for the input line G1 and the transistor N1.

Figure 38:
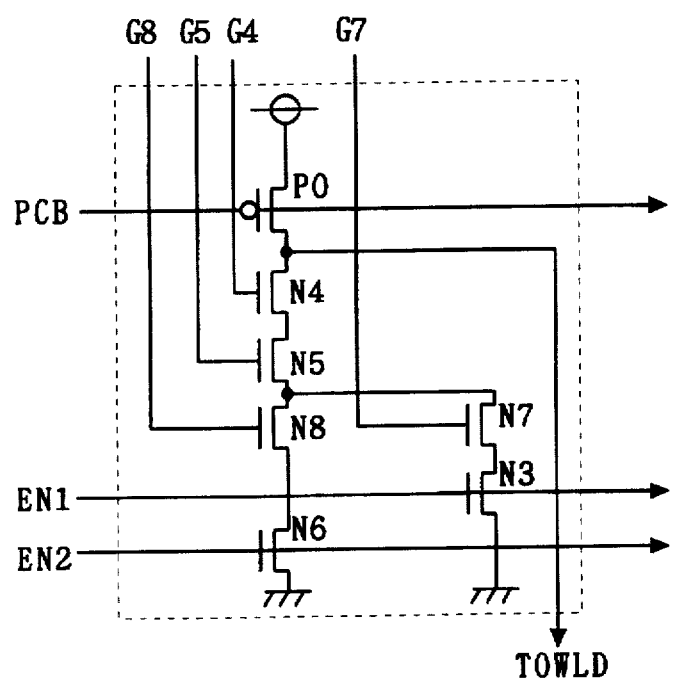
FIG. 38 is a diagram showing an example of the structure of a circuit applicable to the decoder final stage in the semiconductor storage circuit device according to the seventeenth preferred embodiment of the present invention.

In the decoder final stages 61 of FIG. 31, the circuit of FIG. 38 can be used for ones in which a signal on the input line G1 and a signal on the input line G4 are both outputted from the same output terminal of the corresponding predecoder and a signal on the input line G2 and a signal on the input line G5 are both outputted from the same output terminal of the corresponding predecoder. Thus the interconnections for the input lines G1 and G2 and the transistors N1 and N2 can be removed.

Figure 39:
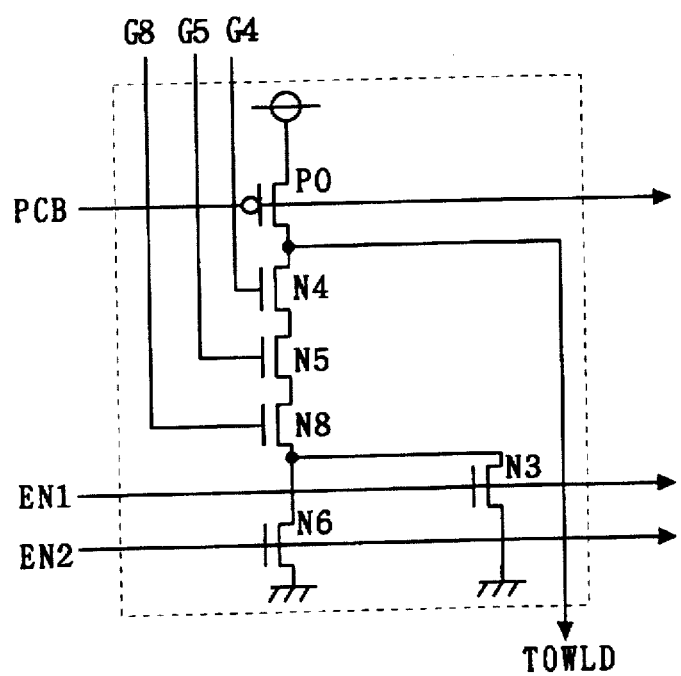
FIG. 39 is a diagram showing an example of the structure of a circuit applicable to the decoder final stage in the semiconductor storage circuit device according to the seventeenth preferred embodiment of the present invention.

Furthermore, in the decoder final stage circuits 61 shown in FIG. 31, for those in which a signal on the input line G1 and a signal on the input line G4 are both outputted from the same output terminal of the corresponding predecoder, a signal on the input line G2 and a signal on the input line G5 are both outputted from the same output terminal of the corresponding predecoder and a signal on the input line G7 and a signal on the input line G8 are both also outputted from the same output terminal of the corresponding predecoder, the circuit of FIG. 39 can be used. Thus the interconnections for the input lines G1, G2 and G7 and the transistors N1, N2 and N7 can be removed.

The idea of the seventeenth preferred embodiment is also applicable to the fifteenth and sixteenth preferred embodiments.

Thus, the seventeenth preferred embodiment produces the effect of reducing the circuit scale as well as the effects of the fourteenth to sixteenth preferred embodiments. This effect results in reduction of interconnection capacitance, which contributes to an increase in operation speed and a decrease in power consumption.

(Eighteenth Preferred Embodiment)

A semiconductor storage circuit device of an eighteenth preferred embodiment has a function of selecting columns in a memory cell array by enabling internal generation of a control signal for column selectors in a circuit of RAM having at least two address orders.

That is to say, most common general-purpose RAMs have column selectors. This is effective [1] to change configuration of a memory cell array, e.g., to approximate rectangular arrangement to square one, or [2] to improve the access time, etc.

Figure 91:
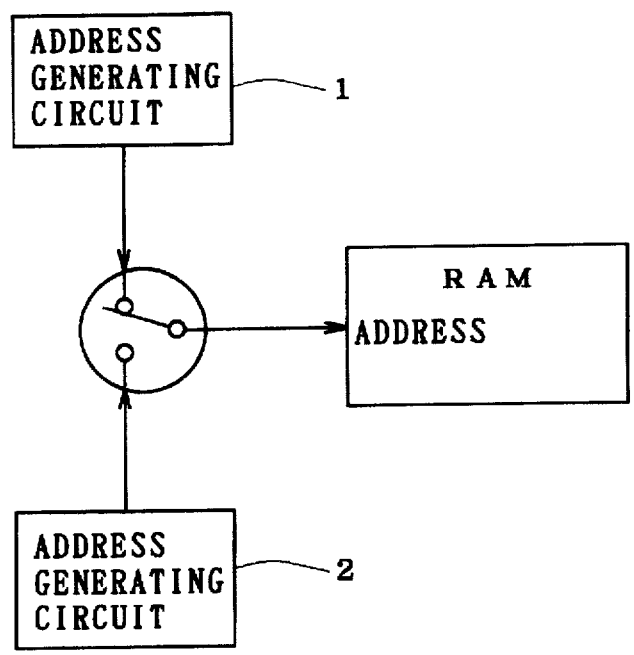
FIG. 91 is a diagram showing the background art.

Conventional RAMs, however, use part of address signals outputted from external address generating circuits (the circuits 1, 2 in FIG. 91, for example) as column selector control signals. Accordingly, when the semiconductor storage circuit device itself has two or more address orders as in the first through seventeenth preferred embodiments shown above, as address signals outputted from the address generating circuit (e.g., the circuit 30 of FIG. 26) are in the address order for increment or decrement, selection of columns can not be determined with part of those address signals, as done in the conventional art.

Accordingly, it is demanded that the semiconductor storage circuit devices according to the first through seventeenth preferred embodiments should have the column select function. It is an object of the eighteenth preferred embodiment to meet such a demand, which proposes general circuit structure for that purpose.

Figure 40:
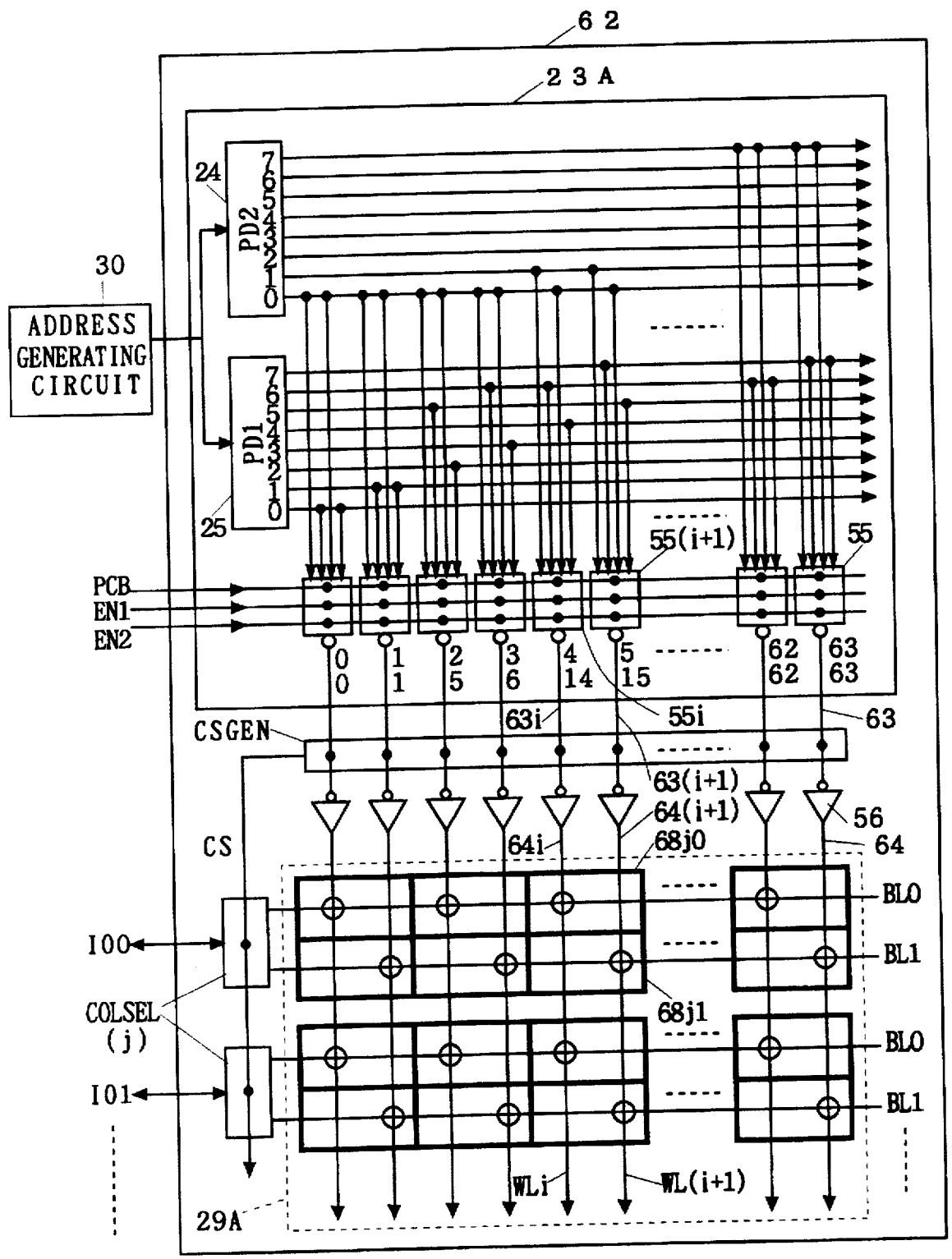
FIG. 40 is a block diagram showing an example of a semiconductor storage circuit device according to an eighteenth preferred embodiment of the present invention.

FIG. 40 is a diagram showing structure of a single-port RAM 62 as an example of a semiconductor storage circuit device according to the eighteenth preferred embodiment. For convenience, here is shown an example of the RAM 22A of the fourteenth preferred embodiment provided with the column select function, but it can also be applied to any of the first to thirteenth, fifteenth to seventeenth preferred embodiments and the twenty-seventh and twenty-eighth preferred embodiments described later. In this sense, the decoder 23A of FIG. 40 and corresponding portions in the above-mentioned respective preferred embodiments are generically referred to as "word line selecting portion". Although an example of a single-port RAM is shown here, the idea of the eighteenth preferred embodiment can also be applied to one arbitrary port of a multi-port RAM in the same way.

In FIG. 40, the same reference characters as those in FIG. 26 show the same parts.

Here, as it shows the case of 64 words, 64 memory cells are required for each data input/output signal IOj (an integer j≧0) of 1 bit. Accordingly, in the memory cell array 29A, 2 columns×32 rows of memory cells are assigned to each data input/output signal IOj.

The RAM 62 is characterized in that it is provided with a column select signal generating circuit CSGEN receiving as inputs the word line select signals 63, or outputs from the decoder final stages 55. The column select signal generating circuit CSGEN and the column selectors COLSEL are configured so that a corresponding column is selected when a particular word line WLi (0≦i≦63) is selected by the decoder 23A. That is to say, the column select signal generating circuit CSGEN is responsive to input of a particular word line select signal 63i (here when the signal 63 falls from a High level to a Low level) to output to each column selector COLSEL (j) a column select signal CS for controlling to select each column to which each memory cell on that particular word line WLi belongs, and it also outputs the inputted signal 63i to a corresponding word line driver 56. Each column selector COLSEL is provided for each input/output signal line for a corresponding 1-bit data input/output signal IOj. On the basis of the column select signal CS, it outputs inputted data signal IOj to a bit line BLj (0≦j) in a corresponding column specified by the signal CS. In the case of outputting the data signal IOj, the operation is opposite. That is to say, the selector COLSEL outputs to the corresponding 1-bit data input/output signal line a data signal read from a memory cell accessed by the address signal 64i, which is the output of the word line driver 56, and inputted from the bit line BLj in the corresponding column.

This allows a semiconductor storage circuit device capable of access to a memory cell array in at least two kinds of operation modes to have a function of selecting columns in the memory cell array not with external address signals but by itself, which implements, in addition to improvements of configuration of the memory cell array, improvements in access time, etc. because the change of configuration shortens interconnection length of the bit line.

(Nineteenth Preferred Embodiment)

While the eighteenth preferred embodiment has disclosed the structural principle for realizing the column selector function in the RAM itself, its specific circuit structure will be shown below.

Figure 41:
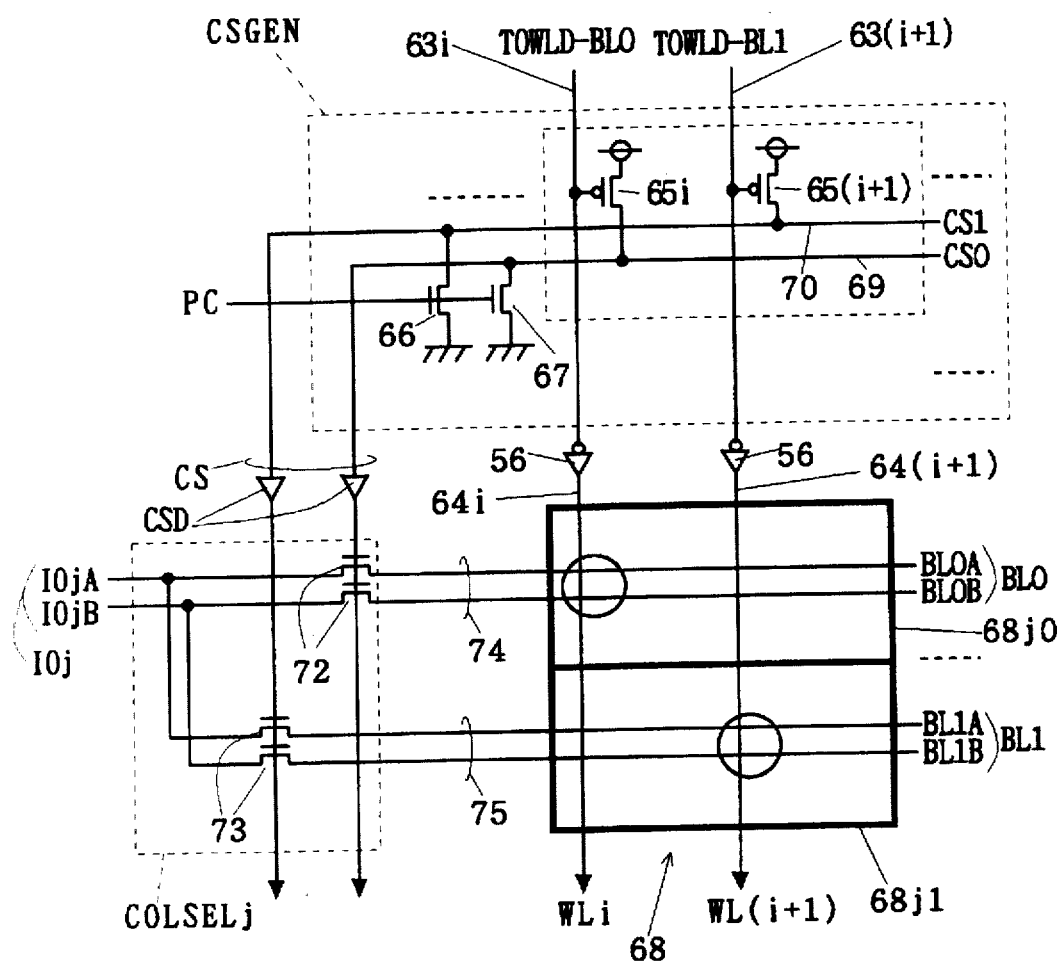
FIG. 41 is a block diagram showing a structural example of a characteristic portion in a semiconductor storage circuit device according to a nineteenth preferred embodiment of the present invention.

FIG. 41 is a diagram showing a first specific structural example of the column select signal generating circuit CSGEN of FIG. 40. It is the same as FIG. 40 in other points.

The circuit structure shown in FIG. 41 is for two-input column selectors COLSEL, which can be applied to the circuit of FIG. 40. In FIG. 41, the same reference characters as those in FIG. 40 denote the same parts.

Here, the column select signal generating circuit CSGEN includes precharging N-channel transistors 66 and 67, discharging P-channel transistors 65i provided for each even decoder final stage 55i counted from the leftmost position (which is numbered 0) in FIG. 40 and receiving its output line TOWLD-BL0 (63i) as input and discharging P-channel transistors 65(i+1) provided for each odd decoder final stage 55(i+1) counted from the leftmost position and receiving its output line TOWLD-BL1 (the output line 63(i+1) in FIG. 40) as input. A drain terminal of the respective P-channel transistors 65i, 65(i+1) is connected to the first and second column select signal lines 69 and 70, respectively. Here, the column select signal CS includes the first and second column select signals CS0 and CS1.

For convenience, FIG. 41 shows a j-th (0≦j) arbitrary column selector COLSELj and arbitrary memory cells 68j0 and 68j1 respectively belonging to two columns selected by that column selector COLSELj. The data input/output signal IOj inputting to or outputted from each column selector COLSELj is formed of first and second input/output signals IOjA and IOjB.

First, the precharge signal PC is set to a High level and respective nodes of the first and second column select signal lines 69 and 70 are both precharged to a Low level.

Subsequently, when output of one decoder final stage 55, e.g., the output line TOWLD-BL0 of the decoder final stage 55i attains an active state (a Low level in this example), the corresponding P-channel transistor 65i turns on and the corresponding column select signal CS, i.e., the first column select signal CS0 is discharged to a High level. As a result, each column select signal CS is transmitted to each column selector COLSELj by a corresponding driver CSD. Thus, in each column selector COLSELj, the N-channel transistor 72 becomes conductive and the N-channel transistor 73 enters a non-conducting state. Each memory cell 68j0 is accessed by the output line TOWLD-BL0. As a result, each column selector COLSELj selects the column in which the bit line BL0 is provided.

The input lines 74 and 75 are referred to as two-inputs in combination.

The driver CSD can be omitted.

Figure 42:
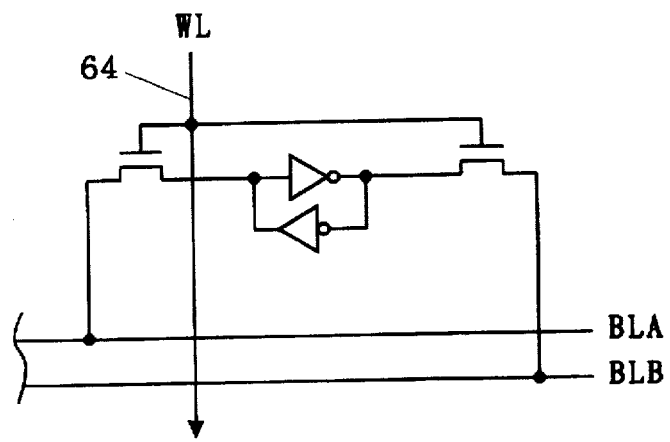
FIG. 42 is a diagram showing an example of the circuit structure of the memory cell in the semiconductor storage circuit device according to the nineteenth preferred embodiment of the present invention.

FIG. 42 shows an example of a static type memory cell applicable to each memory cell 68 (68j0, 68j1) of FIG. 41. The bit line BLA corresponds to the bit line BL0A or BL1A, and the bit line BLB corresponds to the bit line BL0B or BL1B.

Figure 43:
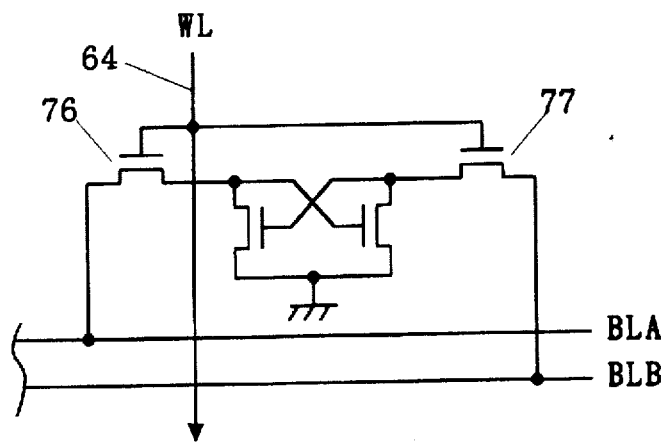
FIG. 43 is a diagram showing an example of the circuit structure of the memory cell in the semiconductor storage circuit device according to the nineteenth preferred embodiment of the present invention.

FIG. 43 also shows an example of a memory cell applicable to each memory cell 68 of FIG. 41. The circuit shown in FIG. 43 may be used as dynamic type or may be used as static type, depending on circumstances. When it is used as the static type, one end of the bit lines BLA and BLB are set to a High level and the word line WL (64) is set to an appropriate level to supply power-supply to the two transistors 76 and 77 from the bit lines BLA and BLB.

Thus, the nineteenth preferred embodiment provides the advantage of configuring a column select signal generating circuit CSGEN with simple design.

(Twentieth Preferred Embodiment)

Figure 44:
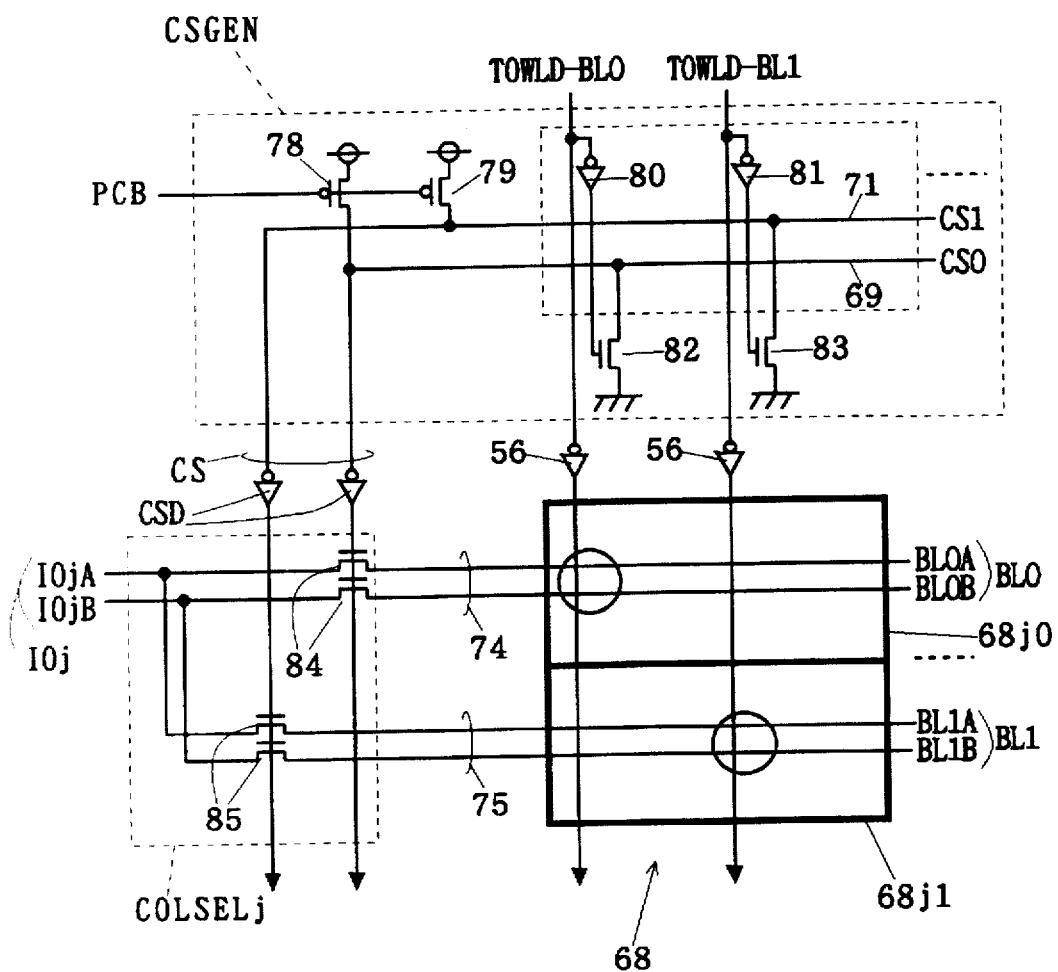
FIG. 44 is a block diagram showing a structural example of a characteristic portion in a semiconductor storage circuit device according to a twentieth preferred embodiment of the present invention.

FIG. 44 shows a second specific structural example of the column select signal generating circuit CSGEN of FIG. 40, which differs in structure from the circuit shown in FIG. 41. The circuit of FIG. 44 is adapted to a two-input (74, 75) column selector COLSELj, which can be applied to the circuits CSGEN and COLSEL of FIG. 40.

The column select signal generating circuit CSGEN of FIG. 44 includes precharging P-channel transistors 78 and 79 receiving the precharge signal PCB as input, an inverter 80 provided for the output line TOWLD-BL0 of each even decoder final stage 55i from the leftmost position of FIG. 40 for inverting the output line TOWLD-BL0, a discharging N-channel transistor 82 provided for each output of the corresponding inverter 80 and receiving its output as input and having its source and drain respectively connected to ground and the signal line 69, an inverter 81 provided for each output line TOWLD-BL1 of odd decoder final stages 55 (i+1) and receiving the output line TOWLD-BL1 as input, and an N-type transistor 83 provided for each inverter 81 and receiving its output as input and having its source and drain respectively connected to ground and the signal line 71. The signal line carrying the column select signal CS is formed of the signal lines 69 and 71 transmitting the first and second column select signals CS0 and CS1, respectively.

In FIG. 44, the same reference characters as those in FIG. 41 correspond to the same parts.

First, the precharge signal PCB is set to a Low level and nodes on the first and second column select signal lines CS0 and CS1 are precharged to a High level.

Then, when an output of one decoder final stage (e.g., the output line TOWLD-BL0 of a certain decoder final stage 55i) attains an active state (the Low level in this example), the output of a corresponding inverter 80 attains a High level and the corresponding transistor 82 turns on, and the corresponding column select signal CS (e.g., the first column select signal CS0) is discharged to the Low level. Then each column select signal CS (e.g., the first column select signal CS0 is at an L level and the second column select signal CS1 is at an H level) is inverted by the driver CSD and then transmitted to each column selector COLSELj. As a result, only a corresponding transistor in each column selector COLSELj (the transistor 84 turns on and the other transistor 85, not corresponding, remains off in the example above) turns on and each column selector COLSELj selects a column corresponding to the column select signal CS in the two columns. The data input/output signal IOj is transmitted on the corresponding bit line (the bit line BL0 in the above example).

The drivers CSD can be omitted.

As has been described above, the twentieth preferred embodiment provides the effect that the circuit of FIG. 40 can be constituted with simple design similarly to the nineteenth preferred embodiment.

(Twenty-First Preferred Embodiment)

A twenty-first preferred embodiment relates to an improvement on the column select signal generating circuit CSGEN of the twentieth preferred embodiment.

Figure 45:
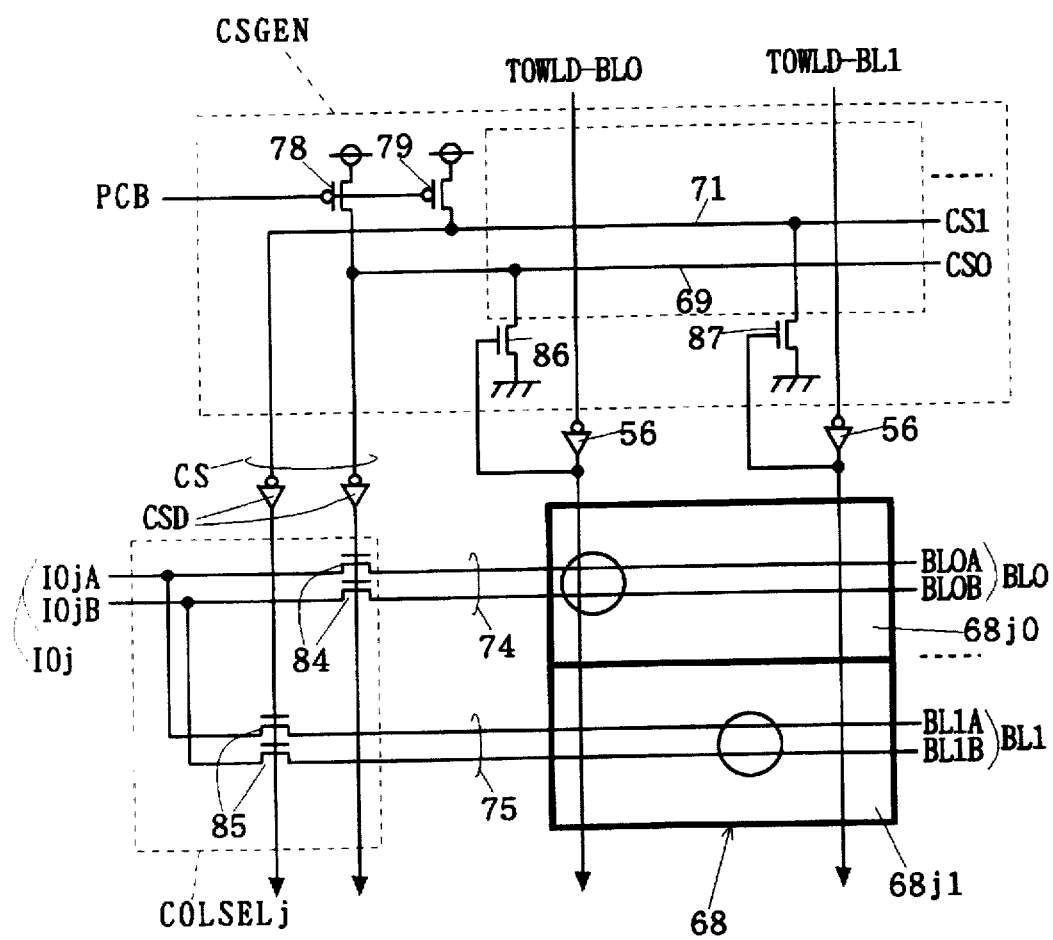
FIG. 45 is a block diagram showing a structural example of a characteristic portion in a semiconductor storage circuit device according to a twenty-first preferred embodiment of the present invention.

FIG. 45 shows a third specific structural example of the column select signal generating circuit CSGEN of FIG. 40.

In the circuit of FIG. 45, the circuit of FIG. 44 is improved by replacing the portions formed of the inverters 80 and the transistors 82 of FIG. 44 by transistors 86 of FIG. 45 and replacing the portions formed of the inverters 81 and the transistors 83 of FIG. 44 by transistors 87 of FIG. 45. That is to say, output of a corresponding word line driver 56 (WLD) controls a corresponding N-channel transistor (86, 87) in the column select signal generating circuit CSGEN.

It is the same as that shown in FIG. 44 in other respects, and therefore the description on operation of FIG. 44 is referred to.

This provides the effect of eliminating the inverter circuits as compared with the case of FIG. 44.

The column select signal generating circuit CSGEN of FIG. 45 is the same as the circuit CSGEN of FIG. 41 in circuit scale, thus enabling simple design. Here, furthermore, since the N-type transistors 86 and 87 are respectively provided for each of the output lines TOWLD-BL0 and TOWLD-BL1 of a corresponding decoder final stage to configure the circuit CSGEN, remaining P-channel transistors can be used to reinforce the P-channel transistors forming the word line drivers 56 (WLD) on the CMOS gate array, providing the advantage of making a rise of P-channel transistors in the word line driver 56 faster.

(Twenty-Second Preferred Embodiment)

Figure 46:
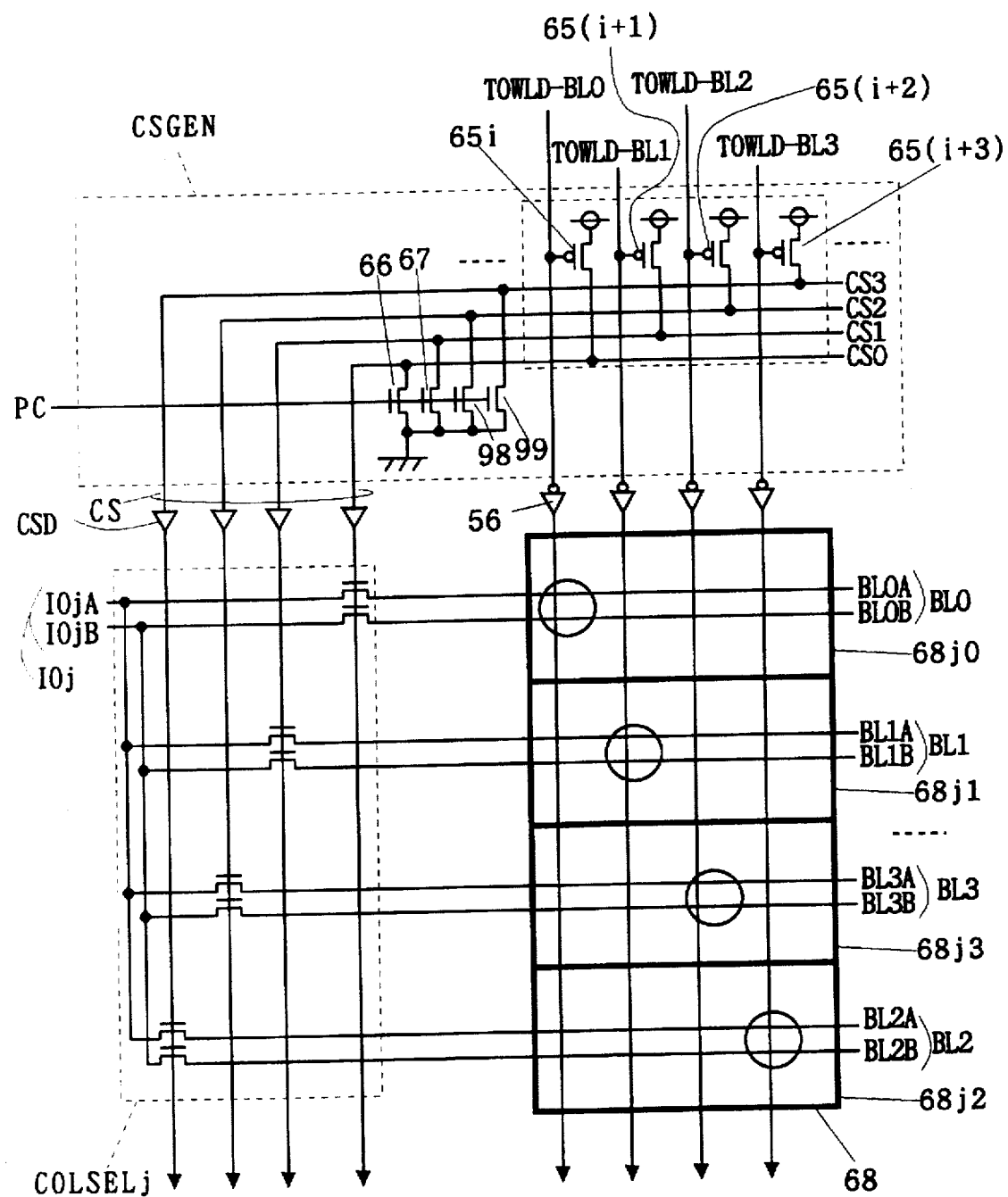
FIG. 46 is a block diagram showing a structural example of a characteristic portion in a semiconductor storage circuit device according to a twenty-second preferred embodiment of the present invention.

FIG. 46 shows a fourth specific structural example of the column select signal generating circuit CSGEN of FIG. 40. That is to say, the circuit of FIG. 46 is an expansion of the 2-input column type circuit of FIG. 41 to a 4-input column type circuit, which is adapted to a 4-input column selector COLSEL. Accordingly, the column select signal CS is formed of first through fourth column select signals SC0 to CS3 and drains of N-type transistors 66, 67, 98, 99 receiving the precharge signal PC as input are connected to the first through fourth column select signal lines, respectively. A P-type transistor 65i receiving the output line TOWLD-BL0 is provided for each decoder final stage 55i which is located in a position corresponding to an integer multiple of 4 from the leftmost position in FIG. 40 and a P-type transistor 65(i+1) receiving the output line TOWLD-BL1 is provided for each 55(i+1) next to the decoder final stage 55i. Furthermore, for each decoder final stage 55(i+2) adjacent the decoder final stage 55(i+1), a P-type transistor 65(i+2) receiving its output line TOWLD-BL2 as input is provided and for each decoder final stage 55(i+3) adjacent the decoder final stage 55(i+2), a P-type transistor 65(i+3) receiving its output line TOWLD-BL3 as input is provided.

Operations are the same as those of FIG. 41, so it is not repeated.

Here, while it is shown in an example of 4-input, it is similarly expandable to 6-inputs, 8-inputs, and so on.

Thus, according to the twenty-second preferred embodiment, the number of inputs to the column selector can be extended easily. Accordingly, configuration of the memory cell array can be properly changed.

(Twenty-Third Preferred Embodiment)

FIG. 47 shows an example for constructing the circuit structure in the twenty-second preferred embodiment on a CMOS gate array to implement a high density RAM, which merely shows, for convenience, circuit structures of memory cells MCN0, MCP1, MCP3, MCN2 belonging to arbitrary 4 columns in the memory cell array 29A (FIG. 40), a corresponding arbitrary column selector COLSELj, and a column select signal generating circuit CSGEN. Accordingly, in FIG. 47, the set of four memory cells (MCN0, MCP1, MCP3, MCN2) is expanded in the transverse direction (row direction) and the vertical direction (column direction) in the figure to form a memory cell array.

Figure 48:
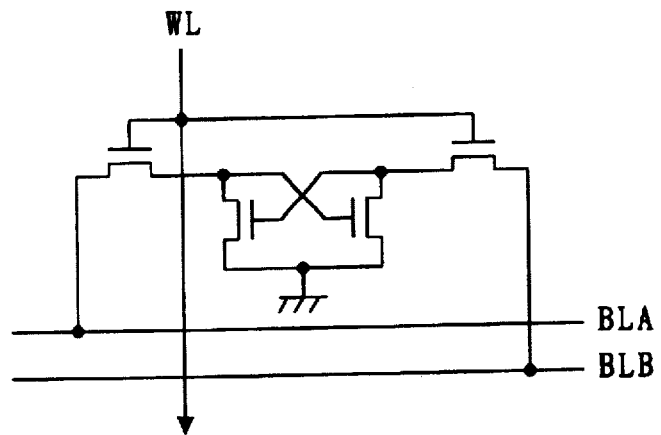
FIG. 48 is a diagram showing an example of the circuit structure of the memory cell used in the semiconductor storage circuit device according to the twenty-third preferred embodiment of the present invention.

The memory cells MCN0 and MCN2 are the memory cell circuit shown in FIG. 48 (the bit line BLA corresponds to the bit line BL0A, BL2A, the bit line BLB corresponds to the bit line BL0B, BL2B), which are formed only of N-channel transistors. The memory cells MCP1 and MCP3 are the memory cell circuit shown in FIG. 49 (BLA→BL1A, BL3A, BLB→BL1B, BL3B), which are formed only of P-channel transistors.

In the twenty-third preferred embodiment, which is intended to realize the circuit of the twenty-second preferred embodiment on a CMOS gate array, it is necessary to provide inversion type word line drivers 88 for the memory cells MCN0, MCN2 formed of N-type transistors.

Figure 49:
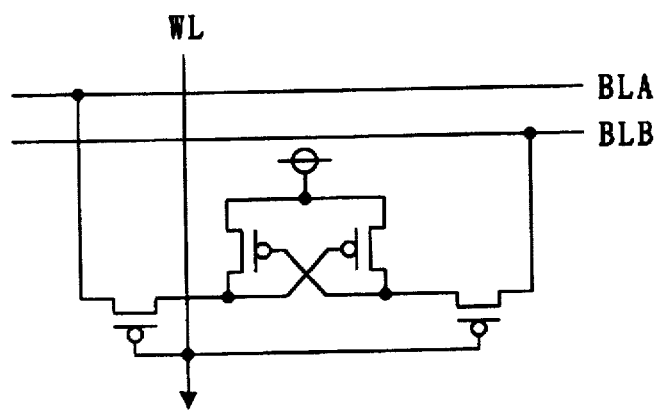
FIG. 49 is a diagram showing an example of the circuit structure of the memory cell used in the semiconductor storage circuit device according to the twenty-third preferred embodiment of the present invention.

That is to say, the memory cells MCN0, MCN2 of FIG. 48 are driven by the inversion-type word line drivers 88 (WLDN) and the memory cells MCP1 and MCP of FIG. 49 are driven by the non-inversion-type word line drivers 89 (WLDP).

The word line drivers 89 can be omitted.

The transistors 90 and 91 for the column selector corresponding to the memory cells (MCN0, MCN2) of FIG. 48 are formed of N-channel transistors. On the other hand, the transistors 92, 93 for the column selector corresponding to the memory cells (MCP1, MCP3) of FIG. 49 are formed of P-channel transistors. The P-channel transistors 92, 93 in each column selector COLSELj are driven by outputs of inversion-type drivers 94 and 95 (CSDP) receiving the second and fourth column select signals CS1 and CS3, respectively. The N-channel transistors 90 and 91 in each column selector COLSELj are driven by outputs of the non-inversion type drivers 96 and 97 (CSDN) receiving the first and third column select signals CS0 and CS2, respectively. The non-inversion type drivers CSDN can be removed.

In the circuit of FIG. 47, bit line precharging transistor circuits 100, 101, 101, 100 are added on the bit lines BL0, BL1, BL3, BL2, respectively. These circuits 100 and 101 are controlled by the bit line precharge signals BPCB and BPC, respectively. When memory cells are not accessed, transistors in these transistor circuits are placed in an ON state.

These transistor circuits 100 and 101 are for power supply when using each memory cell as stack-type or for precharging the bit lines to ensure reading of data, which are not essential components. Accordingly, the nature of the twenty-third preferred embodiment is not affected even if there are no such circuits 100 and 101.

Thus, according to the twenty-third preferred embodiment, the circuit of the twenty-second preferred embodiment can be realized on a CMOS gate array.

(Twenty-Fourth Preferred Embodiment)

A twenty-fourth preferred embodiment relates to an improvement on the twenty-third preferred embodiment, which just corresponds to a combination of the idea of the nineteenth preferred embodiment and the idea of the twentieth preferred embodiment.

Figure 50:
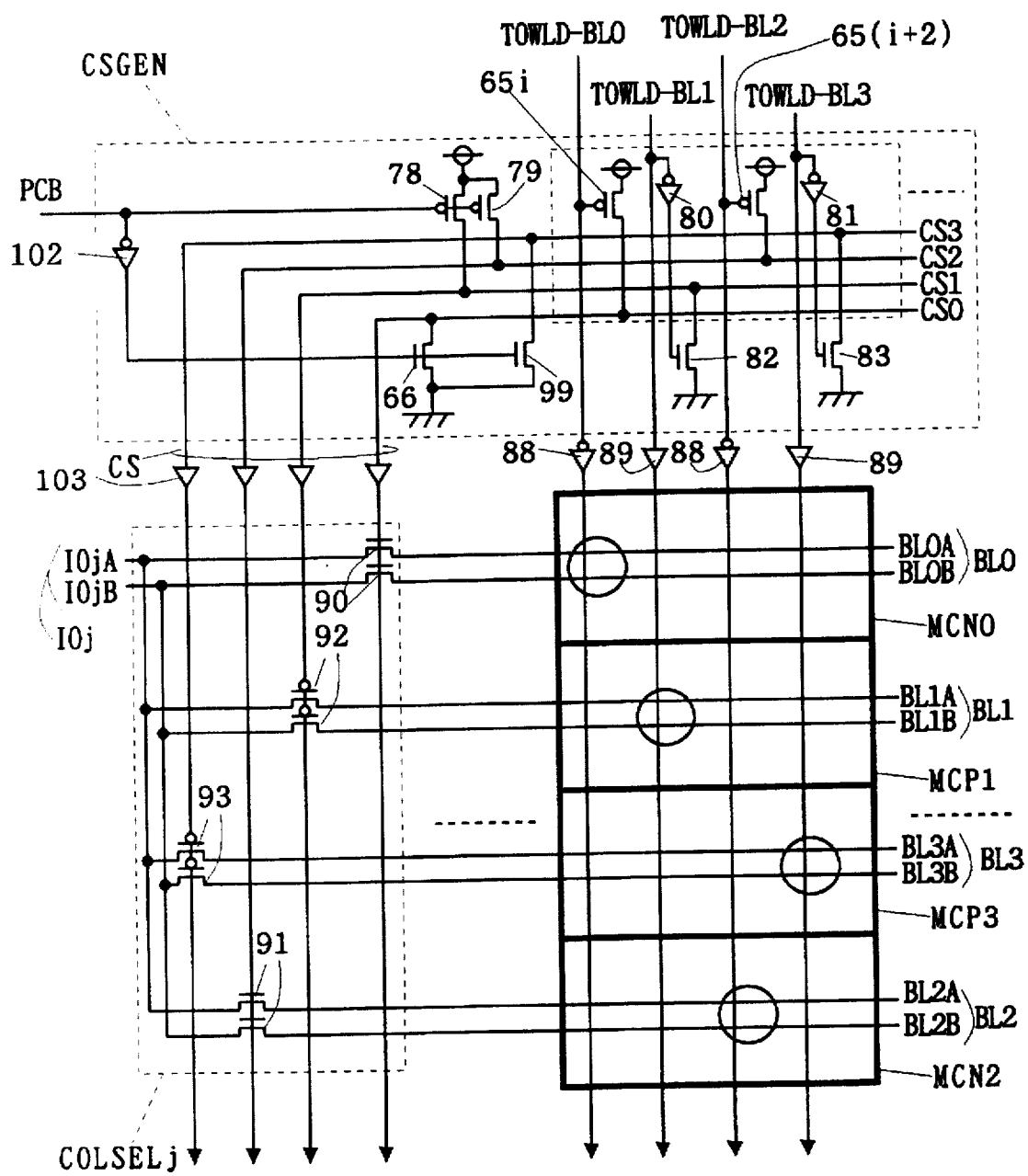
FIG. 50 is a block diagram showing a structural example of a characteristic portion in a semiconductor storage circuit device according to a twenty-fourth preferred embodiment of the present invention.

FIG. 50 is a circuit diagram showing a fifth specific example about the memory cell array 29A (FIG. 40), the column selector COLSELj, and the column select signal generating circuit CSGEN to configure a high density RAM on a CMOS gate array.

For convenience, FIG. 50 merely shows the column select signal generating circuit CSGEN, an arbitrary column selector COLSELj and corresponding four memory cells (MCN0, MCP1, MCP3, MCN2), which memory cells are expanded in the transverse direction and the longitudinal direction in FIG. 50 to form a memory cell array.

The memory cells MCN0 and MCN2 are the memory cell circuit shown in FIG. 48, which are formed of N-channel transistors. The memory cells MCP1 and MCP3 are the memory cell circuit shown in FIG. 49, which are formed of P-channel transistors.

In the circuit of FIG. 50, as compared with the circuit shown in FIG. 47, the structure of the column select signal generating circuit CSGEN is improved. That is to say, the circuit structure of the column select signal generating circuit CSGEN of FIG. 41 is applied to the structural portion corresponding to the memory cells MCN0, MCN2 formed only of the N-channel transistors in the circuit CSGEN of FIG. 50, and the structure in the circuit CSGEN of FIG. 44 is applied to the structural portion corresponding to the memory cells MCP1 and MCP3 formed only of the P-channel transistors in the circuit CSGEN of FIG. 50.

The reference character 102 denotes an inverter.

Ones of the non-inversion type are used for drivers 103 (CSD) for the column select signal CS. These drivers CSD can be omitted.

Operations are as already described in the nineteenth and twentieth preferred embodiments, so it is not repeated.

Thus, the RAM 62 (FIG. 40) having the column selector function can be formed on a CMOS gate array with a combination of features of the nineteenth and twentieth preferred embodiments.

(Twenty-Fifth Preferred Embodiment)

Figure 51:
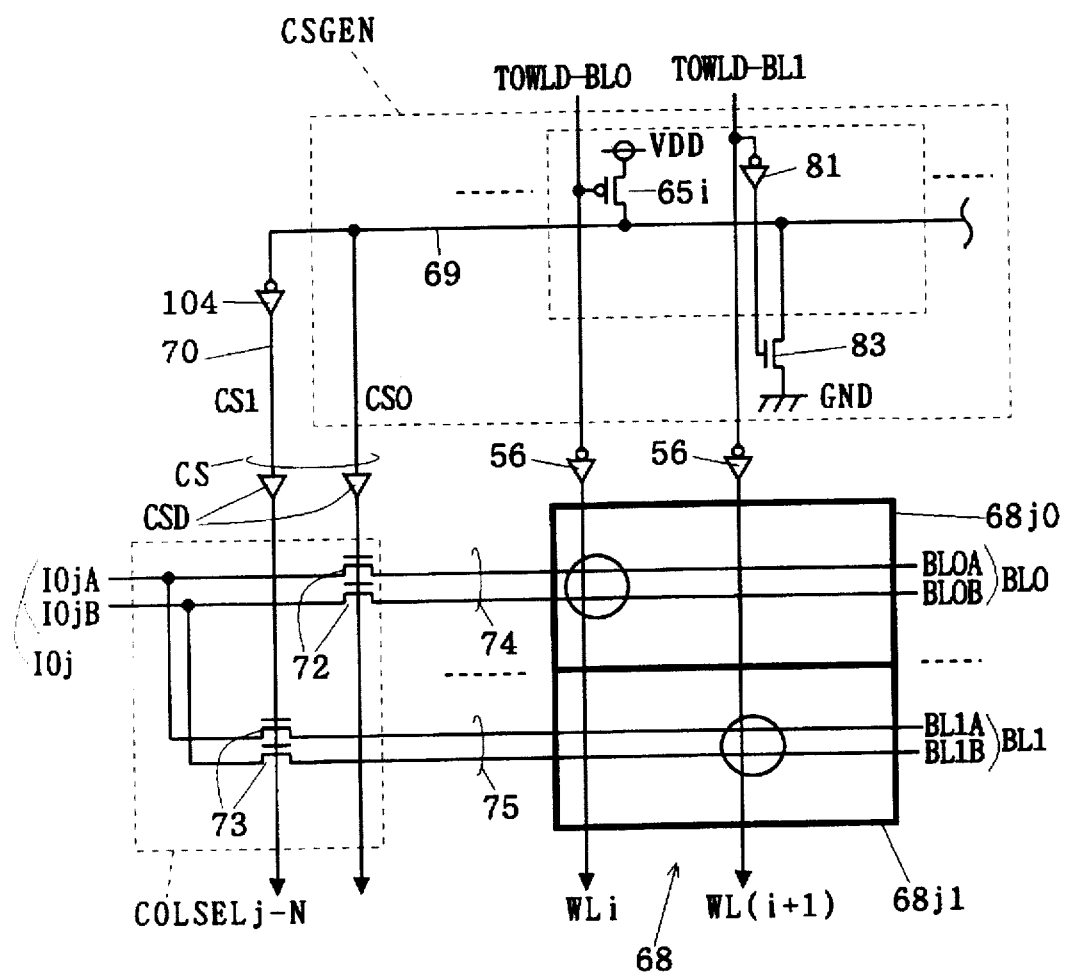
FIG. 51 is a block diagram showing a structural example of a characteristic portion in a semiconductor storage circuit device according to a twenty-fifth preferred embodiment of the present invention.

FIG. 51 shows a sixth specific structural example of the column select signal generating circuit CSGEN of FIG. 40, which, for convenience, is a circuit diagram showing only arbitrary memory cells 68 (68j0, 68j1) in the memory cell array 29A (FIG. 40), an arbitrary column selector COLSELj-N and a column select signal generating circuit CSGEN. In the figure, the same reference characters as those in FIG. 41 and FIG. 44 correspond to the same parts.

Figure 52:
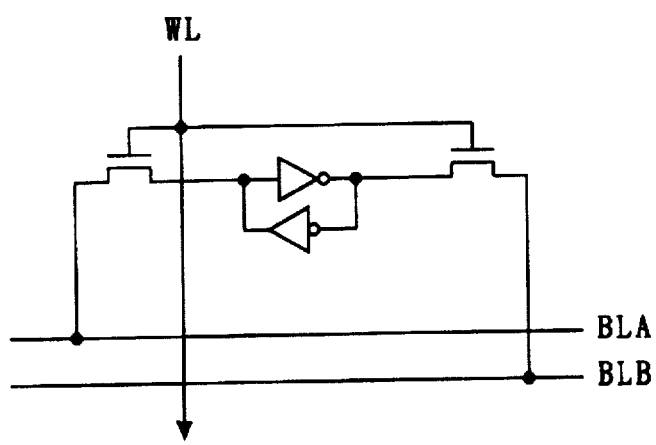
FIG. 52 is a diagram showing an example of the circuit structure of the memory cell used in the semiconductor storage circuit device according to the twenty-fifth preferred embodiment of the present invention.
Figure 53:
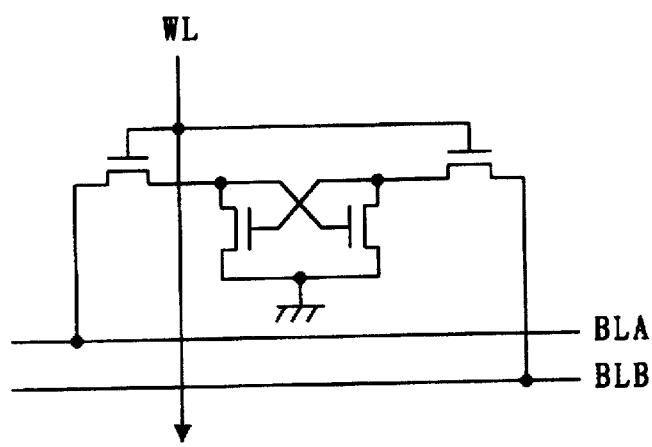
FIG. 53 is a diagram showing an example of the circuit structure of the memory cell used in the semiconductor storage circuit device according to the twenty-fifth preferred embodiment of the present invention.

FIG. 52 and FIG. 53 both show circuit examples of memory cells applicable to the memory cells 68 of FIG. 51.

The circuit of FIG. 51 is adapted to the two-input column selector COLSELj-N, which can be applied to the circuit of FIG. 40.

The column select signal generating circuit CSGEN includes a P-channel transistor 65i provided for each output line TOWLD-BL0 of each decoder final stage 55i in an even position from the leftmost position in FIG. 40 and receiving that output line TOWLD-BL0 as input, an inverter 81 provided for each output line TOWLD-BL1 of each odd decoder final stage 55(i+1) for inverting that output line TOWLD-BL1, and an N-channel transistor 83 provided for each output of each inverter 81 and controlled by its output. Accordingly, actually, 32 portions are provided each including each of ports 65i, 81 and 83.

Each P-channel transistor 65i has its source connected to the power-supply VDD and each N-channel transistor 83 has its source connected to a ground GND. Connected to the nodes on the signal line 69 for the first column select signal CS0 are the drains of the P-channel transistors 65i and the drains of the N-channel transistors 83, and the second column select signal CS1 is generated by inverting the first column select signal CS0 in an inverter 104.

The drivers CSD for the column select signal CS (CS0, CS1) are of the non-inversion type, which drivers CSD may be eliminated.

The operation will be described.

Now, it is considered that an output line TOWLD-BL0 of a particular decoder final stage attain an active state (a Low level, here). At this time, the corresponding P-channel transistor 65i in the column select signal generating circuit CSGEN attains an ON state and the first column select signal CS0 goes to a High level, and the second column select signal CS1 goes to a Low level, the transistor 72 controlled to a conducting state and the transistor 73 controlled to a non-conducting state, so that the column selector COLSELj-N selects the bit line BL0 (BL0A, SL0B).

Next, it is supposed that the output line TOWLD-BL1 of another specific decoder final stage attain an active state (a Low level). Then, a corresponding N-channel transistor 81 in the circuit CSGEN attains an ON state, the first column select signal CS0 goes to a Low level, the second column select signal CS1 goes to a High level, and then the column selector COLSLj-N selects the bit line BL1 (BL1A, BL1B).

In FIG. 51, the inverter 81 and the transistor 83 are used so that the level of the first column select signal 69 can change quickly without affected even if signals on the input line and the output line of a corresponding word line driver 56 slowly change due to influence by interconnection capacitance on the memory cell side. It is a matter of course that the structure of FIG. 45 (the transistor 87) may be used.

Thus, the twenty-fifth preferred embodiment has the unique effects of eliminating the need for the precharge signal in configuring the column select signal generating circuit CSGEN and of reducing the number of interconnections because it is sufficient to provide only the first column select signal line 69 in that circuit CSGEN.

(Twenty-Sixth Preferred Embodiment)

A twenty-sixth preferred embodiment is intended to enable implementation of the structure of the twenty-fifth preferred embodiment on a CMOS gate array. Therefore, it is necessary to provide word line drivers as described below corresponding to memory cells formed only of P-type transistors and memory cells formed only of N-type transistors in the memory cell array.

Figure 54:
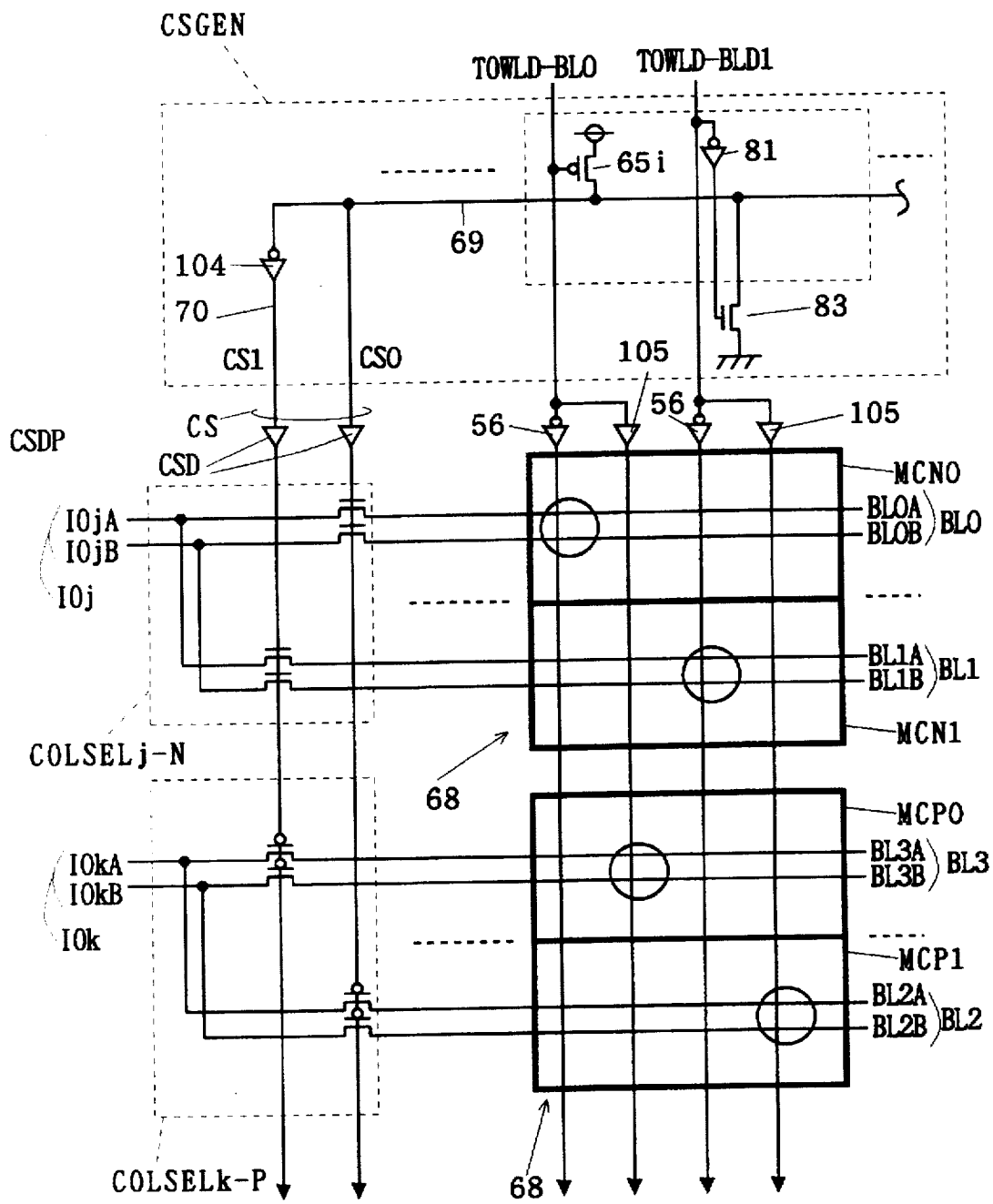
FIG. 54 is a block diagram showing a structural example of a characteristic portion in a semiconductor storage circuit device according to a twenty-sixth preferred embodiment of the present invention.

FIG. 54 is a diagram showing the circuit structure of a memory cell array, column selectors COLSEL, and a column select signal generating circuit CSGEN for constituting a high density RAM on a CMOS gate array. In the figure, the same reference characters as those in FIG. 51 show corresponding parts.

For convenience, FIG. 54 shows only the four memory cells 68 (MCN0, MCN1, MCP0, MCP1) corresponding to the two two-input column selectors COLSELj-N and COLSELk-P, which these memory cells are expanded in the transverse direction and the vertical direction in the memory cell array 29A (FIG. 40).

Figure 55:
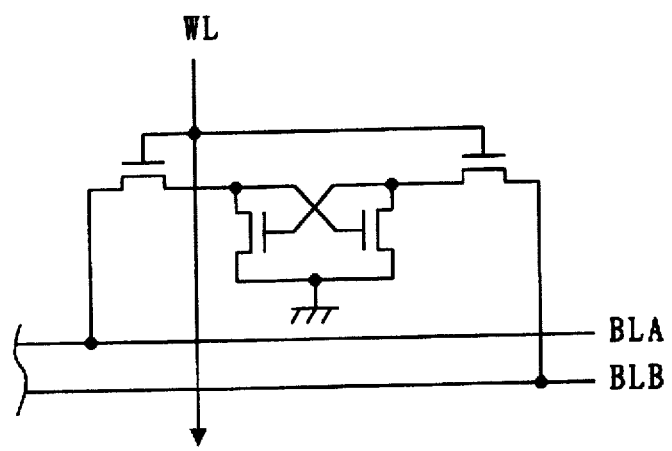
FIG. 55 is a diagram showing an example of the circuit structure of the memory cell used in the semiconductor storage circuit device according to the twenty-sixth preferred embodiment of the present invention.
Figure 56:
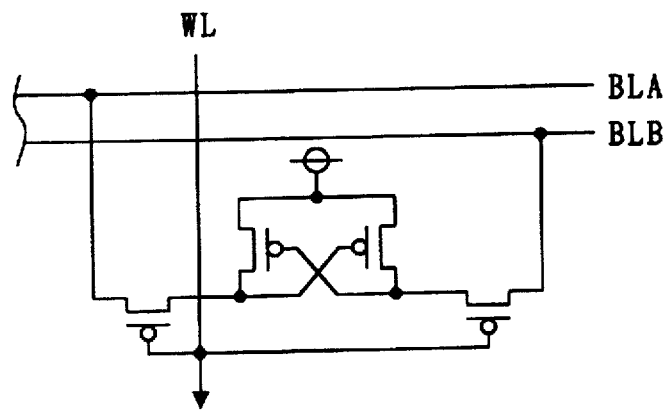
FIG. 56 is a diagram showing an example of the circuit structure of the memory cell used in the semiconductor storage circuit device according to the twenty-sixth preferred embodiment of the present invention.

The memory cells MCN0 and MCN1 are the memory cell circuit in FIG. 55, which are configured only with N-channel transistors. The memory cells MCP0 and MCP1 are the memory cell circuit of FIG. 56, which are configured only of P-channel transistors.

In the circuit of FIG. 54, the memory cells MCN0 and MCN1 formed only of the N-channel transistors and the memory cells MCP0 and MCP1 formed only of P-channel transistors are assigned to different data input/outputs IOj and IOk. Non inversion type drivers 105 (which are omittable) are used as drives on the word lines for the memory cells MCP0 and MCP1.

Thus, the effects obtained in the twenty-fifth preferred embodiment can also be produced on a CMOS gate array.

(Twenty-Seventh Preferred Embodiment)

A twenty-seventh preferred embodiment has been made to realize the same function as that in the eighth preferred embodiment, which realizes the functions of the shift register 35, the second decoder 10 and the selector 11 inside a decoder without using the shift register 35 of FIG. 8.

Figure 57:
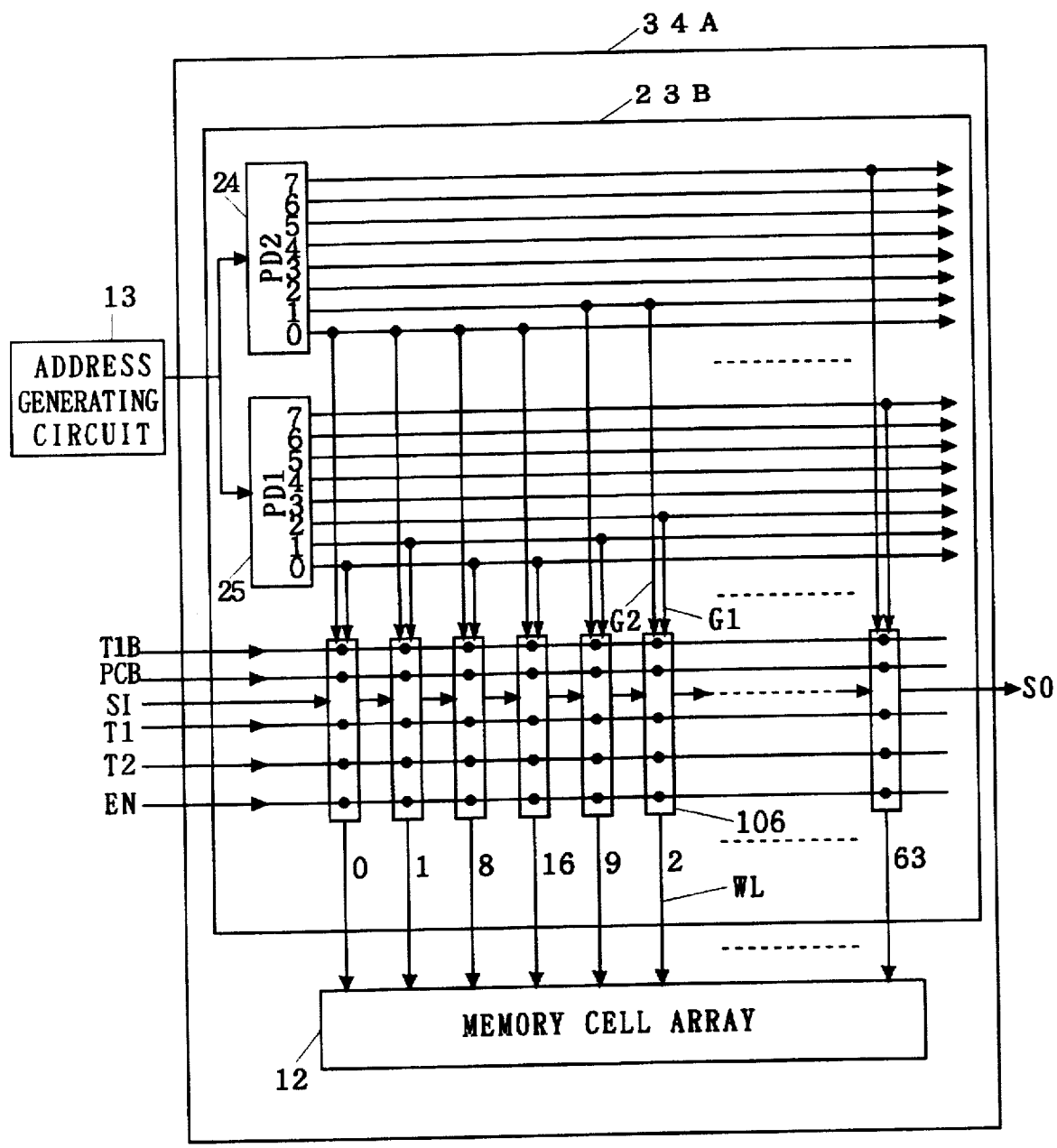
FIG. 57 is a block diagram showing an example of a semiconductor storage circuit device according to a twenty-seventh preferred embodiment of the present invention.

FIG. 57 shows the structure of a single-port RAM 34A as an example of a semiconductor storage circuit device of the twenty-seventh preferred embodiment, which RAM 34A realizes the first operation mode (increment, or the like) with shift function and realizes the second operation mode (zigzag scan, or the like) with connections between first and second predecoders and decoder final stages.

The RAM 34A is characterized by use of one having a shift function, 106, as each decoder final stage.

Figure 63:
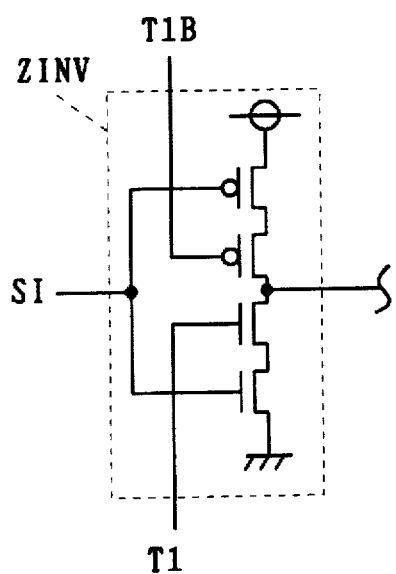
FIG. 63 is a diagram showing an example of the structure of the 3-state output type inverter circuit in FIG. 62.
Figure 64:
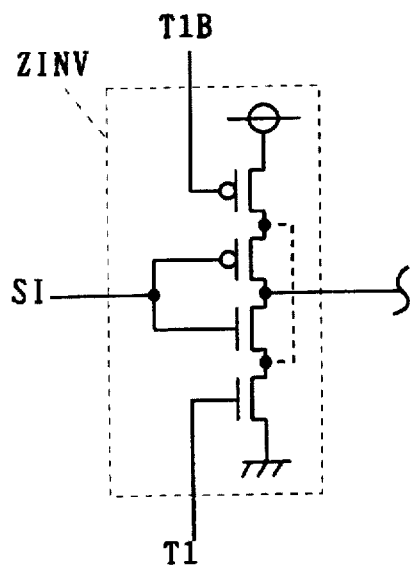
FIG. 64 is a diagram showing an example of the structure of the 3-state output type inverter circuit in FIG. 62.
Figure 65:
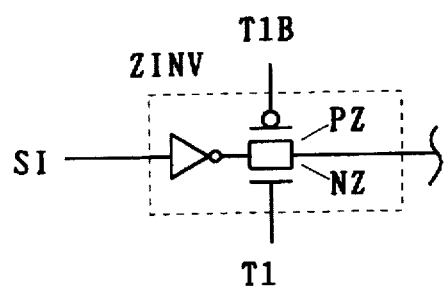
FIG. 65 is a diagram showing an example of the structure of the 3-state output type inverter circuit in FIG. 62.

Each of FIG. 58, FIG. 59, FIG. 60, FIG. 61 and FIG. 62 shows an example of circuit structure of the decoder final stage 106 with a shift function applicable to FIG. 57. These circuits all have the function of a dynamic type shift register. Each of FIG. 63 to FIG. 65 shows an example of structure of a 3-state output type inverter circuit applicable to FIG. 62.

Figure 58:
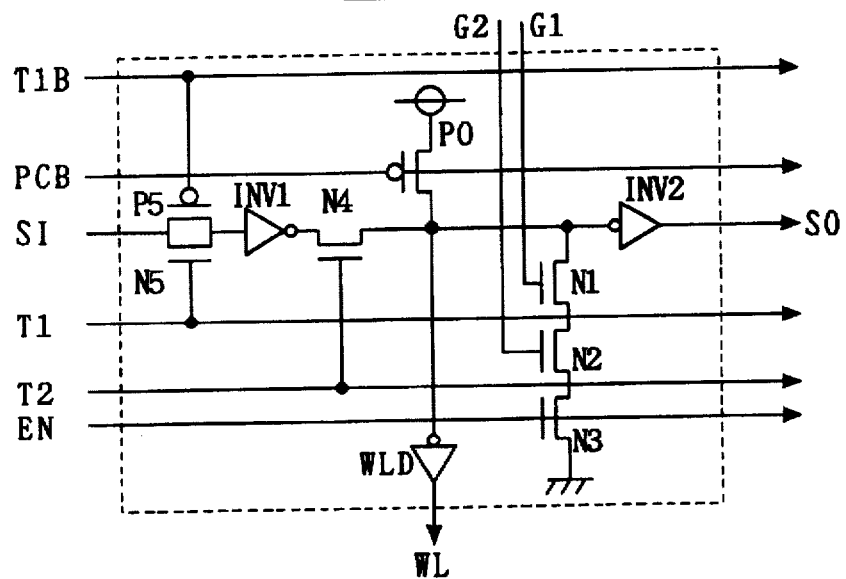
FIG. 58 is a diagram showing an example of the circuit structure of the decoder final stage with a shift function used in the semiconductor storage circuit device according to the twenty-seventh preferred embodiment of the present invention.

(a) The circuit of FIG. 58 is based on the clocked CMOS type NAND circuit, which adds the function of shift register to the precharge function by pulling out the signal from the next one on the left of decoder final stages.

Inputs of transistors N1, N2 in each decoder final stage 106 are respectively connected to corresponding output lines or output terminals of the first and second predecoders 25 and 24 to realize the address order of the second decoder 10 of FIG. 8. Transistors N5, P5 and N4 and inverters INV1 and INV2 form a dynamic type shift register.

The operation will be described on the case where the decoder 23B accesses a memory cell in the memory cell array 12.

(D1) With the enable signal EN at a Low level and the second clock signal T2 at a Low level, the precharge signal PCB is set to a Low level to turn the transistor P0 to an ON state, so that the input node of the word line driver WLD is precharged.

(D2) The precharge signal PCB is set to a High level.

(D3) The enable signal EN is brought to a High level. Then the transistor N3 turns on, and then, signal at a High level is outputted from particular output lines of the first and second predecoders 25 and 24, so that the input node of the word line driver WLD in a particular decoder final stage 106 is discharged, and then that particular word line WL attains an active state.

Next, the operation will be described on the case where a memory cell is accessed with the shift register function in the decoder 23B.

(S1) With the enable signal EN at a Low level, the second clock signal T2 (an inversion signal of the first clock signal T1) at a Low level, and the precharge signal PCB at a High level, the first clock signal T1 is set to a High level and the third dock signal T1B is set to a Low level to place the transistors N5 and P5 in an ON state. Then, hold data at the decoder final stage 106 on the next preceding stage is captured into the input node of the inverter INV1.

(S2) The first clock signal T1 is set to a Low level and the third clock signal T1B is set to a High level so as to bring the transistors N5 and P5 into an OFF state. The precharge signal PCB may be set to a Low level to perform precharge.

(S3) The precharge signal PCB is set to a High level and the second clock signal T2 is set to a High level to put the transistor N4 in an ON state. This causes the output data of the inverter INV1 to be captured in the input node of the inverter INV2. At the same time, that word line WL attains an active state.

In this way, two address orders (herein, the increment order and the zig-zag scan order, for example) can be implemented with such a simple circuit structure formed of transistors.

One of the transistors P5 and N5 may be removed.

Figure 59:
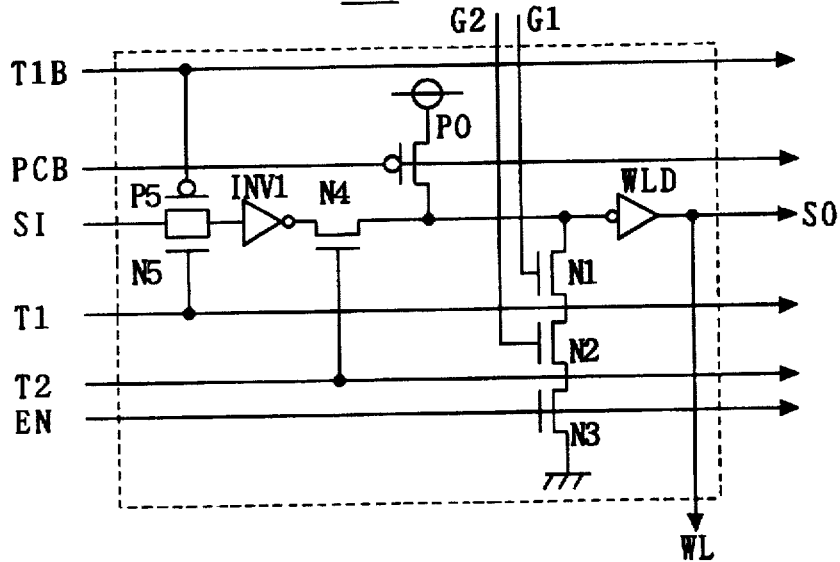
FIG. 59 is a diagram showing an example of the circuit structure of the decoder final stage with a shift function used in the semiconductor storage circuit device according to the twenty-seventh preferred embodiment of the present invention.

(b) The circuit of FIG. 59 is a modification of the circuit of FIG. 58, and it is a circuit with the word line driver WLD and the inverter INV2 of FIG. 58 fused each other. That is to say, this circuit of the decoder final stage has its modified circuit configuration including the word line driver WLD having an input connected to the drain terminal of the transistor N1 and having an output as a hold data signal SO of that decoder final stage 106, where the word line is taken out from the output of that word line driver WLD.

The operations of this circuit are the same as those of FIG. 58, so description of which is not repeated here.

One of the transistors P5 and N5 may be eliminated.

Thus, in the circuit configuration, the number of inverters can be reduced by one as compared with FIG. 58.

Figure 60:
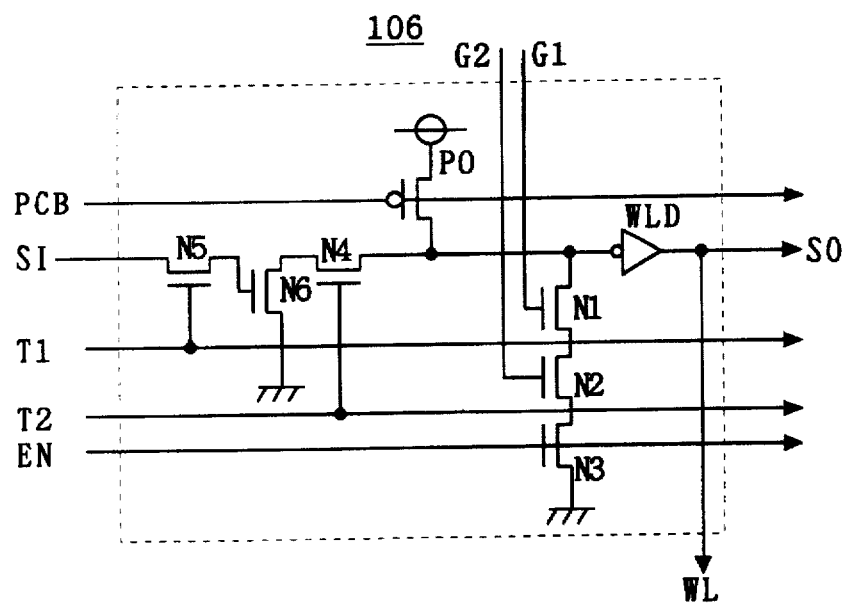
FIG. 60 is a diagram showing an example of the circuit structure of the decoder final stage with a shift function used in the semiconductor storage circuit device according to the twenty-seventh preferred embodiment of the present invention.

(c) FIG. 60 shows a modification of the circuit of FIG. 59, where the transistor P5 in FIG. 59 is removed and an N-type transistor N6 receiving output of the transistor N5 at its gate is used in place of the inverter INV1. The source of the transistor N6 is connected to ground and its drain is connected to one terminal of the transistor N4, respectively.

The circuit operation of FIG. 60 is basically the same as the circuits of FIG. 58 and FIG. 59. However, it is necessary to perform precharge by setting the precharge signal PCB to a Low level in the Step S2 described above.

Using this circuit as the circuit for the final stage 106 in FIG. 57 eliminates the need for interconnection for the signal line for the third clock signal T1B as compared with FIG. 58 and FIG. 59 and eliminates the transistor P5. Particularly, if the inverter INV1 of FIG. 59 has the CMOS structure, P-type transistors of the inverter INV1 can be eliminated.

Figure 61:
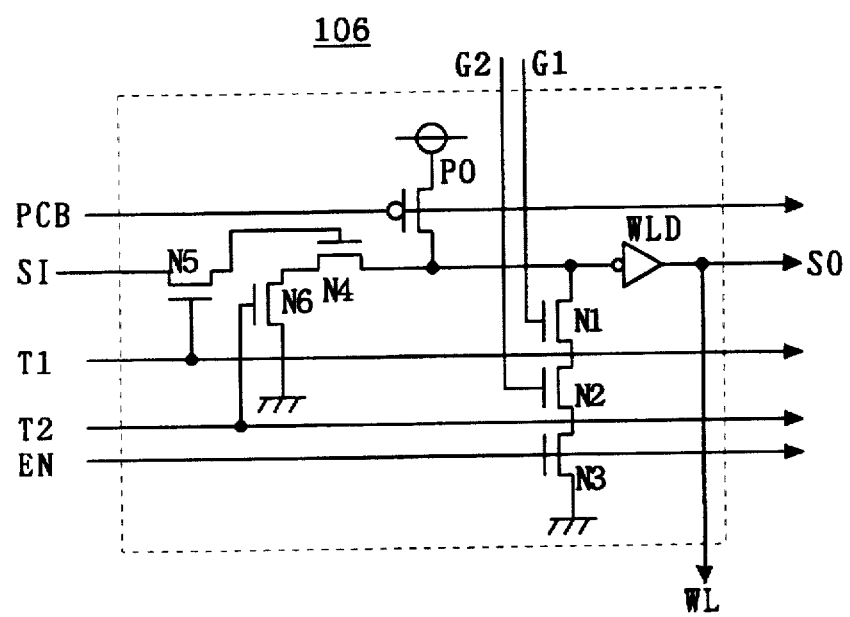
FIG. 61 is a block diagram showing an example of the circuit structure of the decoder final stage with a shift function used in the semiconductor storage circuit device according to the twenty-seventh preferred embodiment of the present invention.

(d) FIG. 61 shows a modification of the circuit of FIG. 60, which exchanges the gate signal of the transistor N6 and the gate signal of the transistor N4. That is to say, the signal line for the second clock signal T2 is connected to the gate of the transistor N6 and the other terminal of the transistor N5 is connected to the gate of the transistor N4.

Operations of this circuit are the same as those of the circuit of FIG. 60, so description of which is not repeated.

Figure 62:
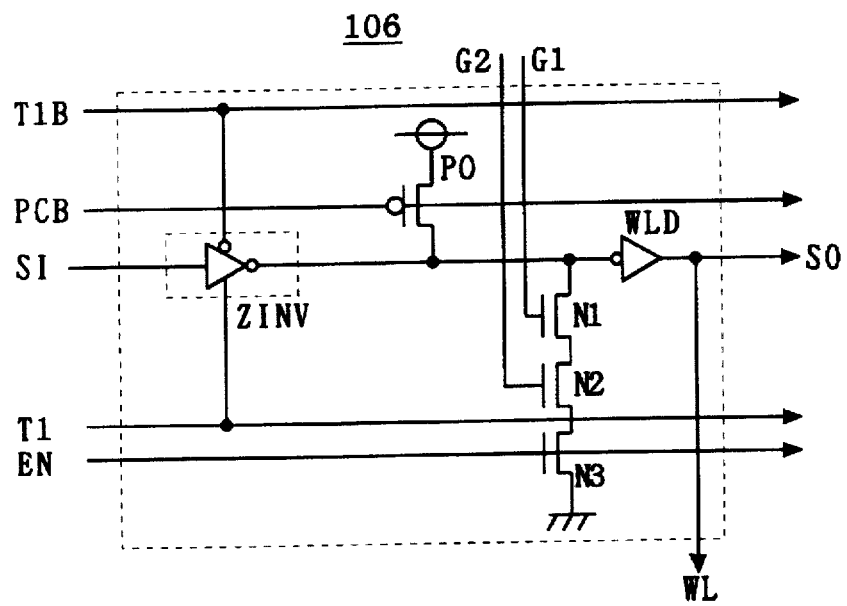
FIG. 62 is a diagram showing an example of the circuit structure of the decoder final stage with a shift function used in the semiconductor storage circuit device according to the twenty-seventh preferred embodiment of the present invention.

(e) FIG. 62 shows a modification of the circuit of FIG. 58, which uses a 3-state output type inverter circuit ZINV instead of the transistors N5, P5, the inverter INV1 and the transistor N4 of FIG. 58. The output data hold signal SO from the decoder final stage on the adjacent preceding stage, having the same circuit (FIG. 62) configuration, is given to this circuit as the inputted data hold signal SI.

The 3-state output type inverter circuit ZINV instantaneously attains an ON state and attains an OFF state before the level of the input data hold signal SI changes.

Operation for accessing each memory cell with the decoder 23B (FIG. 57) will be described on the circuit of FIG. 62.

(D1) With the enable signal EN at a Low level, the first clock signal T1 at a Low level and the third clock signal (referred to as a second clock signal here) T1B at a High level, the precharge signal PCB is set to a Low level to place the transistor P0 in an ON state. Thus the input node of the word line driver WLD is precharged to a High level.

(D2) The precharge signal PCB is set to a High level.

(D3) The enable signal EN is set to a High level. Thus, thereafter, when a signal at a High level is transmitted to the input lines G1 and G2 corresponding to a particular decoder final stage, the input node of the word line driver WLD of that particular decoder final stage is discharged, that word line attaining an active state, and then a particular memory cell is accessed.

Next, concerning the circuit of FIG. 62, the operation will be described in the case of accessing each memory cell with the shift register function.

(S1) With the enable signal EN at a low level and the precharge signal PCB at a High level, the first clock signal T1 is set to a High level and the other clock signal T1B is set to a Low level, so as to put the 3-state output type inverter circuit ZINV in an output state. Thus, the hold data signal SI of the next data final stage on the preceding stage side is captured into the input node of the inverter circuit WLD.

(S2) Before the hold data signal SI changes its level, the first clock signal T1 is set to a Low level and the second clock signal T1B is set to a High level so that the 3-state output type inverter circuit ZINV is brought into a High impedance state. Thus, that decoder final stage 106 can hold the captured hold data signal SI as hold data (SO) of itself. The precharge signal PCB may be set to a Low level to perform precharge.

While the two-phase clocks (T1 and T2) are required in FIG. 58, the circuit configuration of FIG. 62 has the advantage of implementing the shift register operation with one system of clock.

FIG. 63 to FIG. 65 show specific configurations of the 3-state output type inverter circuit ZINV. In the circuit of FIG. 65, one of the transistors PZ and NZ can be eliminated. In the circuit of FIG. 64, connection shown by the broken line in the figure may be made. (Functionally, the same.)

Figure 66:
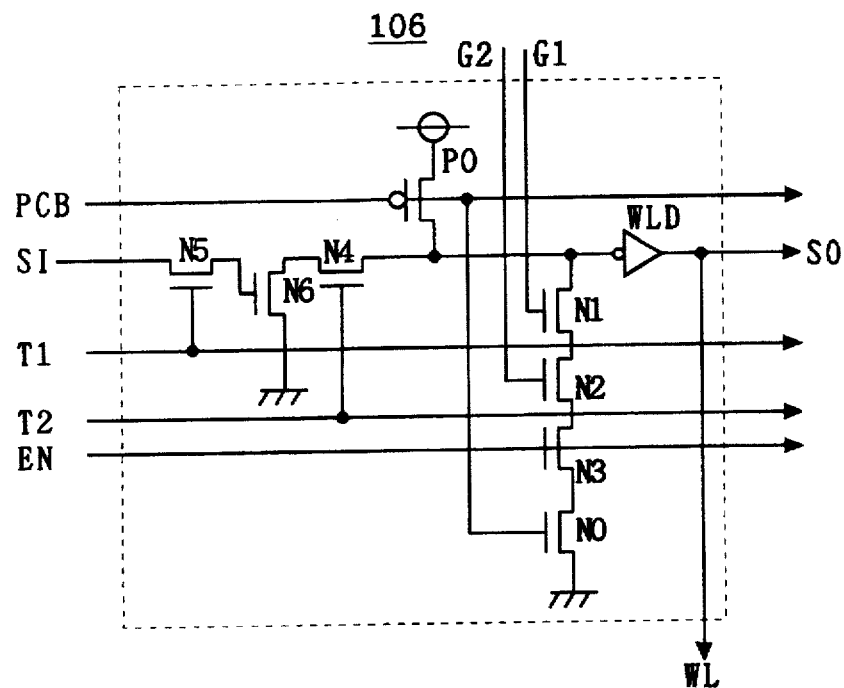
FIG. 66 is a diagram showing an example of the circuit structure of the decoder final stage with a shift function used in the semiconductor storage circuit device according to the twenty-seventh preferred embodiment of the present invention.

(f) The circuit of FIG. 66 is a modification of the circuit of FIG. 60, which is different from the circuit of FIG. 60 in the respect that a transistor N0 receiving as its gate signal the precharge signal PCB is provided between the source of the transistor N3 of FIG. 60 and ground.

While it is necessary in the circuit of FIG. 60 to adjust timing so that a current will not flow in the path formed of the transistors N1, N2 and N3, the path of the transistors N1 to N0 will not form a current path in the circuit of FIG. 66 because the transistor N0 is in an OFF state when the precharge signal PCB is at a High level. This eliminates the need for above-stated timing adjustment for the enable signal EN, producing the effect of making timing design easier.

Figure 67:
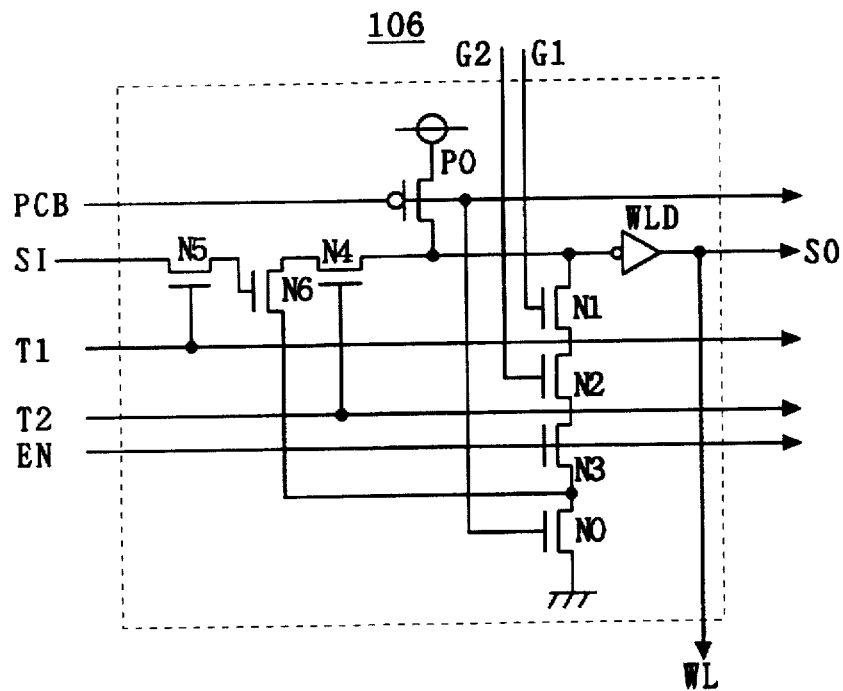
FIG. 67 is a diagram showing an example of the circuit structure of the decoder final stage with a shift function used in the semiconductor storage circuit device according to the twenty-seventh preferred embodiment of the present invention.

(g) The circuit of FIG. 67 is a modification example of the circuit of FIG. 66. The circuit of FIG. 66 has a problem that a current path takes place in the route formed of the transistors P0, N4 and N6 when power-supply is turned on. This circuit is intended to prevent occurrence of through current in such an unstable state as when the power-supply is turned on.

Accordingly, in this circuit, the source of the transistor N6 is not connected to ground but connected to the node between the drain of the transistor N0 and the source of the transistor N3. The transistor N0 thus cuts off the through current path to effectively prevent occurrence of through current.

The gate signals of the transistors N4 and N6 may be exchanged.

Thus, according to the twenty-seventh preferred embodiment, two address orders (for example, the increment order and the zig-zag scan order) can be implemented with such a simple circuit configuration as stated above.

(Twenty-Eighth Preferred Embodiment)

Figure 68:
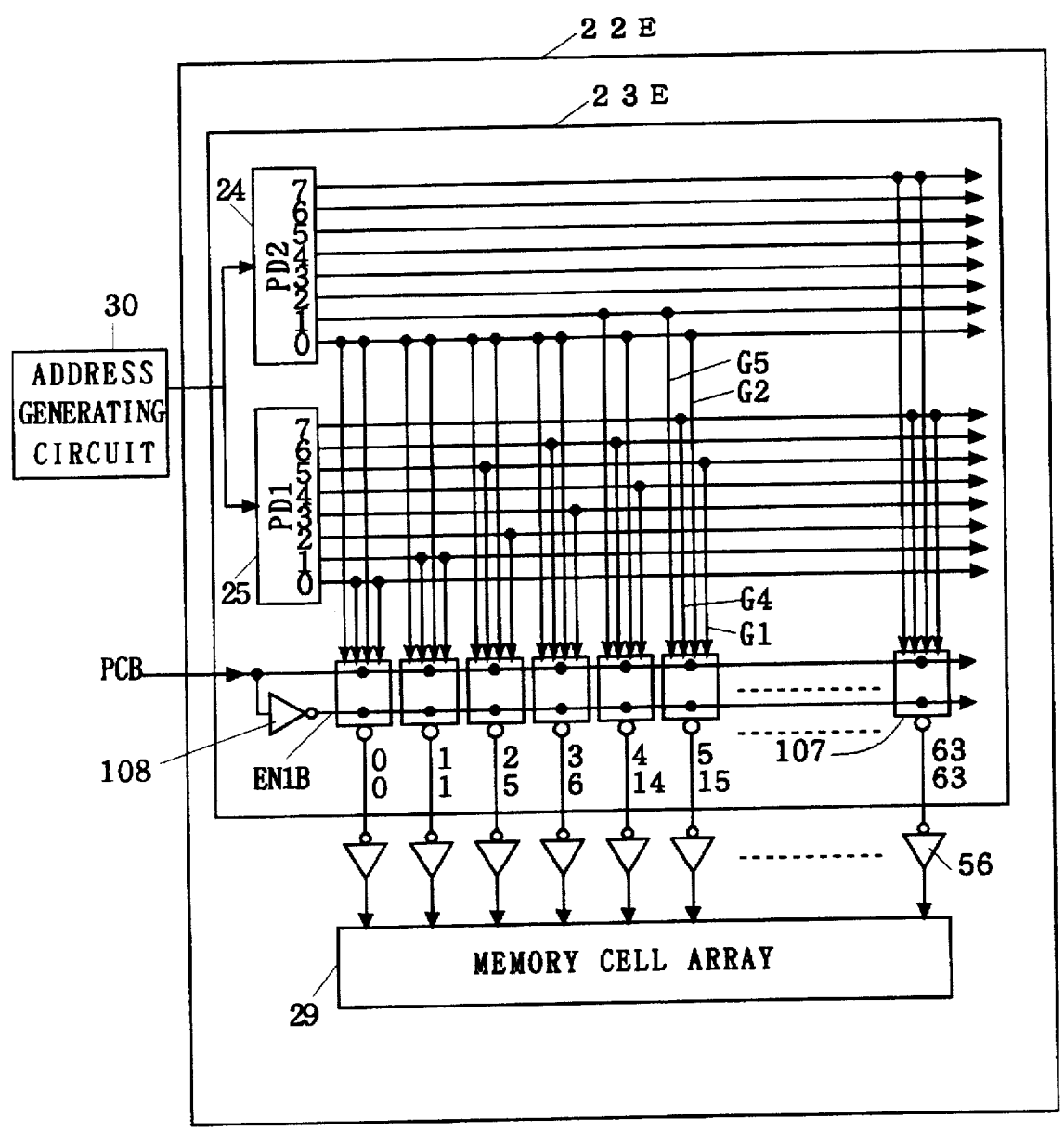
FIG. 68 is a block diagram showing an example of a semiconductor storage circuit device according to a twenty-eighth preferred embodiment of the present invention.

The RAM 22E of FIG. 68 is a specific circuit example which realizes the same function as the function of the first and second decoders, 9, 10 and the selector 11 in FIG. 2 on the basis of the idea of the circuit of FIG. 2. In this respect, the twenty-eighth preferred embodiment is common to the RAM 22A shown in FIG. 26. While each decoder final stage 55 is constituted by the precharge system in the RAM 22A of FIG. 26, the RAM 22E is different in that each decoder final stage 107 is formed by the static system. Therefore, this configuration has the effect of implementing a RAM with the same function as that of FIG. 2 without the necessity for the precharge signal.

For convenience, here is shown an example in which the increment mode is used as the first operation mode and the zig-zag scan is used as the second operation mode, which is about a single-port RAM 22E. Needless to say, the same is possible about a particular first port in a multi-port RAM.

Figure 69:
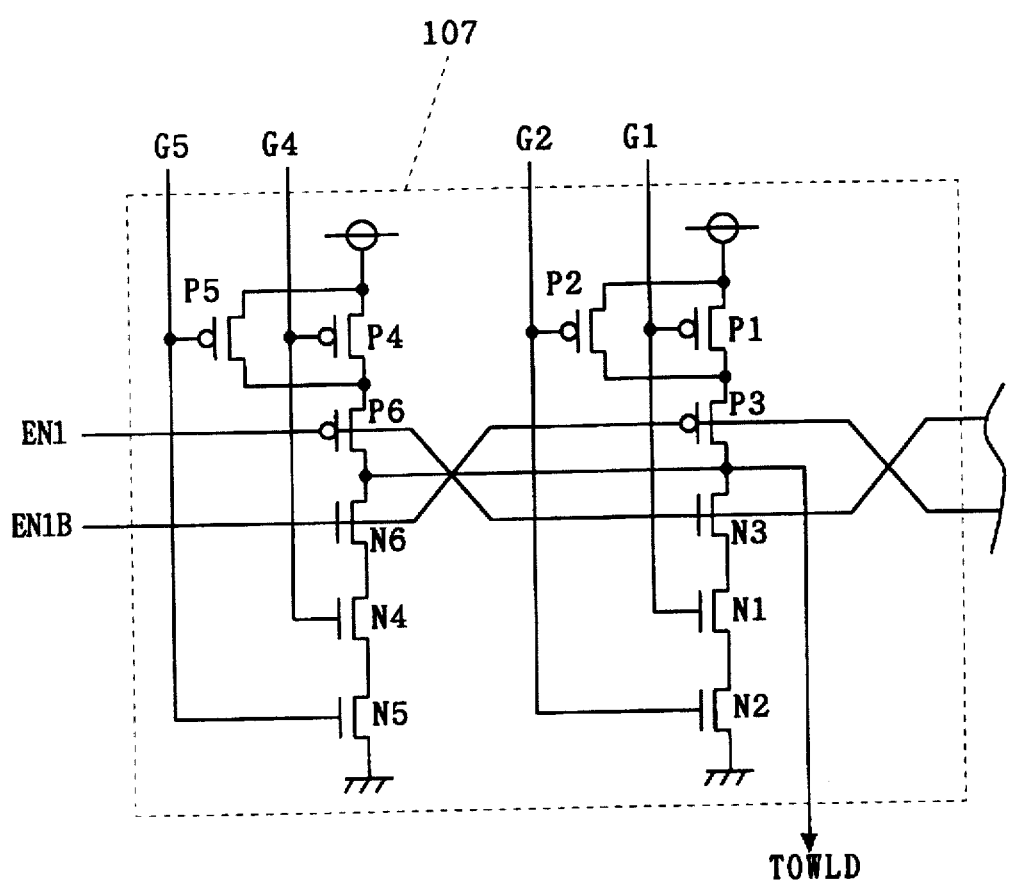
FIG. 69 is a diagram showing an example of the circuit structure of the decoder final stage used in the semiconductor storage circuit device according to the twenty-eighth preferred embodiment of the present invention.

The circuit of FIG. 69 is a specific configuration example of each decoder final stage 107 of FIG. 68.

In this RAM 22E, the function corresponding to the first and second decoders 9 and 10 of FIG. 2 is implemented by the decoder final stages 107 sharing the first and second predecoders 25 and 24.

In each decoder final stage 107, a first NAND circuit (the portion formed of the transistors N1, N2, P1, P2), a second NAND circuit (the portion formed of transistors N4, N5, P4, P5) and a switch circuit (the portion formed of transistors N3, P3, N6, P6), for switching the first and second NAND circuits, are fused at the transistor level. The input signal lines G1 and G2 to the transistors N1 and N2 of the decoder final stage 107 are connected to the corresponding output lines or output terminals of the first and second predecoders 25 and 24 to realize the address order of the first decoder 9 of FIG. 2, and the input signal lines G4 and G5 of the transistors N4 and N5 are connected to the corresponding output lines of the first and second predecoders 25 and 24 to realize the address order of the second decoder 10 of FIG. 2.

The portion including the first NAND circuit and the switch circuit (transistors P3, N3) is referred to as "first NAND circuit portion" and the portion including the second NAND circuit and the switch circuit (transistors P6, N6) is referred to as "second NAND circuit portion".

When the enable signal EN1 is at a High level (first level), the transistors P3 and N3 turn on and the first NAND circuit operates according to the levels on the input lines G1 and G2. On the other hand, when the enable signal EN1 is at a low level (second level), the transistors P6 and N6 turn on and the second NAND circuit functions in accordance with the levels on the input lines G4 and G5. This circuit is the same as the circuit of FIG. 2 in function and operation, so that detailed description thereof is not repeated here.

(Twenty-Ninth Preferred Embodiment)

The twenty-ninth through thirty-third preferred embodiments show technic about pattern placement and layout suitable for configuring the above memory cell array on a CMOS gate array.

Figure 70:
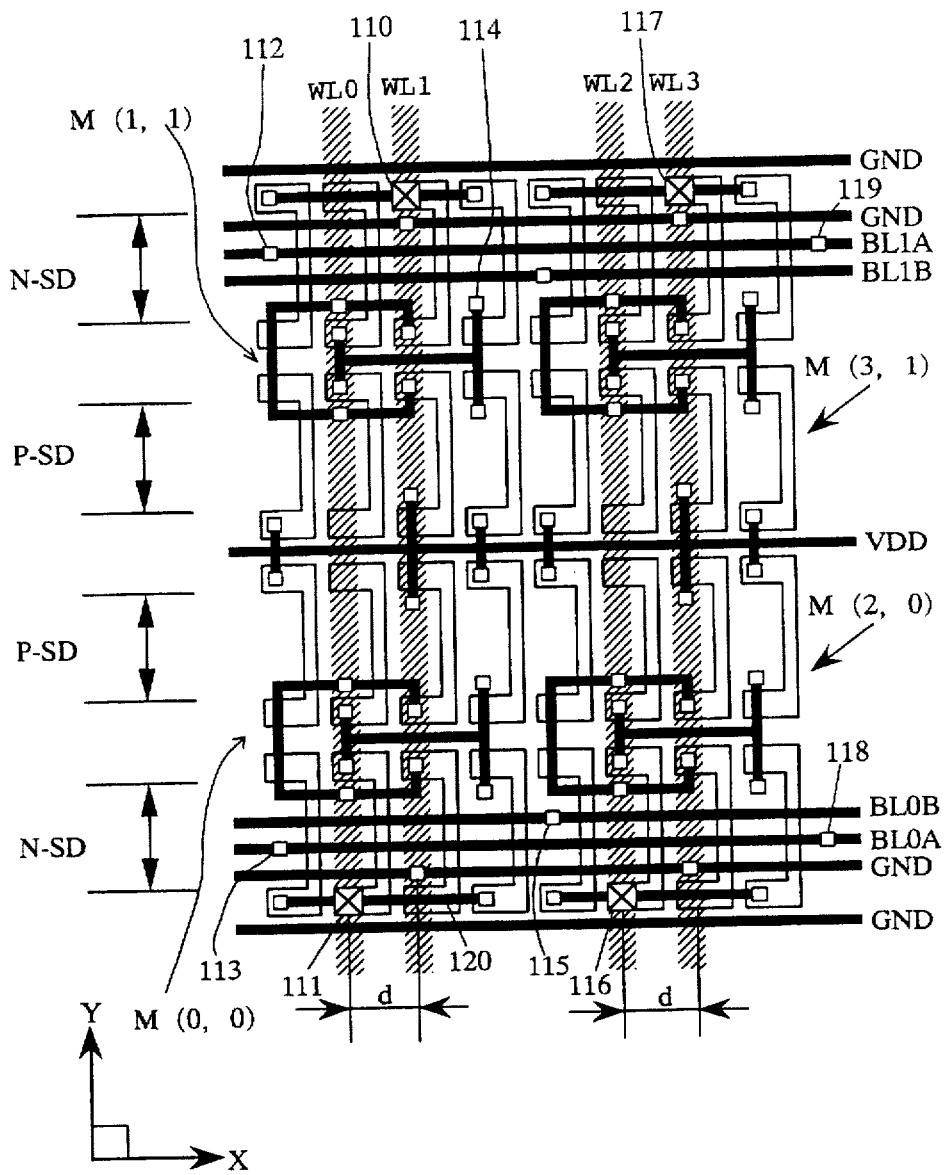
FIG. 70 is a plan view showing layout of a memory cell array in a semiconductor storage circuit device according to a twenty-ninth preferred embodiment of the present invention.
Figure 71:
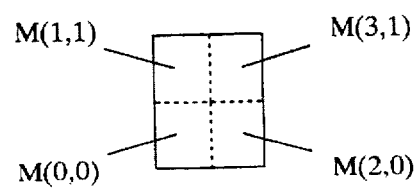
FIG. 71 is a block diagram showing arrangement of the four memory cells in FIG. 70.
Figure 72:
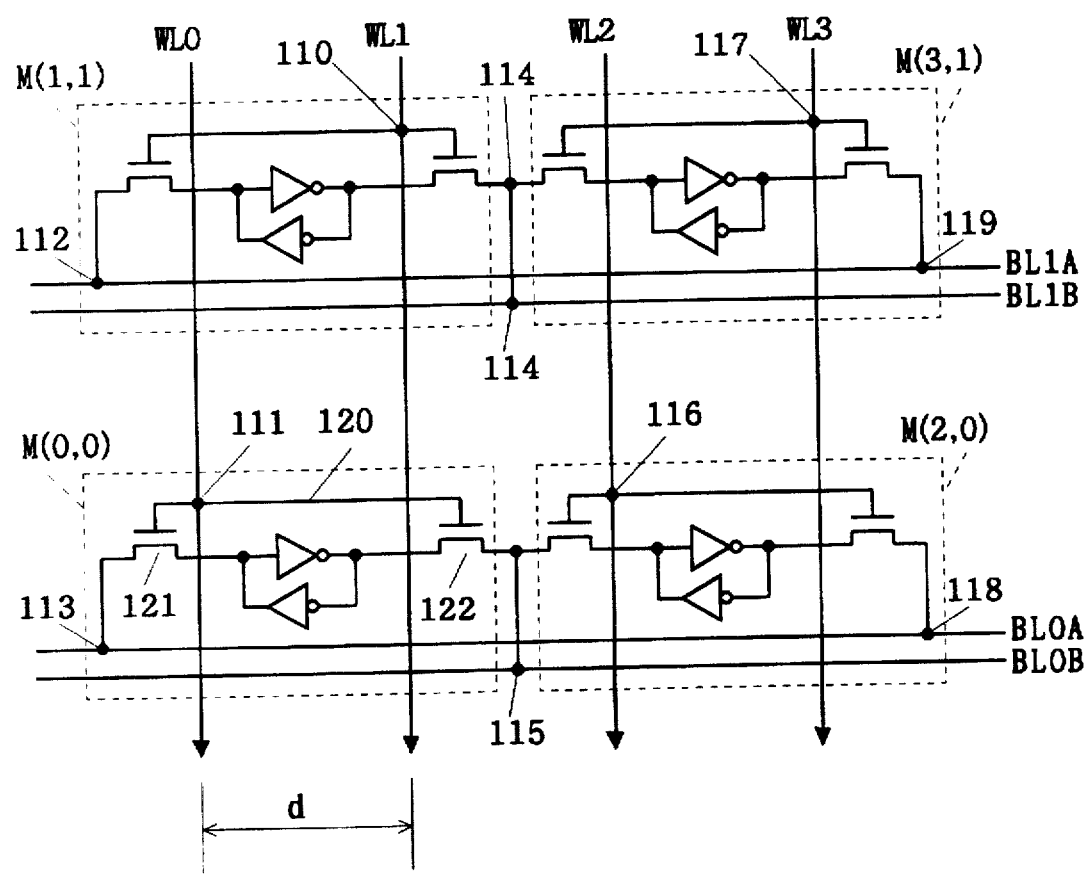
FIG. 72 is an equivalent circuit diagram of the four memory cells in FIG. 70.

FIG. 70 is a plan showing as an example layout of a memory cell array suitable for realizing memory cells each having the circuit configuration of FIG. 42 with a CMOS gate array, which shows MOS gate electrodes (U-shape) and interconnection pattern coupling the MOS electrodes formed in and on a semiconductor substrate. FIG. 71 is a diagram showing in a block diagram arrangement of the four memory cells shown in FIG. 70, and FIG. 72 is a diagram of an equivalent circuit corresponding to FIG. 70 and FIG. 71.

FIG. 70 will be described.

In this figure, the interconnections shown by the black thick lines indicate first layer interconnections, the interconnections shown by hatching indicate second layer interconnections, the portions shown by the small squares indicate contact holes, the portions shown by Xs in squares larger than those for the contact holes indicate through holes for coupling the first and second layer interconnections, and the portions shown by the U-shapes indicate gate electrodes of MOS transistors, respectively. Numbers in the parentheses in FIG. 71 and FIG. 72, as M(0, 0), M(1, 1), M(2, 0), M(3, 1), indicate coordinate values on the XY coordinate axes set on FIG. 70. The X and Y directions correspond to the row direction and the column direction, respectively.

The layout diagram of FIG. 70 is drawn on the basis of the CMOS gate array of the gate isolation system.

The reference character N-SD indicates the range of existence of source/drain of N-channel MOS transistors and the reference character P-SD indicates the range of existence of source/drain of P-channel MOS transistors.

Nodes or connections 110 to 119 in FIG. 72 correspond to portions shown by corresponding characters (through holes, contact holes) in FIG. 70, respectively.

Each contact hole in FIG. 70 has a function of connecting the first layer interconnection and source/drain of the MOS transistors, or connecting the first layer interconnection and gates of the MOS transistors. As described above, each through hole has a function of connecting the second layer interconnection and the first layer interconnection.

In the layout shown in FIG. 70, for each two of transistors (e.g., the transistors 121, 122) connected to bit lines (e.g., bit lines BLOA, BLOB), a through hole (e.g., the through hole 111) for connection with a corresponding word line (e.g., the word line WL0) is provided on the first interconnection (e.g., the interconnection 120 in FIG. 72) giving their gate signals, the through hole being shifted (the mount of shift d) in position so that a through hole for two transistors in another memory cell positioned in the Y direction side seen from those two transistors is not disposed right above that through hole in the Y direction. That is to say, it is characterized in that positions of the through holes are shifted by the shift amount d, which corresponds to one basic cell, in the X direction between the memory cells M (1, 1), and M (0, 0), or between the memory cells M (3, 1) and M (2, 0). In view of the circuit configuration of FIG. 72, nodes on the lines coupling the two gates of transfer gate transistors belonging to respective memory cells adjacent in the column direction and corresponding word lines (e.g., the node 110 and the node 111) are shifted by an integral multiple (one time, here) of the shift amount d in the row direction.

Such word line arrangement (WL0 and WL1, and WL2 and WL3) and through hole positions allows four memory cells in two columns to form a rectangle as a whole, as shown in FIG. 71, which produces the effect of enabling layout without unnecessary spaces.

(Thirtieth Preferred Embodiment)

Figure 73:
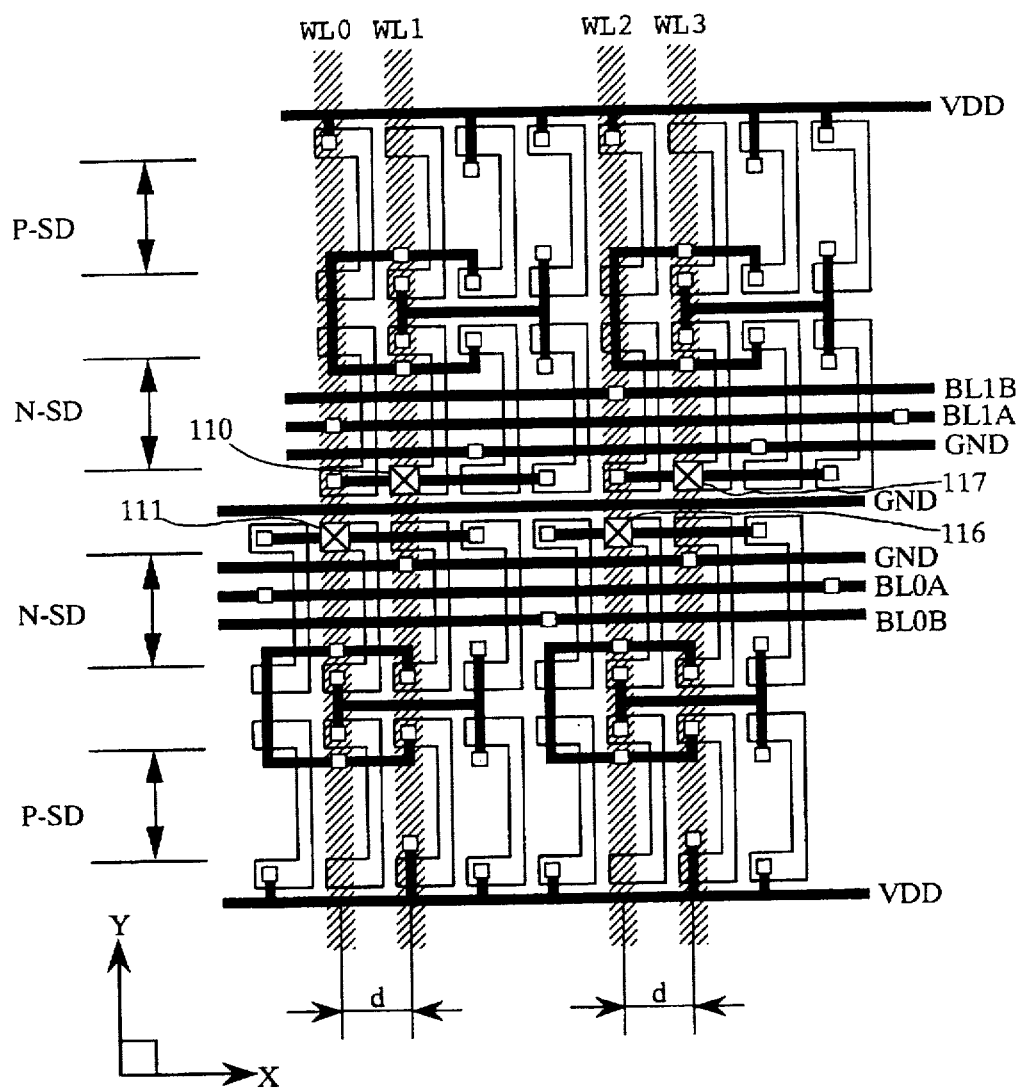
FIG. 73 is a plan view showing layout of a memory cell array in a semiconductor storage circuit device according to a thirtieth preferred embodiment of the present invention.

FIG. 73 is also a layout diagram of a memory cell array suitable for realizing the memory cells of FIG. 41 and FIG. 42 with a CMOS gate array. An equivalent circuit of the memory cell array of FIG. 73 corresponds to FIG. 72. The reference characters and indications for through holes, contact holes and first and second interconnection layers in FIG. 73 are the same as those in FIG. 70.

Figure 74:
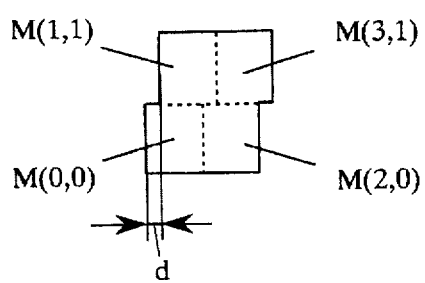
FIG. 74 is a block diagram showing arrangement of the four memory cells in FIG. 73.

FIG. 74 is a block diagram showing arrangement of four memory cells shown in FIG. 73.

Now, layout of FIG. 73 will be described.

It is characterized in that, in memory cells corresponding to the bit line BL0 (BL0A, BL0B) and memory cells corresponding to the bit line BL1 (BL1A, BL1B), respective MOS transistors are shifted in the X direction by one basic cell (the shift amount d in FIG. 74) from each other. Hence, although the overall configuration of the four memory cells is not rectangular like in FIG. 71, it provides the advantage of eliminating the necessity of shifting positions of through holes like in FIG. 70. (In FIG. 70, positions of through holes 110, 117 are shifted by the shift amount d in the X direction from the positions of the through holes 111 and 116, respectively.) It also has the advantage that the power-supply voltage interconnection VDD can be shared by memory cells adjacent in the Y direction.

(Thirty-First Preferred Embodiment)

Figure 75:
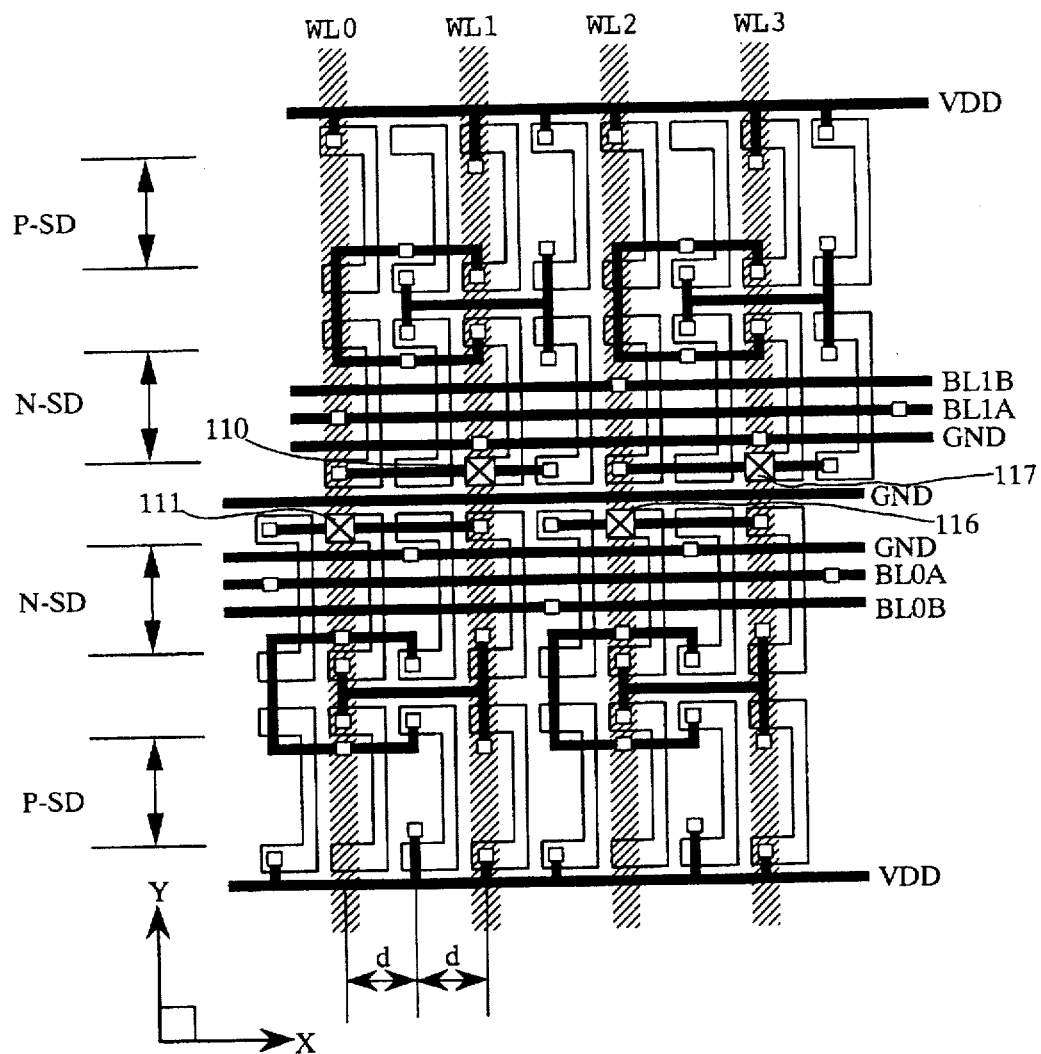
FIG. 75 is a plan view showing layout of a memory cell array in a semiconductor storage circuit device according to a thirty-first preferred embodiment of the present invention.
Figure 76:
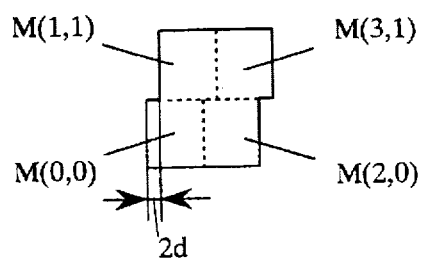
FIG. 76 is a block diagram showing the arrangement of the four memory cells in FIG. 75.

FIG. 75 is also a layout diagram of a memory cell array suitable for implementing the memory cells of FIG. 41 and FIG. 42 with a CMOS gate array. FIG. 76 is a diagram showing in a block diagram the entire configuration of the four memory cells in FIG. 75. An equivalent circuit diagram corresponding to the layout of FIG. 75 is FIG. 72. Here, the reference characters and ways of indicating respective parts are the same as those in FIG. 70. Now, characteristic points of the layout of FIG. 75 will be described.

Here, for memory cells corresponding to the bit line BL0 (BL0A, BL0B) and memory cells corresponding to the bit line BL1 (BL1A, BL1B), positions of the transistors are shifted in the X direction by one basic cell (the shift amount d of FIG. 75), respectively. Furthermore, similarly to FIG. 70, positions of through holes are shifted by the shift amount d. Thus the arrange pitch in the X direction of the word lines corresponds to two basic cells (2d), which enlarges the intervals between adjacent word lines than in FIG. 70 and FIG. 73 so that capacitive coupling of adjacent word lines decreases, providing the advantage of achieving higher speed.

Figure 77:
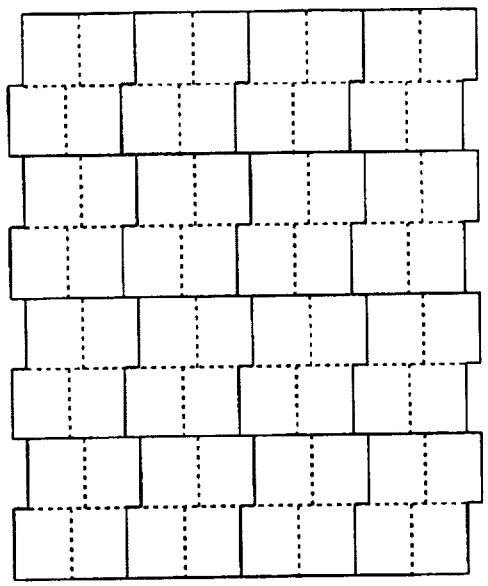
FIG. 77 is a block diagram showing layout of the memory cell array in the semiconductor storage circuit device according to the thirty-first preferred embodiment of the present invention.
Figure 78:
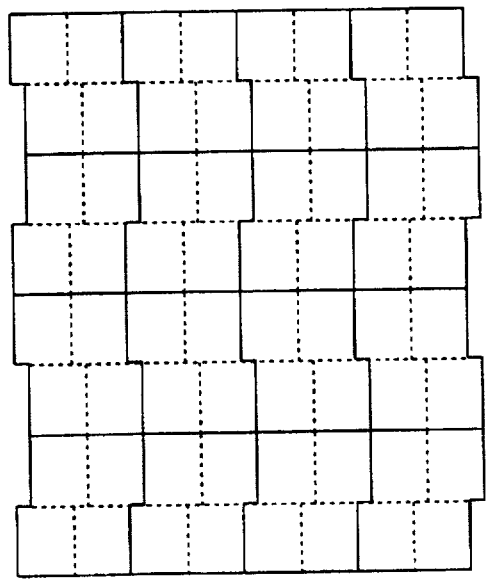
FIG. 78 is a block diagram showing layout of the memory cell array in the semiconductor storage circuit device according to the thirty-first preferred embodiment of the present invention.

A large memory cell array can be achieved by arranging the two layouts in FIG. 73 and FIG. 75 in an array as shown in FIG. 77 or in FIG. 78.

(Thirty-Second Preferred Embodiment)

Figure 79:
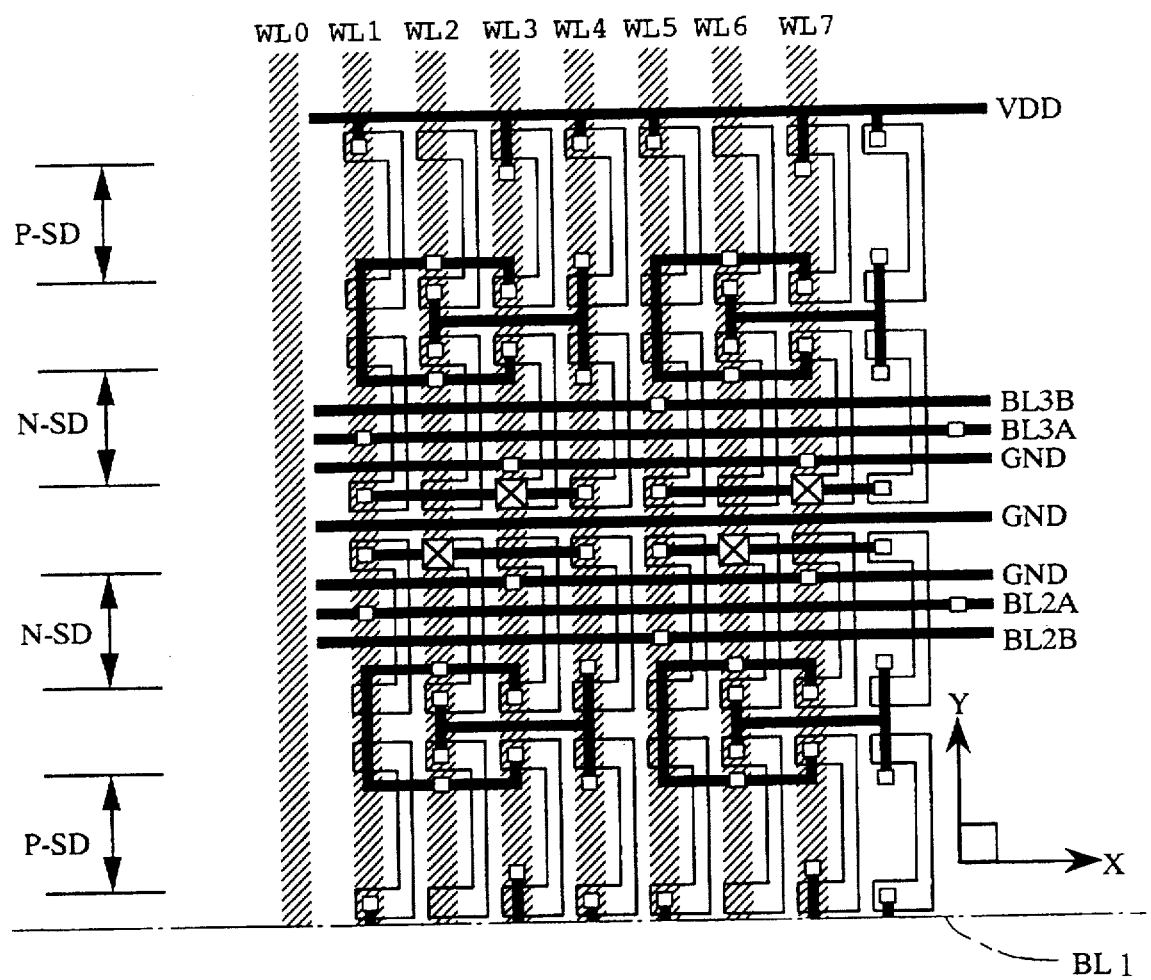
FIG. 79 is a plan view showing layout of a memory cell array in a semiconductor storage circuit device according to a thirty-second preferred embodiment of the present invention.
Figure 80:
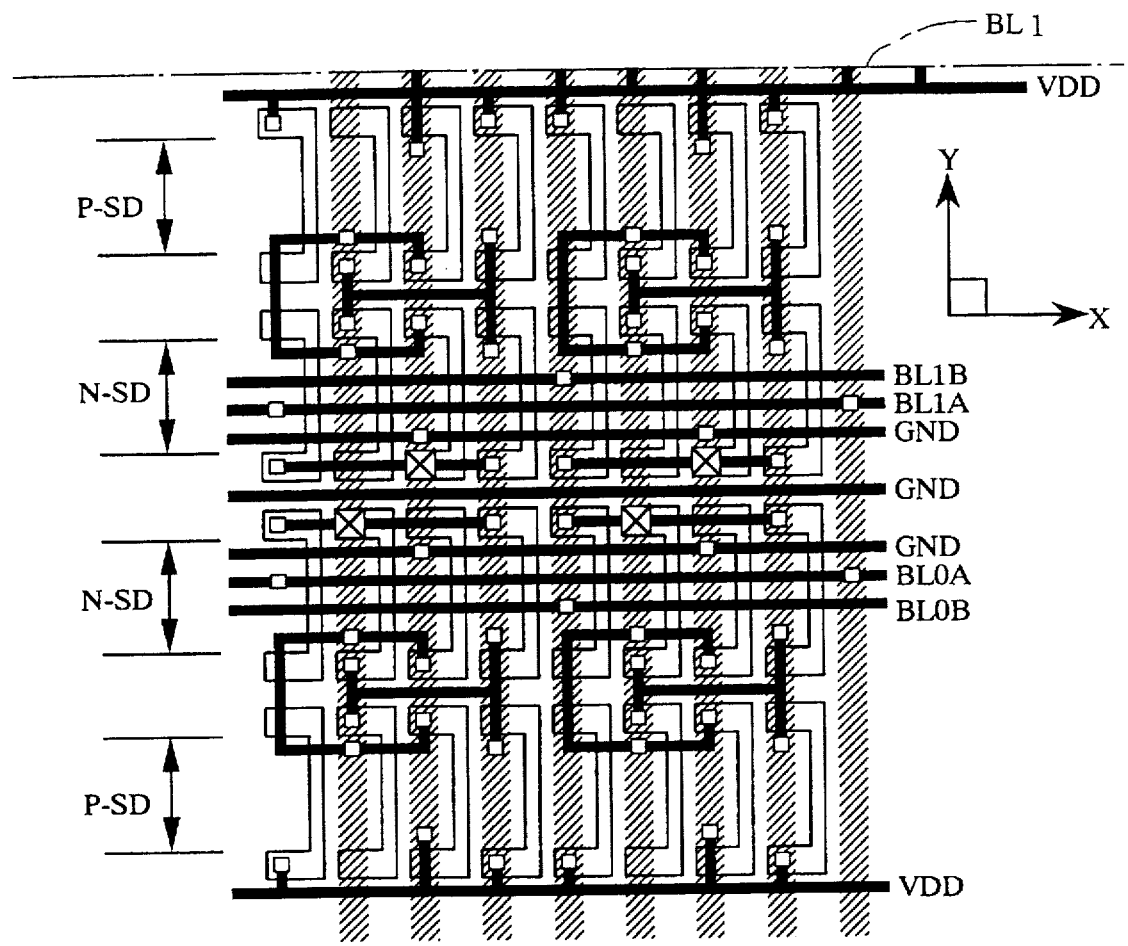
FIG. 80 is a plan view showing layout of the memory cell array in the semiconductor storage circuit device according to the thirty-second preferred embodiment of the present invention.
Figure 81:
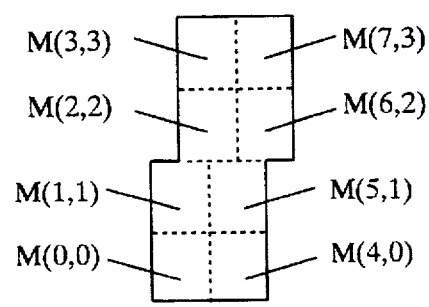
FIG. 81 is a block diagram showing arrangement of the memory cells in FIG. 79 and FIG. 80.
Figure 82:
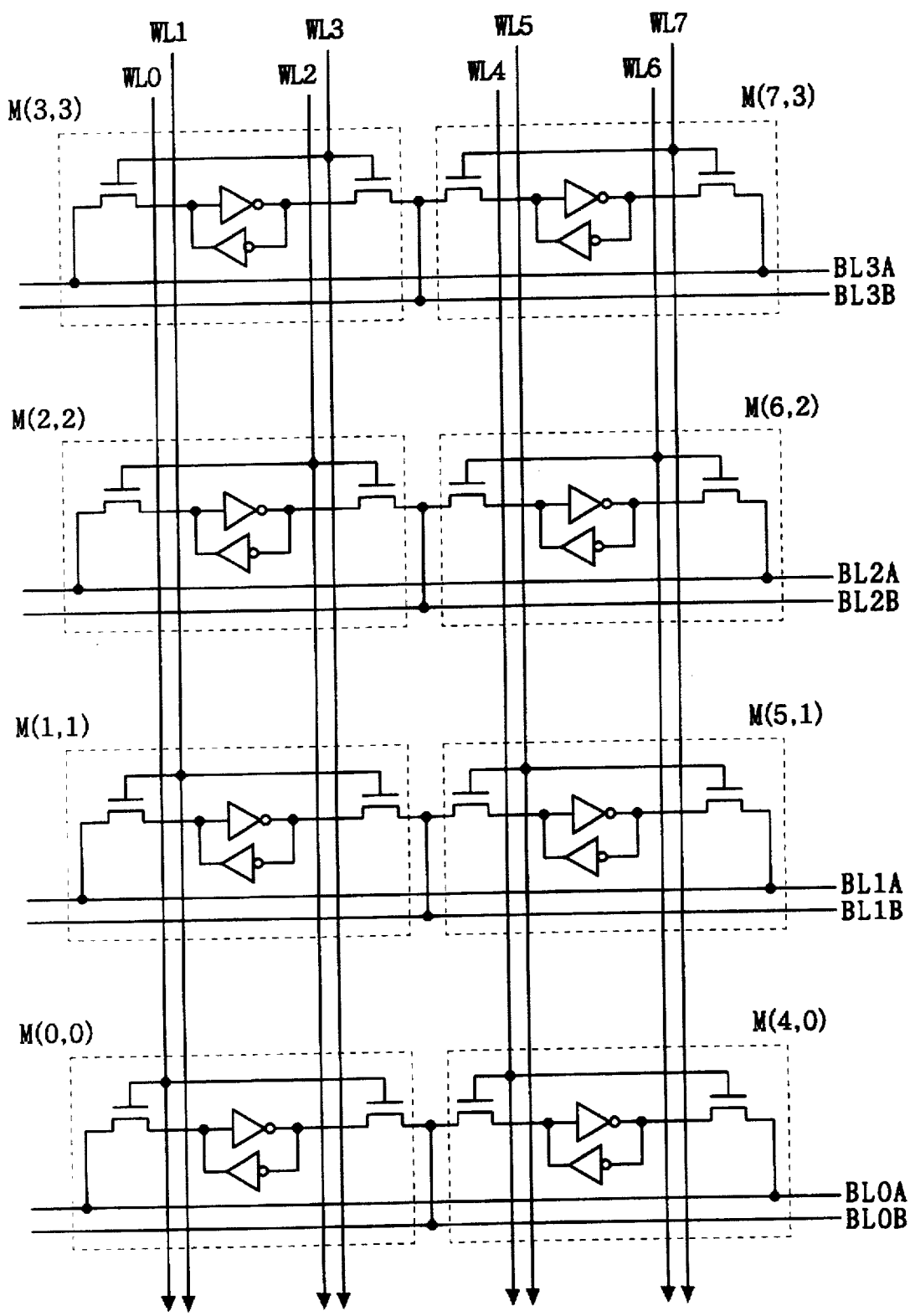
FIG. 82 is an equivalent circuit diagram of the memory cells shown in FIG. 79 and FIG. 80.

FIG. 79 and FIG. 80 are diagrams showing layout of a memory cell array suitable for implementing the 4-input column type memory cell array shown in FIG. 46 with a CMOS gate array. The reference characters and the way of indicting interconnections and holes in this figure are the same as those in FIG. 70. FIG. 81 is a diagram showing in a block diagram the entire arrangement configuration of the eight memory cells shown in FIG. 79 and FIG. 80, and FIG. 82 is an equivalent circuit diagram corresponding to the layout of FIG. 79 and FIG. 80.

FIG. 79 and FIG. 80 will be described below.

The two figures are characterized in that two of layout of FIG. 70 are shifted by two basic cells in the X direction to configure a memory cell array.

Thus, a memory cell array corresponding to FIG. 46 can be implemented in layout with a CMOS gate array.

Figure 83:
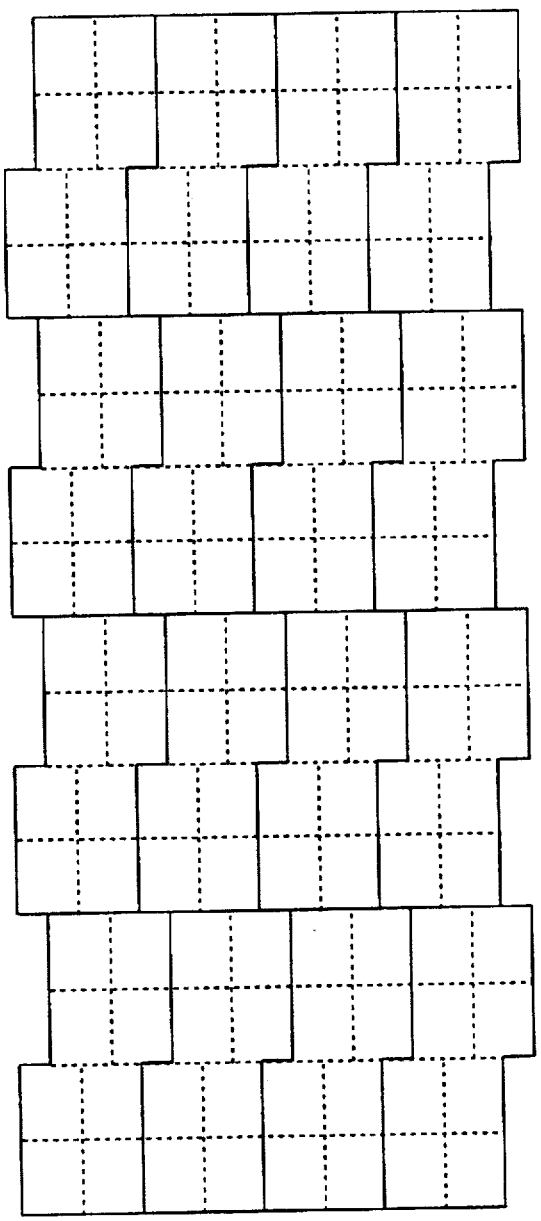
FIG. 83 is a block diagram showing layout of the memory cell array in the semiconductor storage circuit device according to a thirty-second preferred embodiment of the present invention.

A larger memory cell array can be made by arranging the layout shown in FIG. 79 and FIG. 80 in an array as shown in FIG. 83.

FIG. 70, FIG. 73, FIG. 75, FIG. 79 and FIG. 80 and FIG. 84 and FIG. 85 described later are given as layout diagrams when the circuit shown in FIG. 42 is used, but the same layout is possible when the circuit of FIG. 43 is used. In the circuit of FIG. 43, the P-channel transistors forming the inverters in the circuit of FIG. 42 are eliminated.

Furthermore, the same layout is also possible with the circuit of FIG. 49.

(Thirty-Third Preferred Embodiment)

Figure 84:
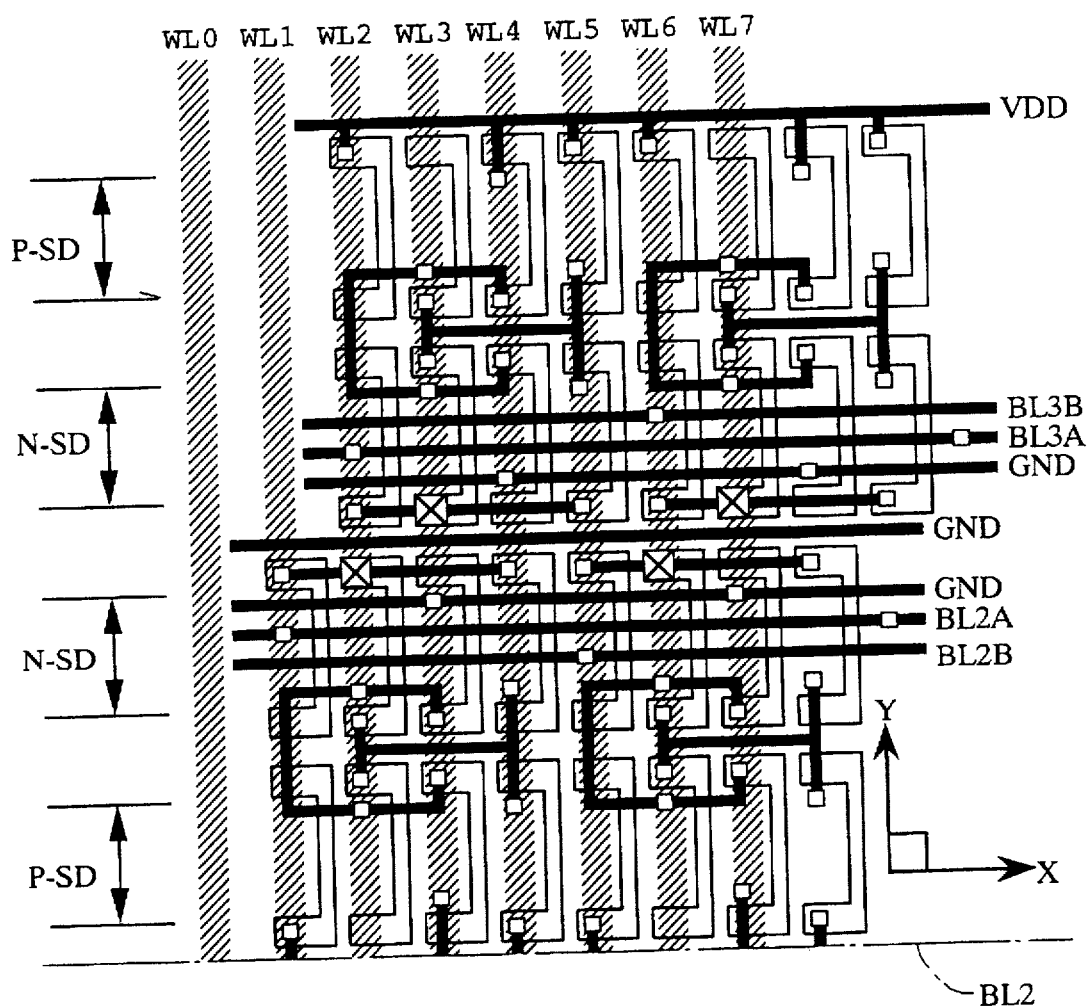
FIG. 84 is a plan view showing layout of a memory cell array in a semiconductor storage circuit device according to a thirty-third preferred embodiment of the present invention.
Figure 85:
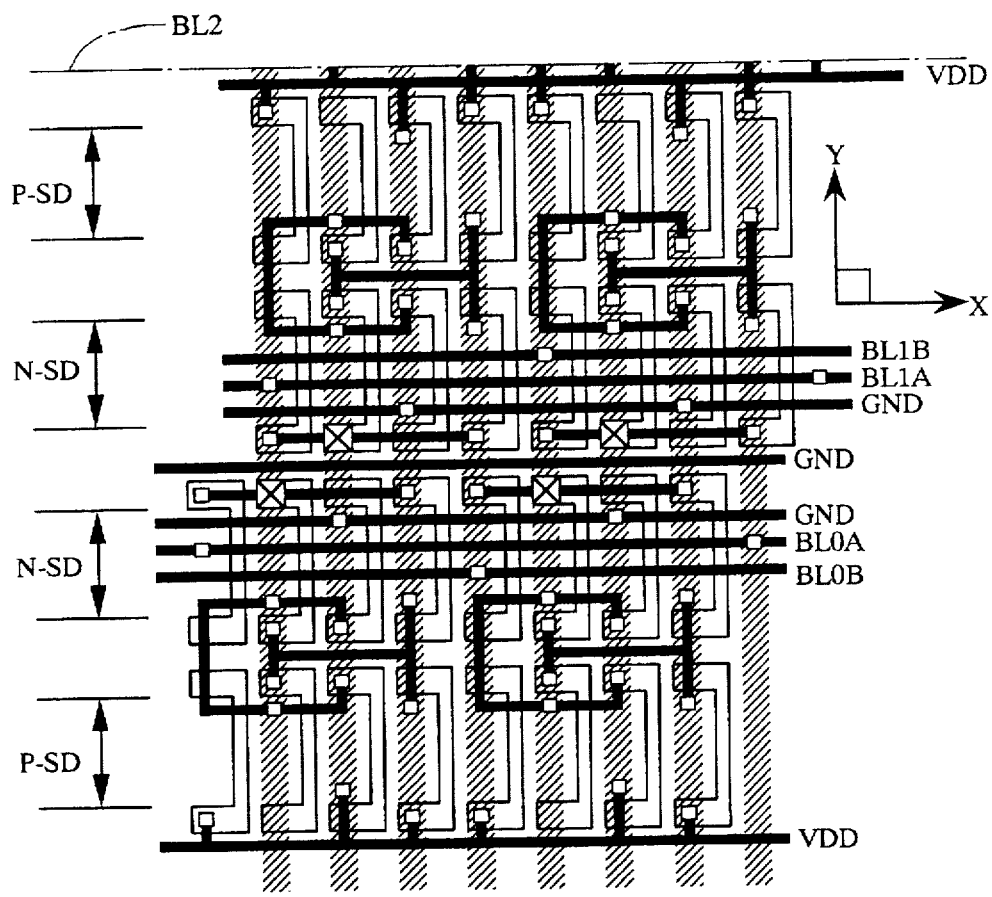
FIG. 85 is a plan view showing layout of the memory cell array in the semiconductor storage circuit device according to the thirty-third preferred embodiment of the present invention.
Figure 86:
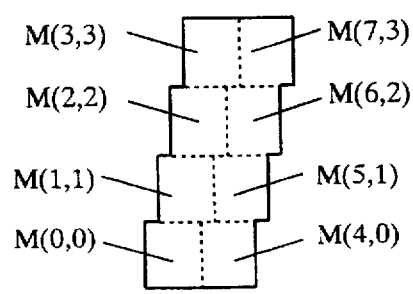
FIG. 86 is a block diagram showing arrangement of the memory cells in FIG. 84 and FIG. 85.

FIG. 84, FIG. 85 are diagrams showing layout of a memory cell array suitable for implementing the 4-input column type memory cell array of FIG. 46 with a CMOS gate array. Here, the characters and the way of indicating the respective parts are the same as those in FIG. 70. FIG. 86 shows the overall arrangement configuration of layout of FIG. 84 and FIG. 85. FIG. 82 is an equivalent circuit diagram corresponding to the layout of FIG. 84 and FIG. 85.

The layout of FIG. 84 and FIG. 85 will now be described below.

It is characterized in that the memory cell array is constituted by using two of layout of FIG. 70, shifted by two basic cells in the X direction.

Thus, a memory cell array corresponding to FIG. 46 can be realized in a CMOS gate array.

Figure 87:
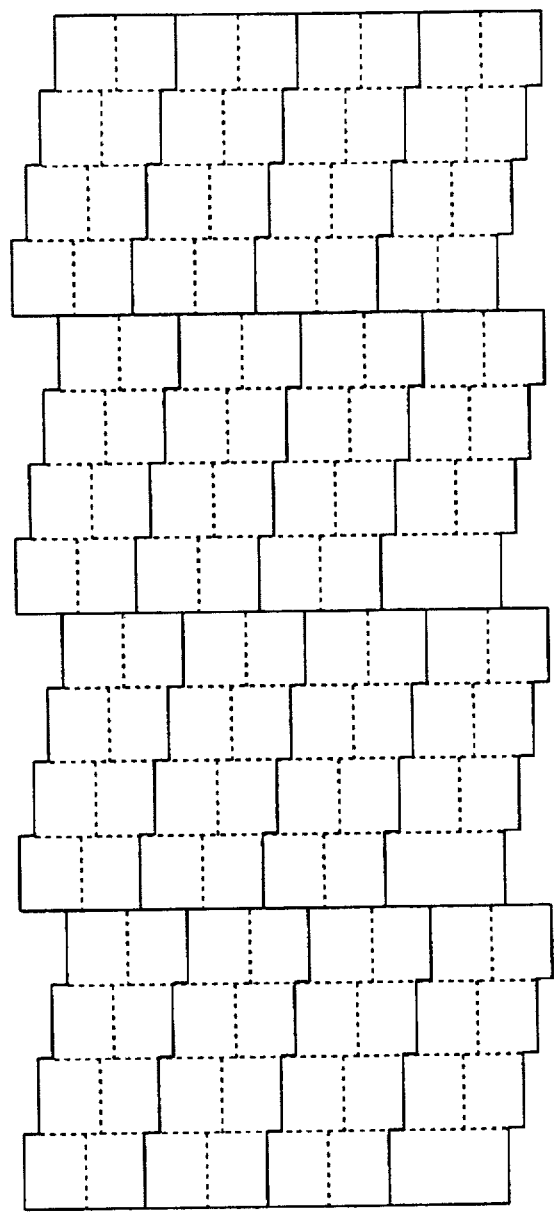
FIG. 87 is a block diagram showing layout of the memory cell array in the semiconductor storage circuit device according to the thirty-third preferred embodiment of the present invention.

A larger memory cell array can be constituted by arranging the layout in FIG. 84 and FIG. 85 in a array as shown in FIG. 87.

(Thirty-Fourth Preferred Embodiment)

Here, configuration and operation of a RAM designing system for CAD-designing the above-described various semiconductor storage circuit devices, i.e., a RAM generator.

Figure 88:
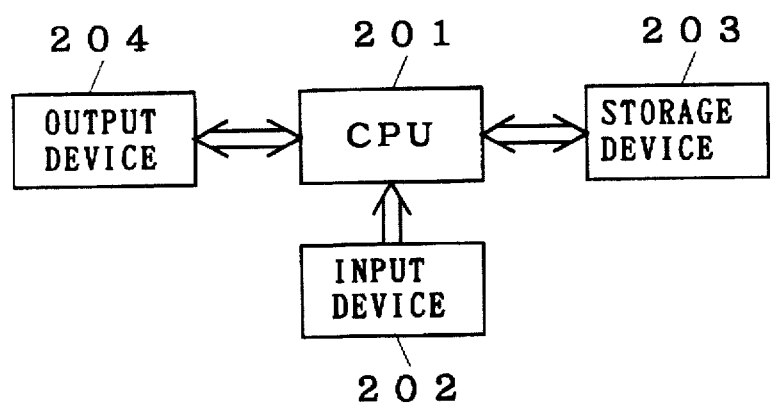
FIG. 88 is a block diagram showing the structure of a designing device for semiconductor storage circuit devices according to a thirty-fourth preferred embodiment of the present invention.

FIG. 88 is a block diagram showing the outline of the structure of a RAM generator 200, which has an input device 202, a storage device 203 and an output device 204 around a CPU 201.

Figure 89:
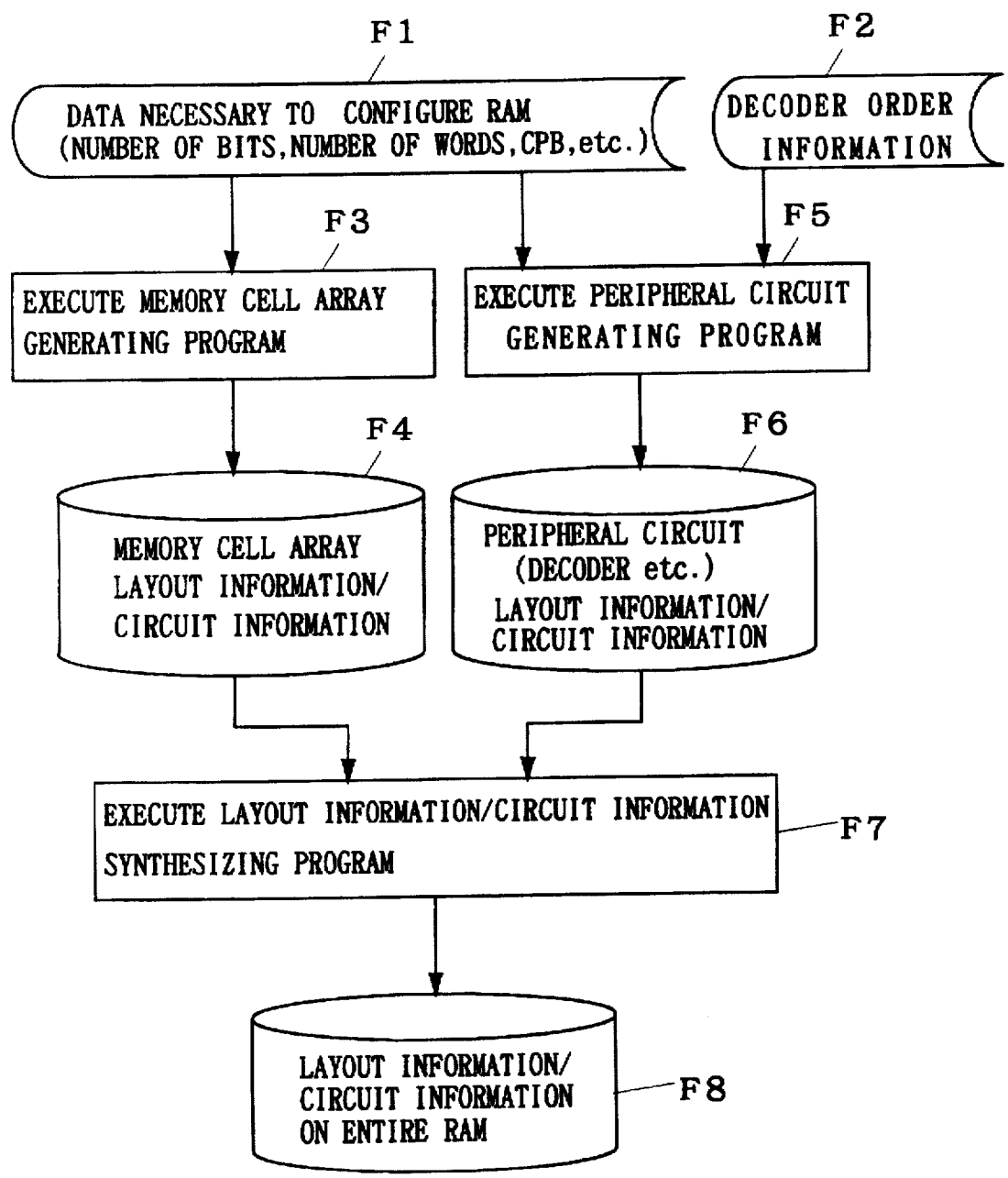
FIG. 89 is a flow-chart showing functions of the designing device for semiconductor storage circuit devices according to the thirty-fourth preferred embodiment of the present invention.

FIG. 89 is a flow chart or function block diagram showing operation of the RAM generator 200.

First, in Step F1, information signals giving data necessary to configure a RAM, e.g., the number of bits, the number of words, the number of columns (CPB) used for 1 bit of data signal (e.g., information for specifying two-input column, or 4-input column) etc. are inputted to the CPU 201 through the input device 202.

In Step F2, decoder order information signals providing information on respective output orders of decoders determined on the basis of the contents of that system are inputted to the CPU 201 through the input device 202. The decoder order information includes information giving an output order of the decoder in the first mode, such as the increment mode or the decrement mode, etc, information giving an output order of the decoder in the second mode, such as the zig-zag scan, the alternate scan, etc. and information for switching levels "0" and "1" of outputs of decoders, for example.

The CPU 201 performs the following operations on the basis of the information signals provided in the two Steps F1 and F2.

In Step F3, the CPU 201 executes the "memory cell array generating program" to determine arrangement of memory cells in a memory cell array on the basis of the information signals provided in Step F1. Then, the CPU 201 stores in the storage device 203 the obtained data about configuration of the memory cell array of the RAM as layout/circuit information signals for the memory cell array (Step F4).

The CPU 201 starts the "peripheral circuit generating program" to design circuit configurations of peripheral circuits other than the memory cell array, such as decoders, column selectors, and layout thereof on the basis of the information signals given in the two steps F1 and F2 (Step F5) and stores the obtained data in the storage device 203 as layout/circuit information signal for peripheral circuits (Step F6).

Then, the CPU 201 executes the "layout/circuit information synthesizing program" to synthesize the information signals obtained in the two Steps F4 and F6 (Step F7) and generates signals providing layout/circuit information for the entire RAM (Step F8).

Figure 90:
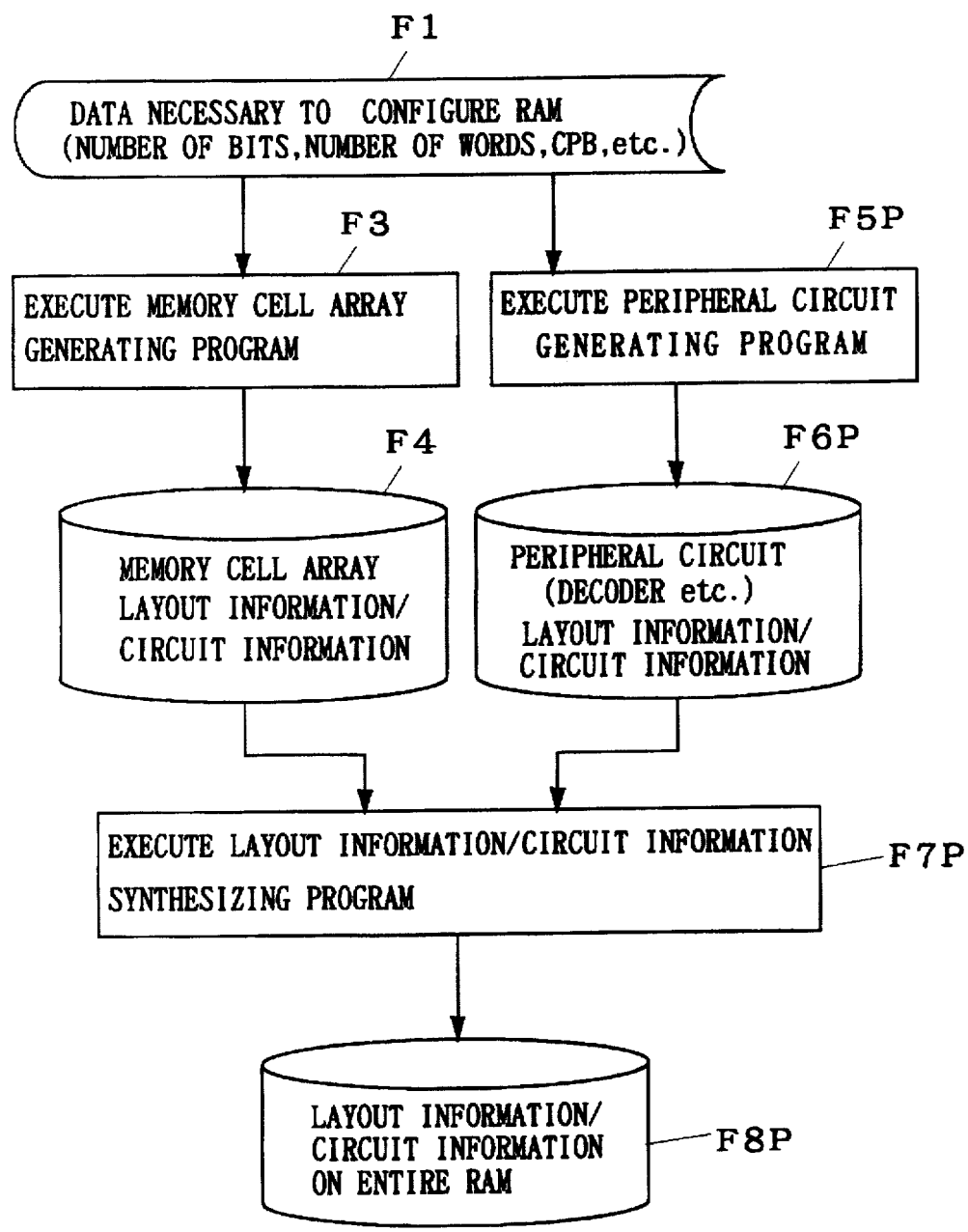
FIG. 90 is a flow chart showing functions of a designing device for semiconductor storage circuit devices as the background art of the thirty-fourth preferred embodiment.

FIG. 90 is a flow chart showing operations of a RAM generator 200P (background art) conventionally used in general. In this case, as compared with the RAM generator 200 of the invention, it has no functions corresponding to Steps F2, F5 and F6. Therefore, although the conventional RAM generator 200P has the function of specifying data necessary for memory cell array configuration, such as the number of bits, the number of words, the number of columns for one bit of data input/output, etc, it does not have the function of specifying output orders of decoders corresponding to respective modes used in the system and designing the circuit configuration of decoders for realizing those decoder orders.

On the other hand, the RAM generator 200 of the invention receives the decoder order information signals as inputs and performs circuit design and layout design for decoders on the basis of the information signals, producing the effect of specifying an arbitrary address order for each decoder according to each operation mode, such as increment, zig-zag scan, alternate scan, etc. in CAD designing the RAM.

While the invention has been described in detail, the foregoing description is in all aspects illustrative and not restrictive. It is understood that numerous other modifications and variations can be devised without departing from the scope of the invention.

I claim:

1. A semiconductor storage circuit device, comprising;

a plurality of decoders receiving externally supplied common addresses, wherein respective outputs of each of said plurality of decoders are arranged to correspond to an access order of one of a plurality of different operation modes, and wherein a single one of said plurality of different operation modes can be selected to attain an active state.

2. The semiconductor storage circuit device according to claim 1, further comprising;

a multi-port memory cell array having at least two access ports which are independently addressable, wherein particular two access ports of each memory cell of said multi-port memory cell array are accessed on the basis of respective corresponding outputs of a selected two decoders of said plurality of decoders.

3. The semiconductor storage circuit device according to claim 1, further comprising;

selector means for selectively outputting the respective outputs only of certain two decoders in said plurality of decoders, and a memory cell array having at least one access port which is independently addressable, wherein particular one access port of each memory cell of said memory cell array is accessed on the basis of a corresponding output of said selector means.

4. The semiconductor storage circuit device according to claim 3, wherein said plurality of decoders comprise;

a first decoder having its outputs arranged on the basis of an access order in a first operation mode which corresponds to one of a selected two operation modes of said plurality of operation modes, and a second decoder having its outputs arranged on the basis of an access order in a second operation mode which corresponds to the other of said selected two operation modes, and said selector means selectively outputs the respective outputs of said first and second decoders to said memory cell array.

5. The semiconductor storage circuit device according to claim 3, wherein said plurality of decoders comprise;

a first decoder having its outputs arranged on the basis of an access order in a first operation mode which corresponds to one of a selected three operation modes of said plurality of operation modes, a second decoder having its outputs arranged on the basis of an access order in a second operation mode which corresponds to another one of said selected three operation modes, and a third decoder having its outputs arranged on the basis of an access order in another second operation mode which corresponds to still another one of said selected three operation modes, and said selector means further comprises;

first selector means for selectively outputting the respective outputs of both of said first and second decoders, and second selector means for selectively outputting the respective outputs of both of said first selector means and said third decoder to said memory cell array, wherein said first and second selector means both select the outputs of said first decoder when access is made in said first operation mode, said first and second selector means both select the outputs of said second decoder when access is made in said second operation mode, and said second selector means selects the outputs of said third decoder when access is made in said another second operation mode.

6. The semiconductor storage circuit device according to claim 1, further comprising;

selector means, and a memory cell array having at least one access port which is independently addressable, wherein said plurality of decoders comprise;

a first decoder having its outputs arranged on the basis of an access order in a first operation mode which corresponds to one of a selected two operation modes of said plurality of operation modes, and a second decoder having its outputs arranged on the basis of an access order in a second operation mode which corresponds to the other of said selected two operation modes, wherein at least one of the outputs of said first decoder which provides the same address as a corresponding output of said second decoder is connected directly to particular one access port of a corresponding memory cell in said memory cell array, other outputs of said first decoder are connected to corresponding inputs of said selector means together with corresponding outputs of said second decoder, and said selector means selects the inputted respective outputs of said first and second decoders and outputs the outputs to corresponding memory cells other than said memory cell directly connected to said first decoder.

7. A semiconductor storage circuit device, comprising;

a decoder having its outputs which sequentially attain an active state in a plurality of respective access orders for a plurality of operation modes to be realized, on the basis of externally supplied addresses for a single operation mode, and a memory cell array in which a particular port of the each corresponding memory cell is accessed by each of said outputs of said decoder.

8. The semiconductor storage circuit device according to claim 7, wherein said decoder comprises;

a plurality of predecoders each receiving said addresses for supplying addresses of certain bits which represent part of said addresses, and a plurality of final stages functioning as AND circuits, each of said plurality of final stages having its plurality of inputs connected to respective outputs of said plurality of predecoders and its output connected to a particular port of said memory cell array, wherein, for each of said plurality of final stages, the connection between said plurality of inputs and the respective outputs of said plurality of predecoders is changed in accordance with respective access orders in said plurality of operation modes to be realized.

9. The semiconductor storage circuit device according to claim 8, wherein said decoder further comprises;

selector means provided between each of said plurality of inputs of each of said plurality of final stages and corresponding outputs of each of said plurality of predecoders, said selector means selecting and outputting outputs of corresponding one of said plurality of predecoders according to each access order of said plurality of operation modes to be realized.

10. A semiconductor storage circuit device, comprising;

first operation mode access means having outputs sequentially attaining an active state with a shift operation function, and a decoder receiving externally supplied addresses such that a single operation mode places outputs of said decoder in an active state, wherein said outputs of said decoder are arranged to correspond to an access order of a first operation mode realized by said first operation mode access means, such that an access order of a second operation mode is different from said access order of said first operation mode.

11. The semiconductor storage circuit device according to claim 10, further comprising;

a memory cell array having its memory cells each having at least two particular access ports independently addressable, wherein said particular two access ports in each said memory cell are respectively accessed by corresponding ones of said respective outputs of said first operation mode access means and said decoder.

12. The semiconductor storage circuit device according to claim 10, further comprising;

selector means for selectively outputting said respective outputs of said first operation mode access means and said decoder, and a memory cell array having its memory cells each having at least one access port which is independently addressable, wherein said one access port of each said memory cell is accessed by a corresponding output of said selector means.

13. The semiconductor storage circuit device according to claim 2, wherein one and the other of said particular two access ports of said each memory cell are directly accessed by said corresponding outputs of one and the other of said selected two decoders, respectively.

14. The semiconductor storage circuit device according to claim 2, further comprising;

selector means for selectively outputting corresponding ones of said respective outputs of one and the other of said selected two decoders, wherein one of said particular two access ports of said each memory cell is accessed on the basis of said corresponding output of said one of said selected two decoders, and the other of said particular two access ports of said each memory cell is accessed on the basis of a corresponding output of said selector means.

15. The semiconductor storage circuit device according to claim 2, further comprising;

first and second selector means both for selectively outputting corresponding ones of said respective outputs of one and the other of said selected two decoders, wherein one of said particular two access ports of said each memory cell is accessed on the basis of a corresponding output of said first selector means, and the other of said particular two access ports of said each memory cell is accessed on the basis of a corresponding output of said second selector means.

16. The semiconductor storage circuit device according to claim 7, wherein said decoder comprises;

a plurality of predecoders receiving said addresses for supplying addresses of certain bits representing part of said addresses, respectively, and a plurality of final stages having a plurality of input signal lines connected to corresponding ones of a plurality of outputs of each of said plurality of predecoders, and functioning as a NAND circuit for said plurality of input signal lines to transmit its NAND output to corresponding said particular port of said memory cell array, wherein for each of said plurality of final stages, connection between said plurality of input signal lines and said plurality of outputs of each of said plurality of predecoders is set according to a selected one of said plurality of respective access orders for said plurality of operation modes to be realized.

17. A semiconductor storage circuit device, comprising;

word line selecting means having its outputs sequentially attaining an active state in a plurality of respective access orders for a plurality of operation modes to be realized on the basis of externally supplied addresses for a single operation mode, a column select signal generating circuit generating a column select signal for selecting a particular column on the basis of said outputs of said word line selecting means, a memory cell array in which, by each said output of said word line selecting means, a particular port of each memory cell belonging to a row corresponding to that output is accessed, and a column selector provided for a plurality of continuous columns in said memory cell array and responsive to said column select signal inputted from said column select signal generating circuit for selecting corresponding one of said plurality of columns.

18. A semiconductor storage circuit device, comprising;

a decoder which places its outputs in a first active state in an access order of a first operation mode with a shift operation, and when making access in a second operation mode different from said first operation mode, sequentially places said outputs into an active state in a second access order of said second operation mode on the basis of externally supplied addresses for a single operation mode, and a memory cell array in which a particular port of the each corresponding memory cell is accessed by each said output of said decoder.

19. The semiconductor storage circuit device according to claim 18, wherein said decoder comprises;

a plurality of predecoders receiving said addresses for supplying addresses of certain bits representing part of said addresses, respectively, and a plurality of final stages having a plurality of input signal lines connected to corresponding ones of a plurality of outputs of each of said plurality of predecoders and a signal line receiving a serial data on a next preceding stage side as input, for capturing said serial data from said preceding stage side in said first operation mode and then outputting that captured serial data to a next following stage side and to corresponding said particular port of said memory cell array, and in said second operation mode, for functioning as an AND circuit to said plurality of input signal lines to output its AND output to corresponding said particular port of said memory cell array, wherein for each of said plurality of final stages, the relation in connection between said plurality of input signal lines and said plurality of respective outputs of each of said plurality of predecoders is set in accordance with said access order of said second operation mode.

20. The semiconductor storage circuit device according to claim 16, wherein said plurality of operation modes to be realized include first and second operation modes, each of said plurality of final stages comprises;

a first NAND circuit portion receiving first selected ones of said plurality of input signal lines as its input signal lines; which are connected to corresponding ones of said outputs of each of said plurality of predecoders to provide a first address order of said first operation mode, and performing NAND processing to said first selected ones, and a second NAND circuit portion receiving second selected ones of said plurality of input signals lines as its input signal lines, which are connected to corresponding ones of said outputs of each of said plurality of predecoders to provide a second address order of said second operation mode, and performing NAND processing to said second selected ones, wherein outputs of said first and second NAND circuit portions are switched according to levels of an externally supplied enable signal and its inversion signal and provided to a corresponding one of said memory cells as said NAND output.

21. A semiconductor storage circuit device, comprising:

a multi-port RAM having two or more access ports, each of which is independently addressable by a selected one of a plurality of word line selecting means, said plurality of word line selecting means receiving an externally supplied common address, wherein at least one memory cell in said multi-port RAM has different addresses with respect to two of said access ports.

22. A semiconductor storage circuit designing device for performing circuit design for a semiconductor storage circuit device, said semiconductor storage circuit device comprising at least one decoder and a memory cell array accessed by said decoder, said semiconductor storage circuit designing device comprising;

means for inputting an information signal relating to an order in which outputs of said decoder access addresses of said memory cell array such that said means for inputting provides a different address order for each of a plurality of operation modes to be realized, and means for generating, on the basis of said information signal, an information data signal relating to circuit configuration of said decoder for making access in said different address order for each of said plurality of operation modes with externally supplied addresses for a single operation mode.

* * * * *

UNITED STATES PATENT AND TRADEMARK OFFICE
CERTIFICATE OF CORRECTION

PATENT NO. : 5,719,819
DATED : February 17, 1998
INVENTOR(S) : Hideshi MAENO

It is certified that error appears in the above-indentified patent and that said Letters Patent is hereby corrected as shown below:

On the title page, Item[73] should read:

--[73] Assignee: Mitsubishi Denki Kabushiki Kaisha, Tokyo, Japan--

Signed and Sealed this

Fourteenth Day of April, 1998

Attest:

BRUCE LEHMAN

Attesting Officer

Commissioner of Patents and Trademarks